US012563989B2

(12) United States Patent
Vellianitis et al.

(10) Patent No.: US 12,563,989 B2
(45) Date of Patent: Feb. 24, 2026

(54) SEMICONDUCTOR DEVICE AND METHOD FOR FORMING THE SAME

(71) Applicant: TAIWAN SEMICONDUCTOR MANUFACTURING COMPANY, LTD., Hsinchu (TW)

(72) Inventors: Georgios Vellianitis, Heverlee (BE); Oreste Madia, Brussels (BE); Gerben Doornbos, Kessel-Lo (BE); Marcus Johannes Henricus Van Dal, Linden (BE)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 593 days.

(21) Appl. No.: 17/842,627

(22) Filed: Jun. 16, 2022

(65) Prior Publication Data

US 2023/0411163 A1 Dec. 21, 2023

(51) Int. Cl.
| | |
|---|---|
| *H01L 21/308* | (2006.01) |
| *H01L 21/02* | (2006.01) |
| *H01L 21/306* | (2006.01) |
| *H01L 21/768* | (2006.01) |
| *H10D 30/62* | (2025.01) |

(Continued)

(52) U.S. Cl.
CPC .... *H01L 21/3086* (2013.01); *H01L 21/02112* (2013.01); *H01L 21/30604* (2013.01); *H10D 30/6735* (2025.01); *H10D 64/252* (2025.01); *H01L 21/76897* (2013.01); *H10D 30/62* (2025.01); *H10D 64/017* (2025.01); *H10D 64/2523* (2025.01)

(58) Field of Classification Search
CPC ............ H01L 29/785; H01L 29/42392; H01L 2924/13086; H01L 21/02123; H01L 21/0217; H01L 21/30604; H01L 21/76897; H10B 63/34; H10D 62/021; H10D 62/149–161; H10D 64/251–259; H10D 64/252–2527; H10D 30/485; H10D 30/0291; H10D 30/66–669; H10D 30/0515; H10D 30/831; H10D 30/871; H10D 64/258
See application file for complete search history.

(56) References Cited

U.S. PATENT DOCUMENTS

| | | |
|---|---|---|
| 9,209,247 B2 | 12/2015 | Colinge et al. |
| 9,236,267 B2 | 1/2016 | De et al. |

(Continued)

*Primary Examiner* — Dale E Page
*Assistant Examiner* — Douglas Yap
(74) *Attorney, Agent, or Firm* — Maschoff Brennan

(57) ABSTRACT

A method includes forming first sacrificial layers and first channel layers alternately stacked over a substrate; forming second channel layers and second sacrificial layers alternately stacked over the first sacrificial layers and the first channel layers, in which the second channel layers are made of a first semiconductive oxide; performing an etching process to remove portions of the first sacrificial layers and the second sacrificial layers; forming a gate structure in contact with the first channel layers and the second channel layers; forming first source/drain contacts on opposite sides of the gate structure and electrically connected to the first channel layers; and forming second source/drain contacts on the opposite sides of the gate structure and electrically connected to the second channel layers.

20 Claims, 72 Drawing Sheets

(51) Int. Cl.
    *H10D 30/67*       (2025.01)
    *H10D 64/23*       (2025.01)
    *H10D 64/01*       (2025.01)

(56)              References Cited

U.S. PATENT DOCUMENTS

| | | | |
|---|---|---|---|
| 9,412,817 | B2 | 8/2016 | Yang et al. |
| 9,412,828 | B2 | 8/2016 | Ching et al. |
| 9,472,618 | B2 | 10/2016 | Oxland |
| 9,502,265 | B1 | 11/2016 | Jiang et al. |
| 9,520,482 | B1 | 12/2016 | Chang et al. |
| 9,536,738 | B2 | 1/2017 | Huang et al. |
| 9,576,814 | B2 | 2/2017 | Wu et al. |
| 9,608,116 | B2 | 3/2017 | Ching et al. |
| 10,453,752 | B2 | 10/2019 | Van Dal |
| 11,024,548 | B2 | 6/2021 | Van Dal |
| 11,322,495 | B2 | 5/2022 | Vellianitis |
| 2011/0140097 | A1* | 6/2011 | Cheong ................ H10D 30/031 |
| | | | 257/E29.094 |
| 2017/0373188 | A1* | 12/2017 | Mochizuki ........... H10D 30/025 |
| 2019/0181224 | A1* | 6/2019 | Zhang .................. H10D 64/017 |
| 2020/0294969 | A1* | 9/2020 | Rachmady ............. H10D 30/62 |
| 2020/0294998 | A1* | 9/2020 | Lilak ...................... H01L 23/535 |
| 2023/0086967 | A1* | 3/2023 | Suk ..................... H01L 29/7827 |
| 2023/0090092 | A1* | 3/2023 | Lilak ............... H01L 21/823842 |
| | | | 257/369 |
| 2023/0093897 | A1* | 3/2023 | Kim .................. H01L 29/66742 |
| | | | 257/288 |
| 2023/0128495 | A1* | 4/2023 | Fulford ............... H10D 62/118 |
| | | | 257/315 |
| 2023/0187539 | A1* | 6/2023 | Subramanian ....... H10D 62/121 |
| | | | 438/197 |

* cited by examiner 176
150
175
125
130
118
116
118
116
118
116
115
114
112
114
112
114
112
102
100

VO2
VO1
VO2

146
144
142
140

141
160

150
130
125
146
144
142
140
105
100

VO3
VO2
VO1

B
B
C
C
D
D 118
116
118
116
118
116
115
114
112
114
112
114
112

SEMICONDUCTOR DEVICE AND METHOD FOR FORMING THE SAME

BACKGROUND

The semiconductor integrated circuit (IC) industry has experienced rapid growth. Technological advances in IC materials and design have produced generations of ICs. Each generation has smaller and more complex circuits than the previous generation. However, these advances have increased the complexity of processing and manufacturing ICs. In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs. However, since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

Reference is made to FIGS. 36A to 36D, in which.

DETAILED DESCRIPTION

Figures 1A, 1B:
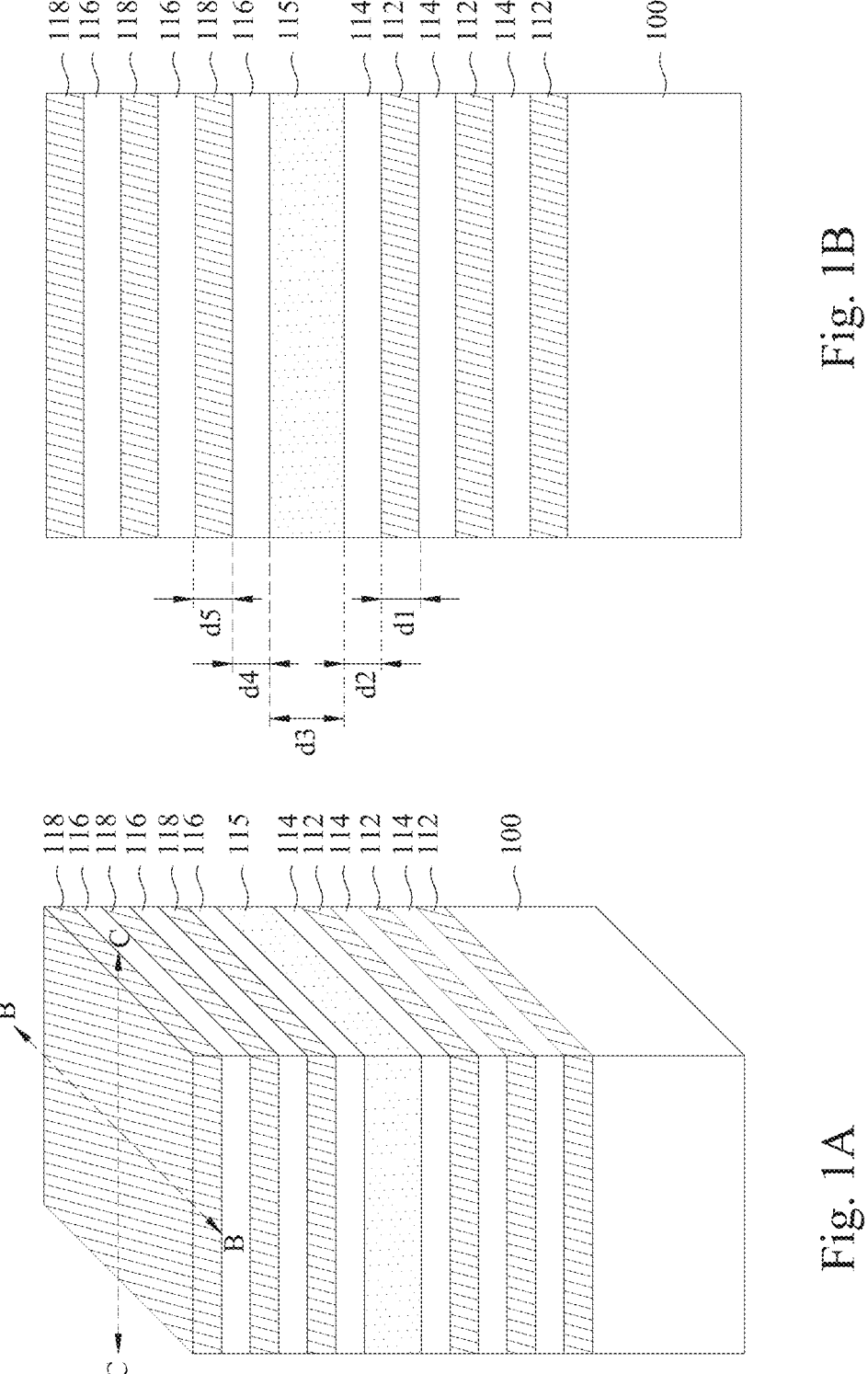
FIGS. 1A to 24D show various stages of manufacturing operations for a semiconductor device according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The gate all around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

FIGS. 1A to 24D show various stages of manufacturing operations for a semiconductor device according to some embodiments of the present disclosure. In greater details, the semiconductor device discussed in FIGS. 1A to 24D is a complementary FET (CFET). Generally, a CFET includes a first transistor vertically stacked over a second transistor, in which the first and second transistors include different conductivity types. For example, the first transistor and the second transistor may be n-type transistor and p-type transistor, respectively. Alternatively, the first transistor and the second transistor may be p-type transistor and n-type transistor, respectively.

Figure 1C:
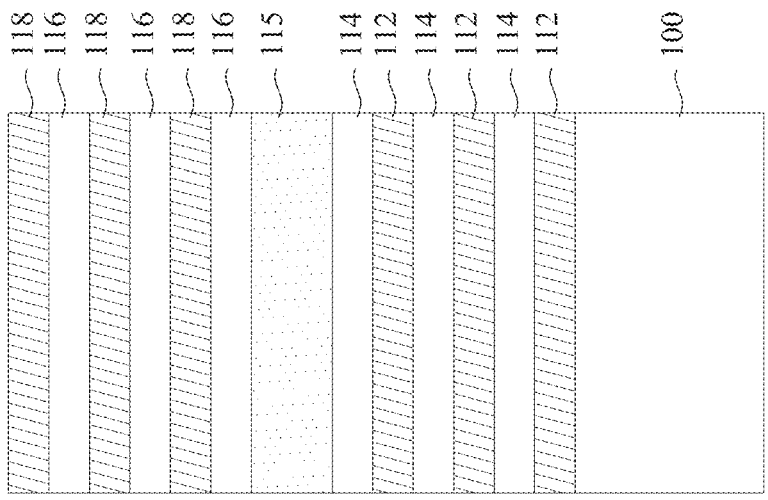

Reference is made to FIGS. 1A to 1C, in which FIG. 1A is a schematic view of a semiconductor device, FIG. 1B is a cross-sectional view along line B-B of FIG. 1A, and FIG. 1C is a cross-sectional view along line C-C of FIG. 1A. Shown there is a substrate 100. In some embodiments, the substrate 100 includes a single crystalline semiconductor layer on at least its surface portion. The substrate 100 may comprise a single crystalline semiconductor material such as, but not limited to Si, Ge, SiGe, GaAs, InSb, GaP, GaSb, InAlAs, InGaAs, GaSbP, GaAsSb and InP. In certain embodiments, the substrate 100 is made of crystalline Si.

First sacrificial layers 112 and first channel layers 114 are deposited alternately over the substrate 100. In some embodiments, the first sacrificial layers 112 may be made of a semiconductor material, and thus can also be referred to as semiconductor layers. For example, the first sacrificial layers 112 are made of $Si_xGe_{1-x}$, where $0.1<x<0.9$ (hereinafter may be referred as SiGe). In some embodiments, the bottommost one of the first sacrificial layers 112 is in contact with the substrate 100.

The first channel layers 114 can be made of a semiconductor material, and thus can also be referred to as semiconductor layers. In some embodiments where the first channel layers 114 are made of a semiconductor material, the first channel layers 114 may include a semiconductor material different from the first sacrificial layers 112. In some embodiments, the first channel layers 114 can be made of $Si_yGe_{1-y}$, where $x<y$. For example, the first channel layers 114 can be made of pure silicon ($y=1$). In some other embodiments, the first channel layers 114 can be made of $Si_yGe_{1-y}$, where $x>y$. For example, the first channel layers 114 can be made of pure germanium ($y=0$). In some other embodiments, the first channel layers 114 are made of Si, Ge, GeSn, SiGe, GaAs, InSb, GaP, GaSb, InAlAs, InGaAs, GaSbP, GaAsSb, GaN, GaP, and InP. In some embodiments, the first sacrificial layers 112 and the first channel layers 114 are formed by epitaxially growth process. In some embodiments, the first sacrificial layers 112 and the first channel layers 114 can be referred to as nanostructures, nanosheets, or nanowires.

An isolation layer 115 is formed over the topmost one of the first channel layers 114. The isolation layer 115 may be made of dielectric material such as silicon oxide, silicon nitride, silicon oxynitride (SiON), SiCN, fluorine-doped silicate glass (FSG), or a low-K dielectric material. In some embodiments, the isolation layer 115 is made of oxide, and can also be referred to as an oxide layer. In some embodiments, the isolation layer 115 may be formed by LPCVD (low pressure chemical vapor deposition), plasma-CVD or flowable CVD or any other suitable film formation methods.

Second channel layers 116 and second sacrificial layers 118 are deposited alternately over the isolation layer 115. In some embodiments, the bottommost one of the second channel layers 116 are in contact with the isolation layer 115. Accordingly, the isolation layer 115 is sandwiched between the topmost one of the first channel layers 114 and the bottommost one of the second channel layers 116.

In some embodiments, the second sacrificial layers 118 are made of a same material as the first sacrificial layers 112. For example, the second sacrificial layers 118 are made of $Si_xGe_{1-x}$, where $0.1<x<0.9$ (hereinafter may be referred as SiGe). In some embodiments, the second sacrificial layers 118 are formed by suitable deposition process, such as CVD, PVD, or ALD.

The second channel layers 116 are made of a material that is different from the first channel layers 114. In some embodiments, the second channel layers 114 can be made of semiconductive oxide material, and thus can also be referred to as semiconductive oxide layers. In some embodiments, the second channel layers 116 can be made of semiconductive oxide material suitable for an n-type device, such as indium gallium zinc oxide (IGZO), or a similar conducting oxide semiconductor material such as indium zinc oxide (IZO), indium oxide ($InO_x$), gallium oxide ($GaO_x$), or combinations thereof. In some embodiments, the second channel layers 116 may be deposited by a CVD process or ALD process.

In some embodiments, the first sacrificial layer 112, the first channel layer 114, the isolation layer 115, the second channel layer 116, and the second sacrificial layer 118 may include thicknesses d1, d2, d3, d4, and d5, respectively. In some embodiments, the thicknesses d1, d2, d4, d5 may be in a range from about 1 nm to about 20 nm, the thickness d3 may be in a range from about 5 nm to about 50 nm. In some embodiments, the thicknesses d1, d2, d4, d5 may be substantially the same. In some embodiments, the thickness d3 may be larger than the thicknesses d1, d2, d4, d5.

In some embodiments, the second channel layers 116, which are made of semiconductive oxide material, may include an amorphous structure. This is because the bottommost one the second channel layers 116 is deposited over the isolation layer 115, which is not a crystalline structure. Moreover, the second sacrificial layers 118 may also include an amorphous structure because they are formed from the amorphous second channel layers 116.

Figure 2B:
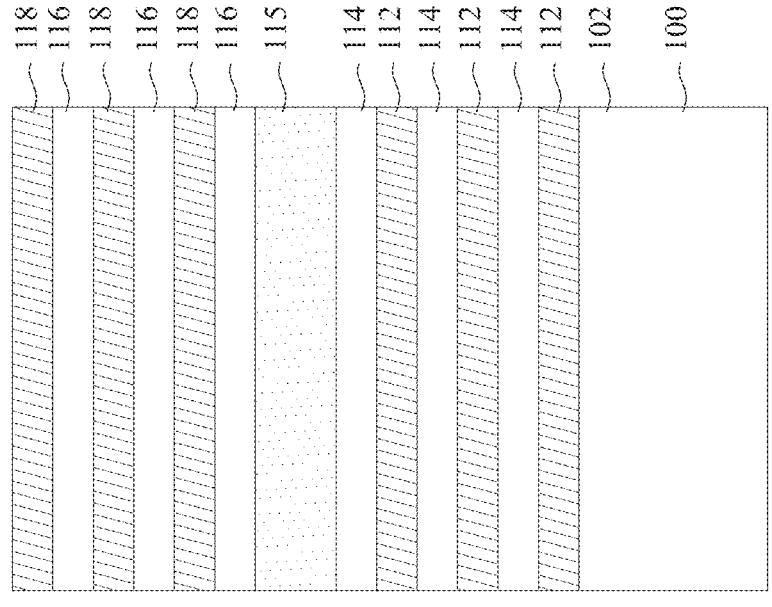
Figure 2A:
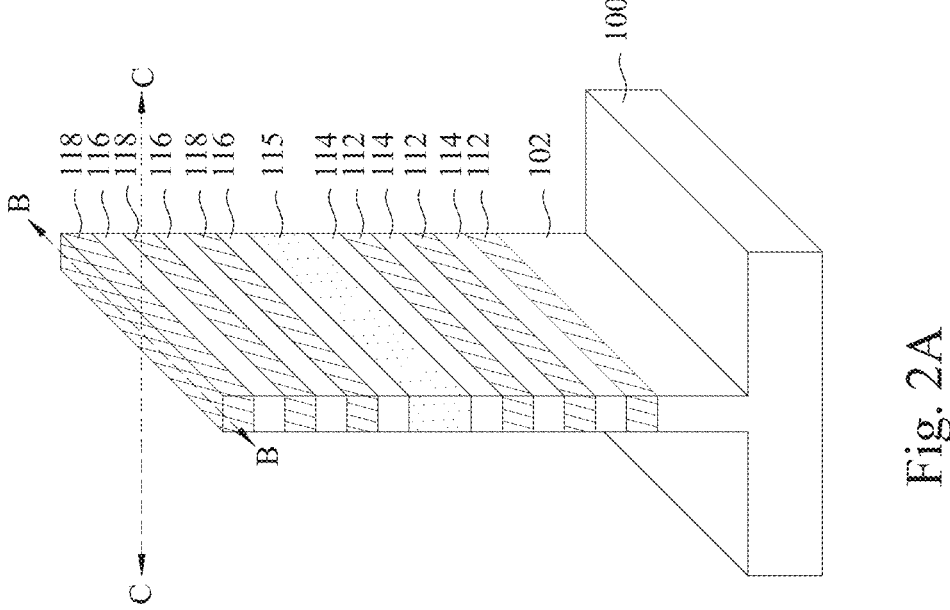
Figure 2C:
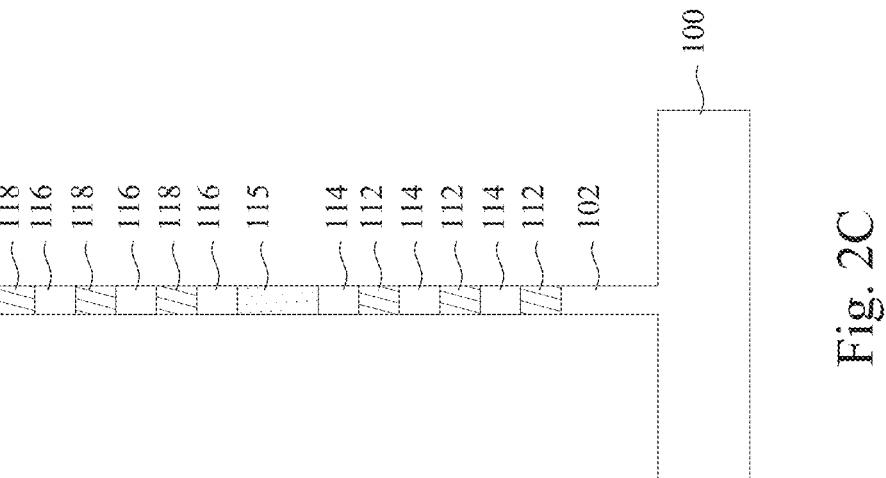

Reference is made to FIGS. 2A to 2C, in which FIG. 2A is a schematic view of a semiconductor device, FIG. 2B is a cross-sectional view along line B-B of FIG. 2A, and FIG. 2C is a cross-sectional view along line C-C of FIG. 2A. The first sacrificial layers 112, the first channel layers 114, the isolation layer 115, the second channel layers 116, and the second sacrificial layers 118 are patterned. In some embodiments, a patterned mask is formed over the topmost one of the second sacrificial layers 118, in which the patterned mask may include openings that expose unwanted portions of the first sacrificial layers 112, the first channel layers 114, the isolation layer 115, the second channel layers 116, and the second sacrificial layers 118. Afterward, an anisotropic etching process may be performed to remove the unwanted portions of the first sacrificial layers 112, the first channel layers 114, the isolation layer 115, the second channel layers 116, and the second sacrificial layers 118. After the etching process is completed. A semiconductor strip 102 may be formed protruding over the top surface of the substrate 100. In some embodiments, the semiconductor strip 102 and the remaining portions of the first sacrificial layers 112, the first channel layers 114, the isolation layer 115, the second channel layers 116, and the second sacrificial layers 118 can be collectively referred to as a fin structure.

Figures 3A, 3B:
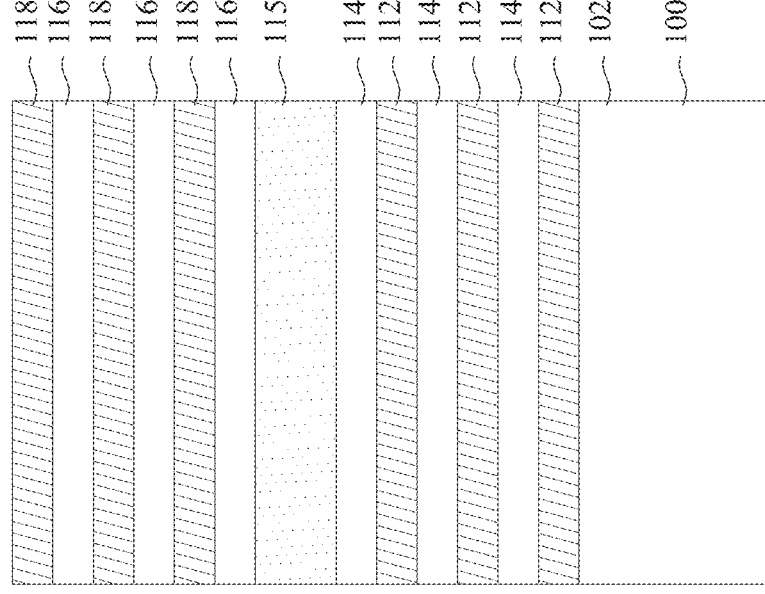
Figure 3C:
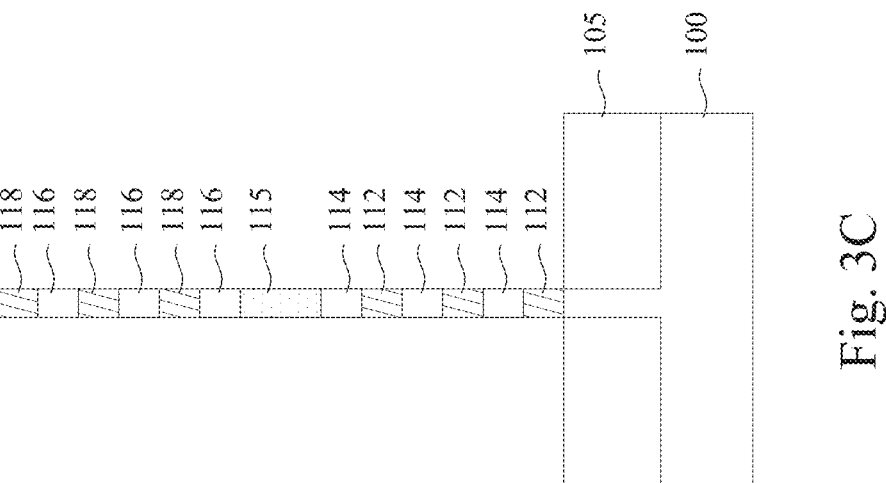

Reference is made to FIGS. 3A to 3C, in which FIG. 3A is a schematic view of a semiconductor device, FIG. 3B is a cross-sectional view along line B-B of FIG. 3A, and FIG. 3C is a cross-sectional view along line C-C of FIG. 3A. Isolation structures 105 are formed over the substrate 100 and laterally surrounding the semiconductor strip 102. The isolation structures 105 may be shallow trench isolation (STI) structures, suitable isolation structures, combinations of the foregoing, or the like. In some embodiments, the isolation structures 105 may be made of oxide (e.g., silicon oxide) or nitride (e.g., silicon nitride). In some other embodiments, each of the isolation structures 105 may include a dielectric layer and a dielectric liner lining the dielectric layer, in which the dielectric liner and the dielectric layer are made of different materials, for example, the dielectric liner may be silicon nitride, and the dielectric layer may be silicon oxide. In some embodiments, the isolation structures 105 may be formed by, for example, depositing dielectric material(s) over the substrate 100 and overfilling the spaces outside the semiconductor strip 102 and the remaining portions of the first sacrificial layers 112, the first channel layers 114, the isolation layer 115, the second channel layers 116, and the second sacrificial layers 118, performing a chemical mechanism polishing (CMP) process to the dielectric material(s), and etching back the dielectric material(s) until the bottommost one of the first sacrificial layers 112 is exposed. In some embodiments, the top surfaces of the isolation structures 105 may be substantially level with the top surface of the semiconductor strip 102. In some other embodiments, the top surfaces of the isolation structures 105 may be slightly lower than top surface of the semiconductor strip 102.

Figure 4B:
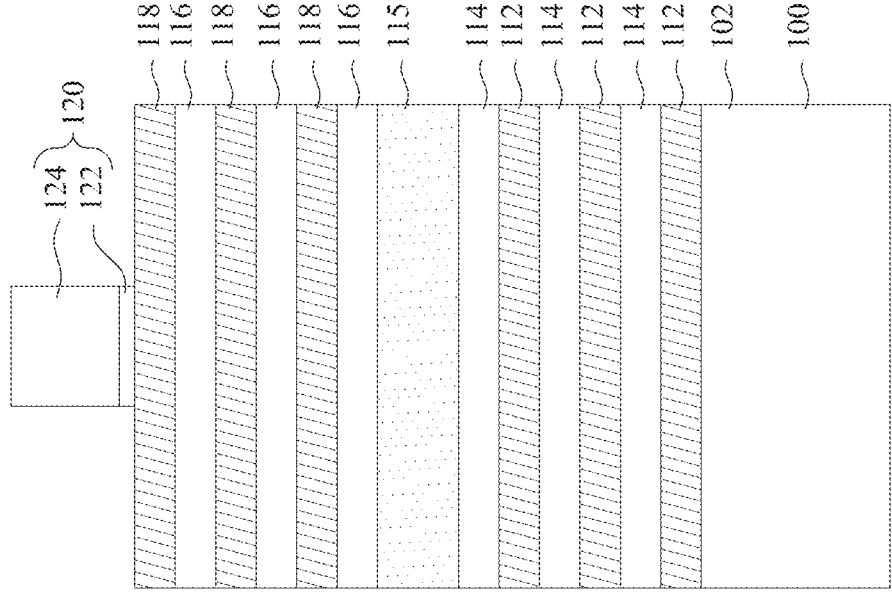
Figure 4A:
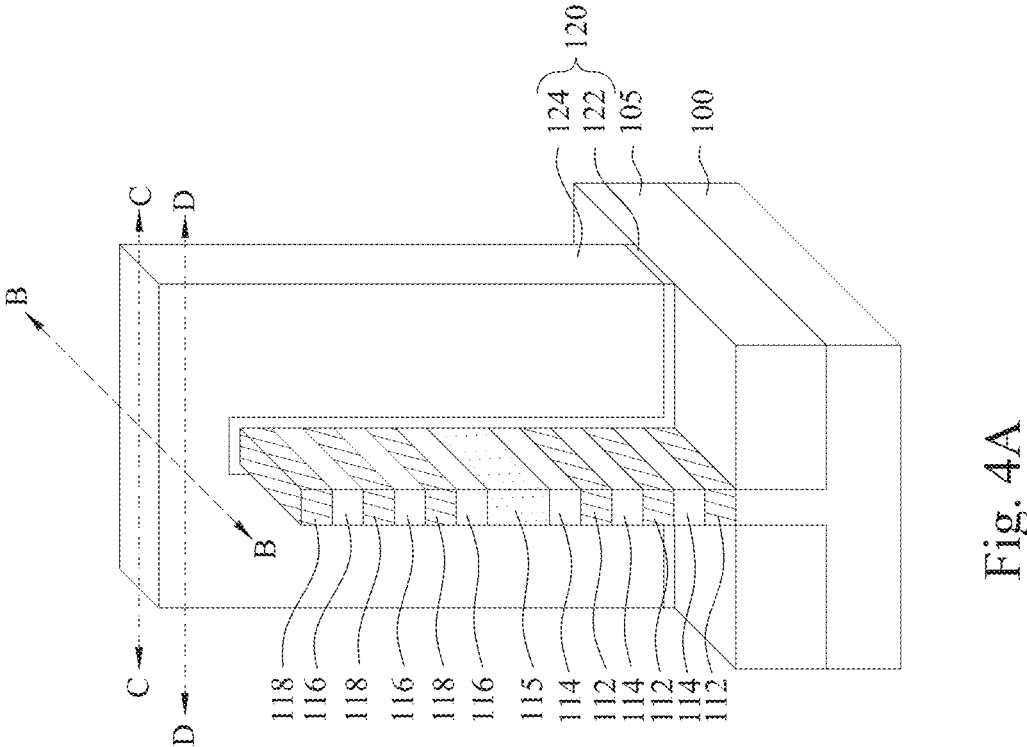
Figure 4D:
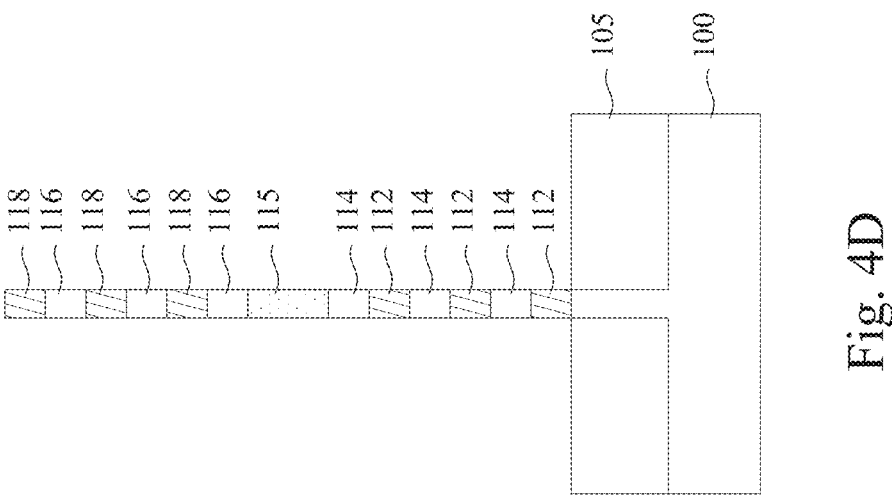
Figure 4C:
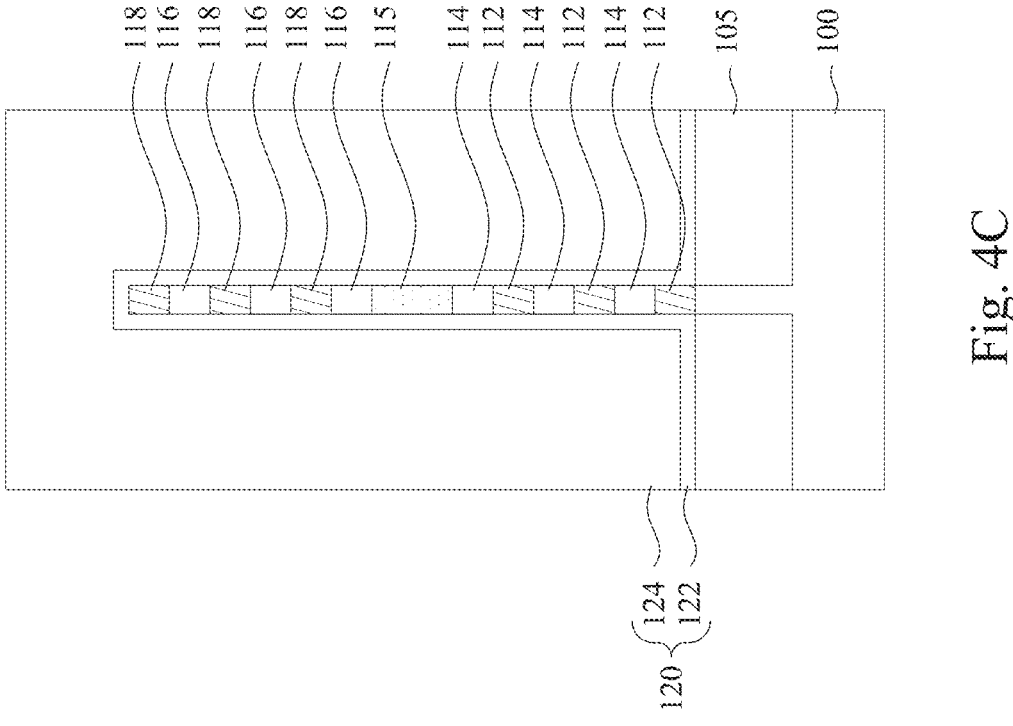

Reference is made to FIGS. 4A to 4D, in which FIG. 4A is a schematic view of a semiconductor device, FIG. 4B is a cross-sectional view along line B-B of FIG. 4A, FIG. 4C is a cross-sectional view along line C-C of FIG. 4A, and FIG. 4D is a cross-sectional view along line D-D of FIG. 4A. A dummy gate structure 120 is formed over the substrate 100 and crossing the fin structure formed by the semiconductor strip 102, the first sacrificial layers 112, the first channel layers 114, the isolation layer 115, the second channel layers 116, and the second sacrificial layers 118. In some embodiments, the dummy gate structure 120 includes a dummy gate dielectric 122 and a dummy gate electrode 124 over the dummy gate dielectric 122.

In some embodiments, a dummy gate dielectric layer is formed over the structure as shown in FIGS. 3A to 3C. The dummy gate dielectric layer includes one or more layers of silicon oxide, silicon nitride and/or silicon oxynitride. Afterwards, a dummy gate electrode layer is then deposited on the dummy gate dielectric layer. The dummy gate electrode layer includes silicon such as poly crystalline silicon or amorphous silicon. The dummy gate dielectric layer and the dummy gate electrode layer may be patterned to form the dummy gate structure 120. In some embodiments, the dummy gate electrode layer may be subjected to a planarization operation. The dummy gate dielectric 122 and the dummy gate electrode 124 may be deposited using CVD, including LPCVD and PECVD, PVD, ALD, or other suitable process.

Figure 5B:
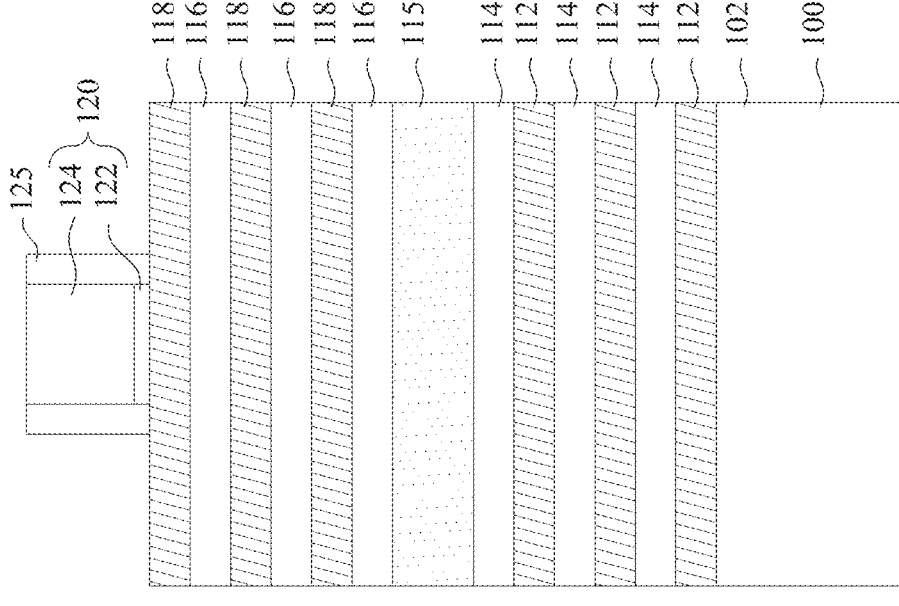
Figure 5A:
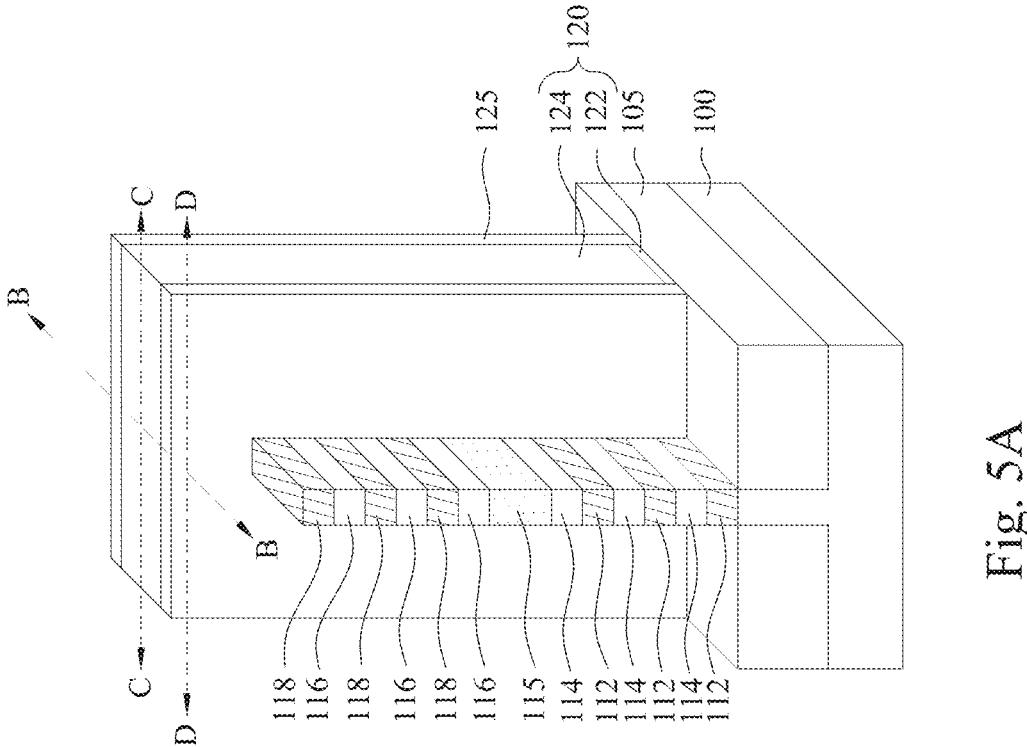
Figure 5D:
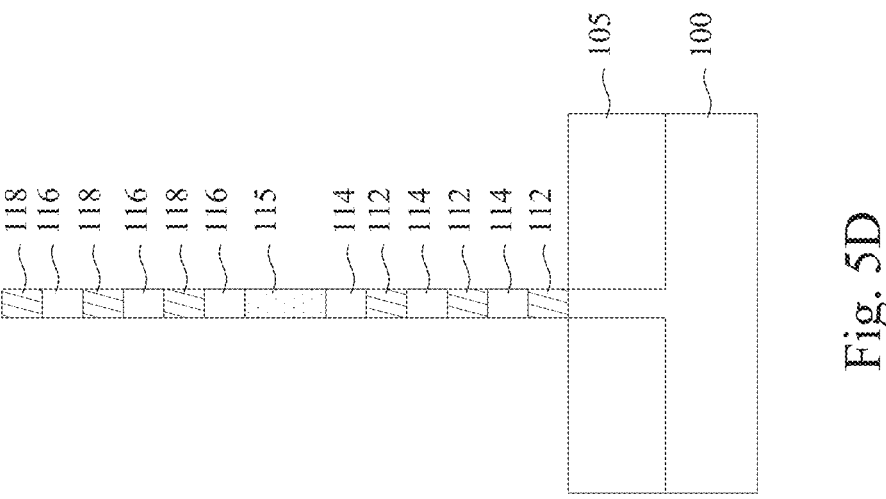
Figure 5C:
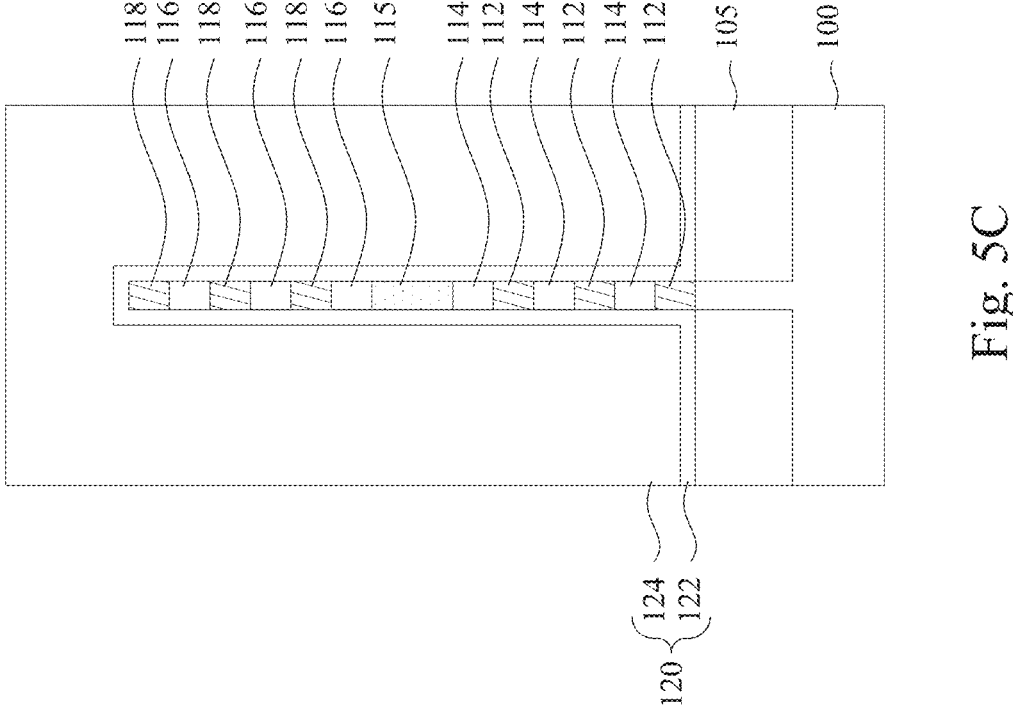

Reference is made to FIGS. 5A to 5D, in which FIG. 5A is a schematic view of a semiconductor device, FIG. 5B is a cross-sectional view along line B-B of FIG. 5A, FIG. 5C is a cross-sectional view along line C-C of FIG. 5A, and FIG. 5D is a cross-sectional view along line D-D of FIG. 5A. Gate spacers 125 are formed on opposite sidewalls of the dummy gate structure 120. In some embodiments, the gate spacers 125 may be formed by depositing a spacer material blanket over the dummy gate structure 120, and performing an anisotropic etching on the spacer material using, for example, reactive ion etching (RIE). During the anisotropic etching process, spacer material is removed from horizontal surfaces, leaving the spacer material on the vertical surfaces such as the sidewalls of the dummy gate structure 120. In some embodiments, the gate spacers 125 may be silicon nitride-based material, such as SiN, SiON, SiCON or SiCN and combinations thereof, or any other suitable insulating material.

Figure 6B:
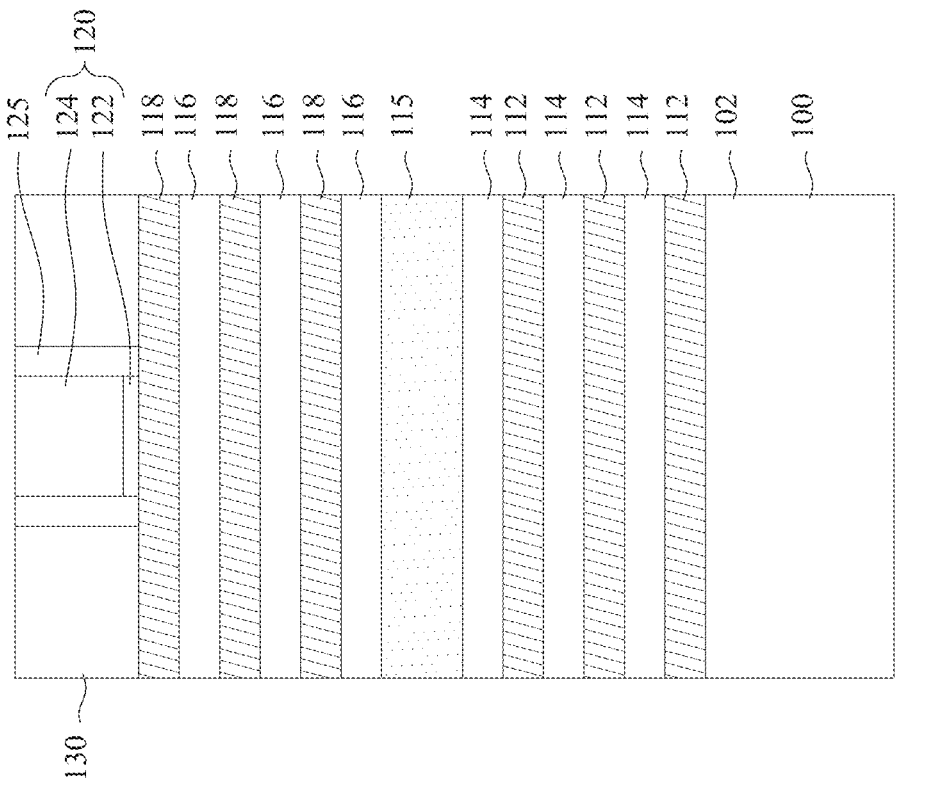
Figure 6A:
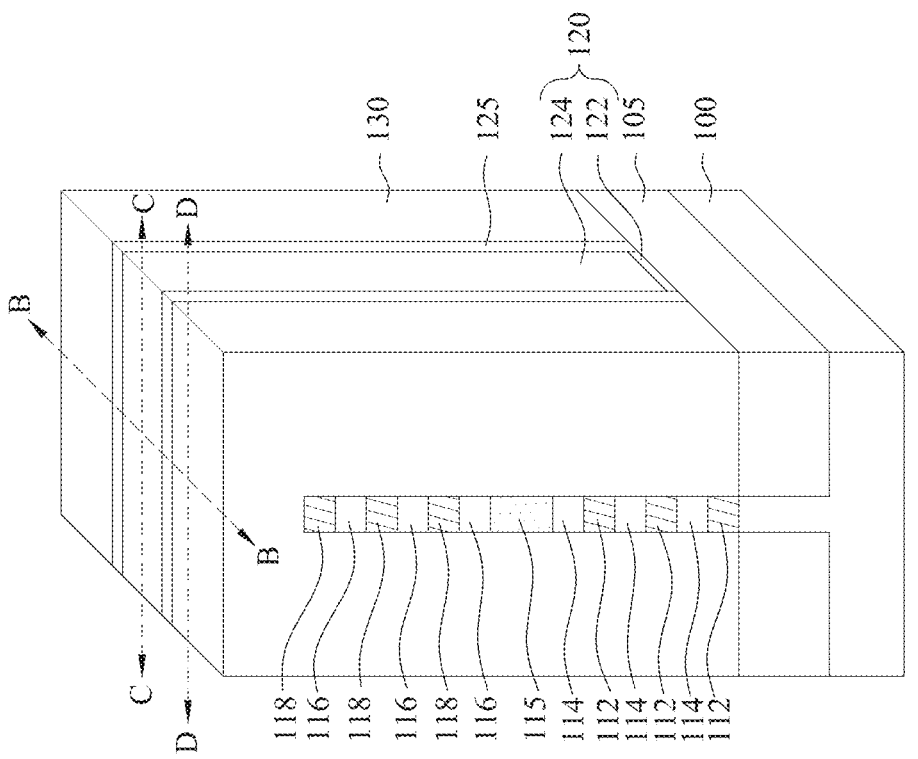
Figure 6D:
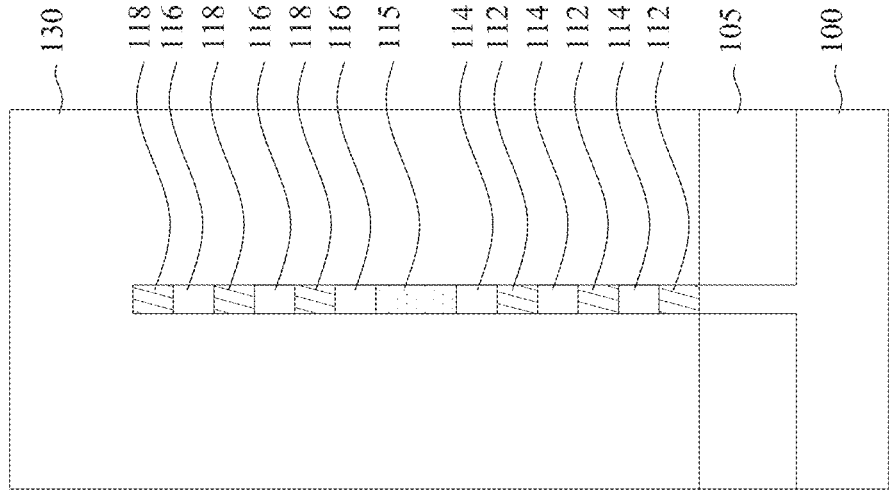
Figure 6C:
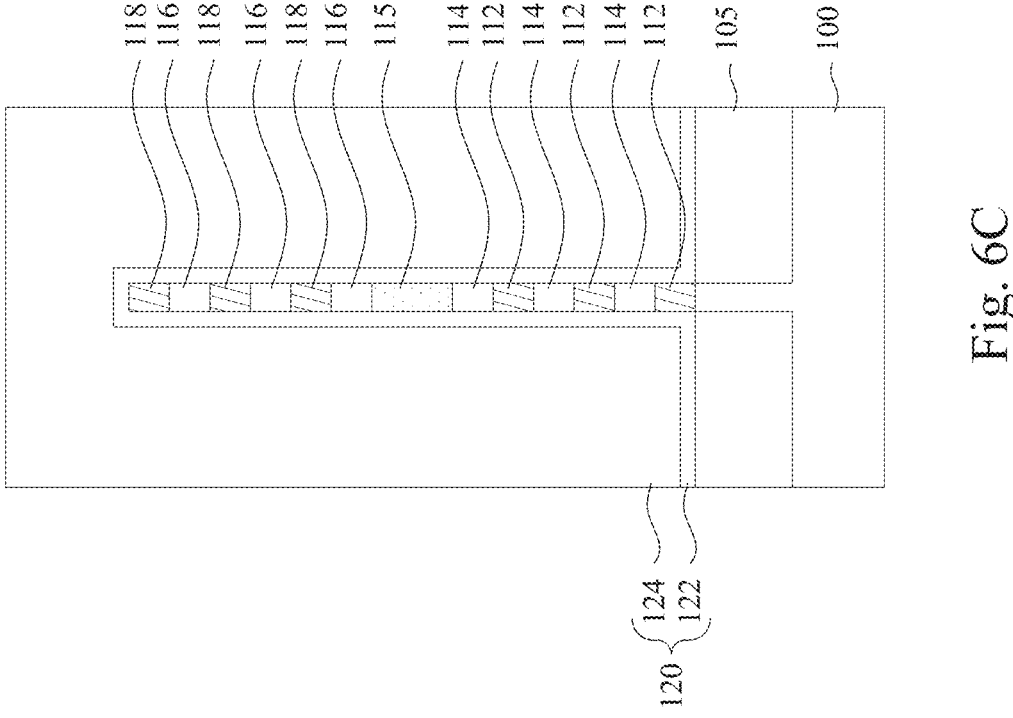

Reference is made to FIGS. 6A to 6D, in which FIG. 6A is a schematic view of a semiconductor device, FIG. 6B is a cross-sectional view along line B-B of FIG. 6A, FIG. 6C is a cross-sectional view along line C-C of FIG. 6A, and FIG. 6D is a cross-sectional view along line D-D of FIG. 6A. An interlayer dielectric (ILD) layer 130 is deposited over the substrate 100 and laterally surrounding the dummy gate structure 120. In some embodiments, the ILD layer 130 may be formed by depositing a dielectric material overfilling spaces outside the dummy gate structure 120 and the gate spacers 125, and then performing a CMP process until top surface of the dummy gate structure 120 is exposed.

In some embodiments, the ILD layer 130 may include silicon oxide, silicon nitride, silicon oxynitride, tetraethoxysilane (TEOS), phosphosilicate glass (PSG), borophosphosilicate glass (BPSG), low-k dielectric material, and/or other suitable dielectric materials. Examples of low-k dielectric materials include, but are not limited to, fluorinated silica glass (FSG), carbon doped silicon oxide, amorphous fluorinated carbon, parylene, bis-benzocyclobutenes (BCB), or polyimide. In some embodiments, the ILD layer 130 can be deposited by CVD, plasma-enhanced CVD (PECVD), atomic layer deposition (ALD), plasma-enhanced ALD (PEALD) or the like, or combinations thereof.

Figure 7B:
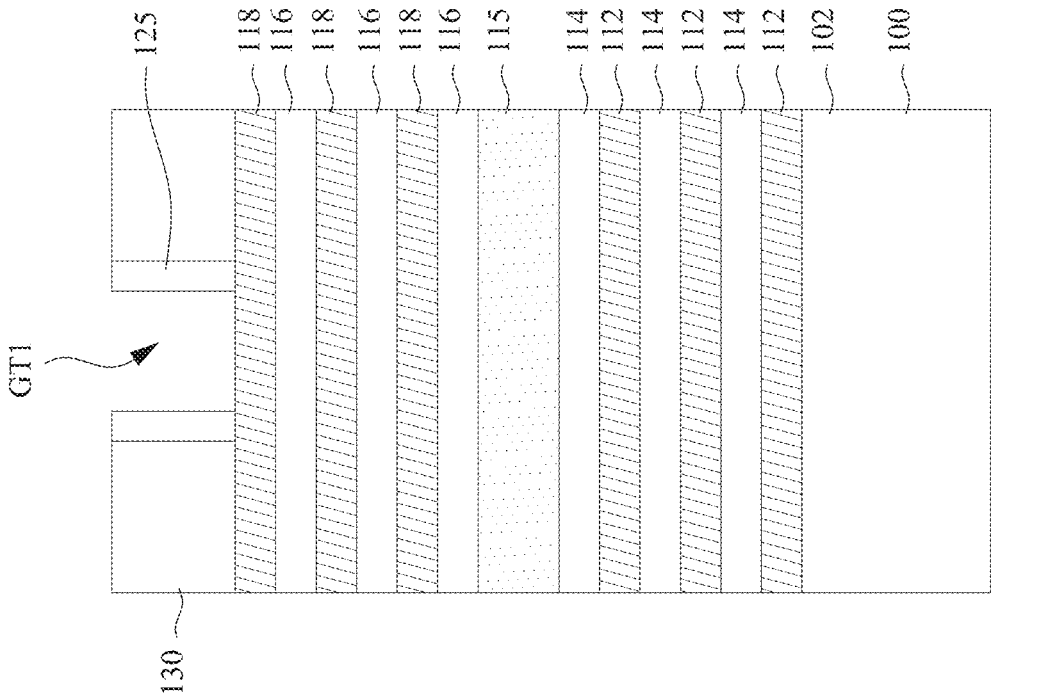
Figure 7A:
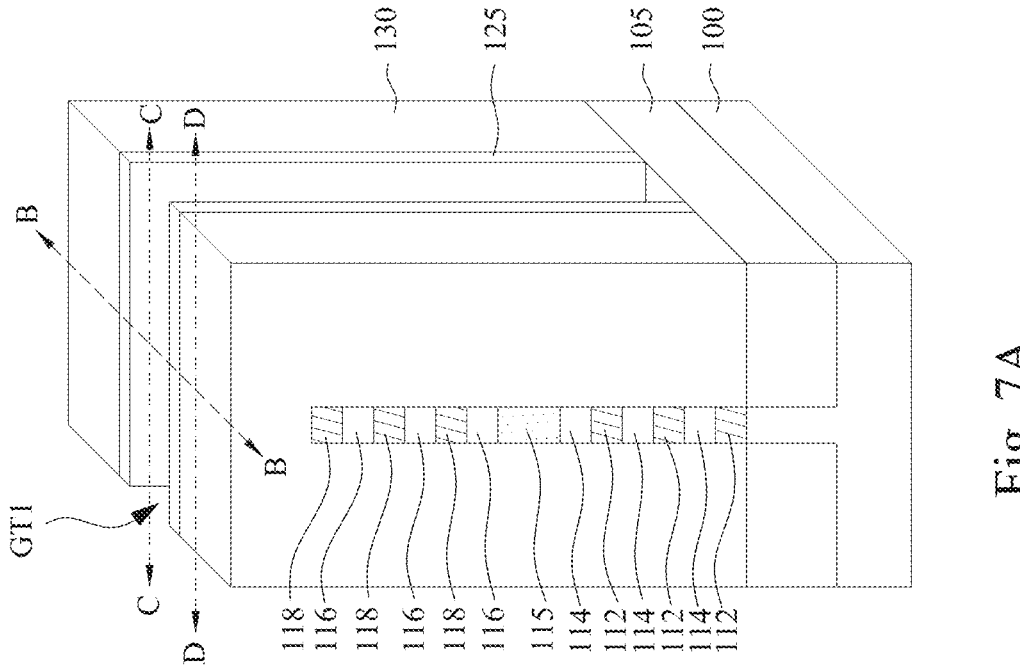
Figure 7D:
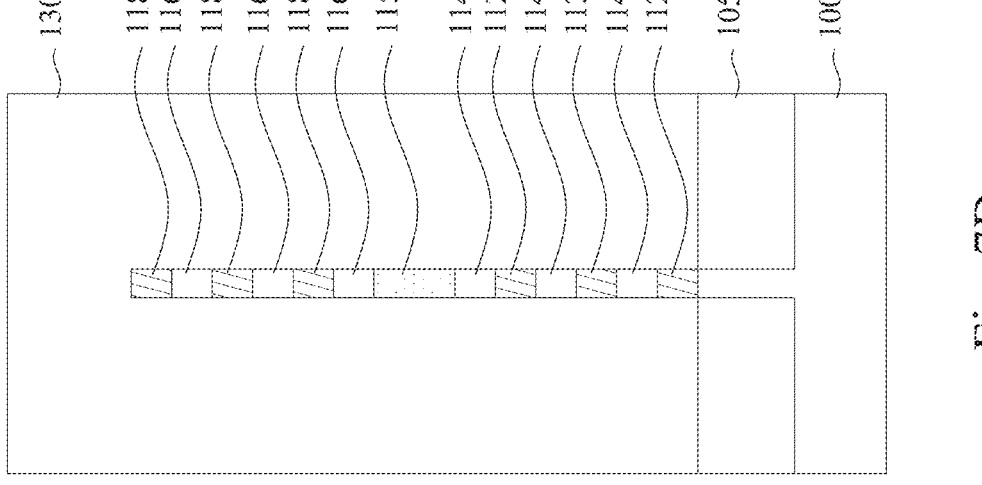
Figure 7C:
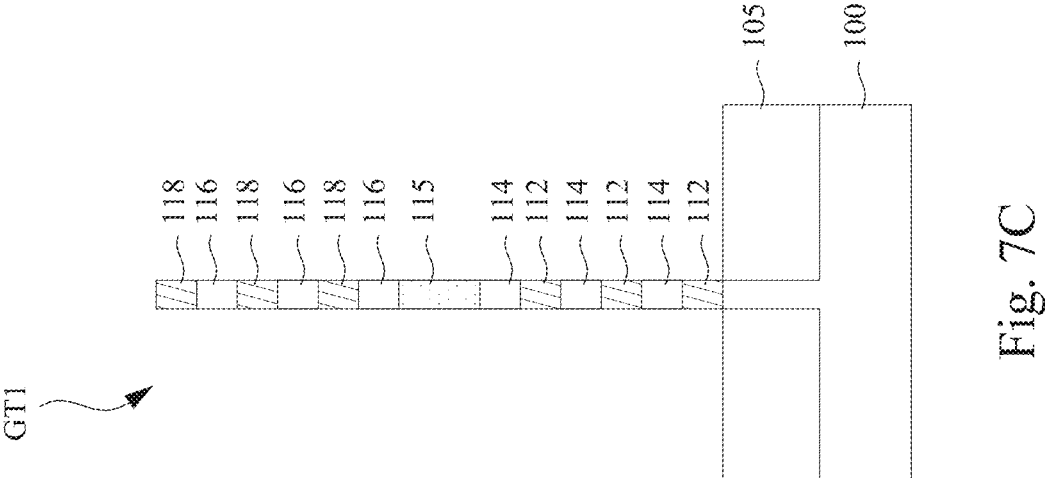

Reference is made to FIGS. 7A to 7D, in which FIG. 7A is a schematic view of a semiconductor device, FIG. 7B is a cross-sectional view along line B-B of FIG. 7A, FIG. 7C is a cross-sectional view along line C-C of FIG. 7A, and FIG. 7D is a cross-sectional view along line D-D of FIG. 7A. The dummy gate structure 120 is removed to form a gate trench GT1. In greater details, after the dummy gate structure 120 is removed, portions of the first sacrificial layers 112, the first channel layers 114, the isolation layer 115, the second channel layers 116, and the second sacrificial layers 118 are exposed through the gate trench GT1 (see FIG. 7C). In some embodiments, the dummy gate structure 120 can be removed using plasma dry etching and/or wet etching.

Figure 8B:
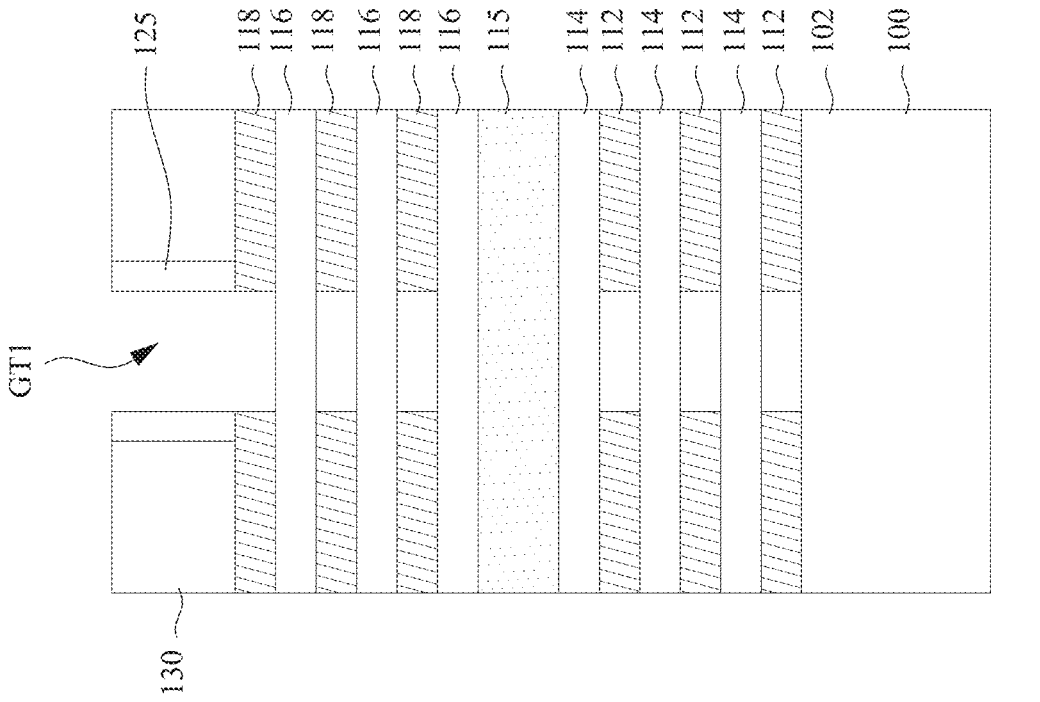
Figure 8A:
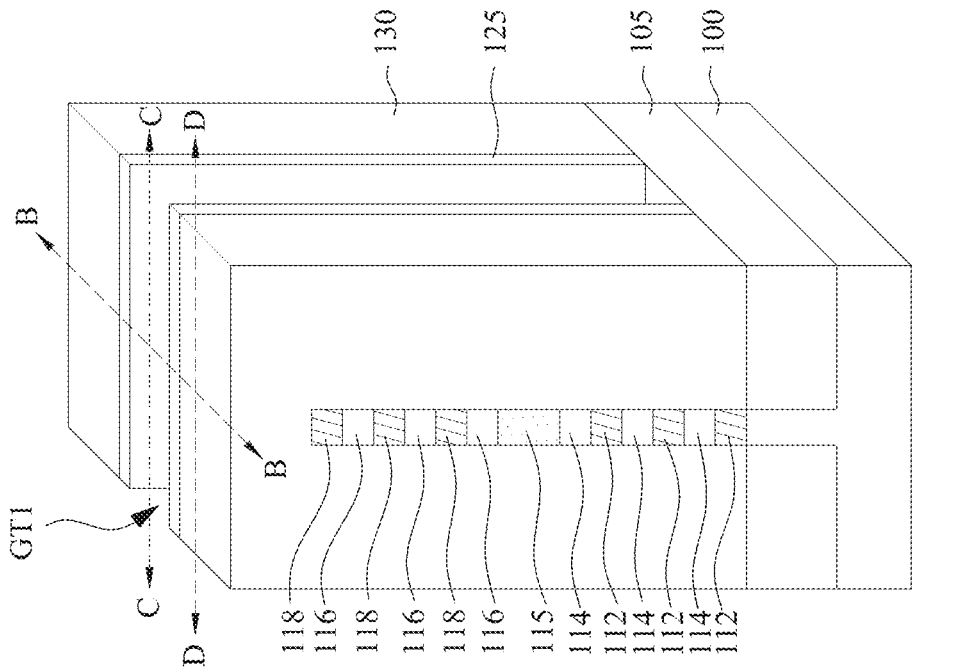
Figure 8D:
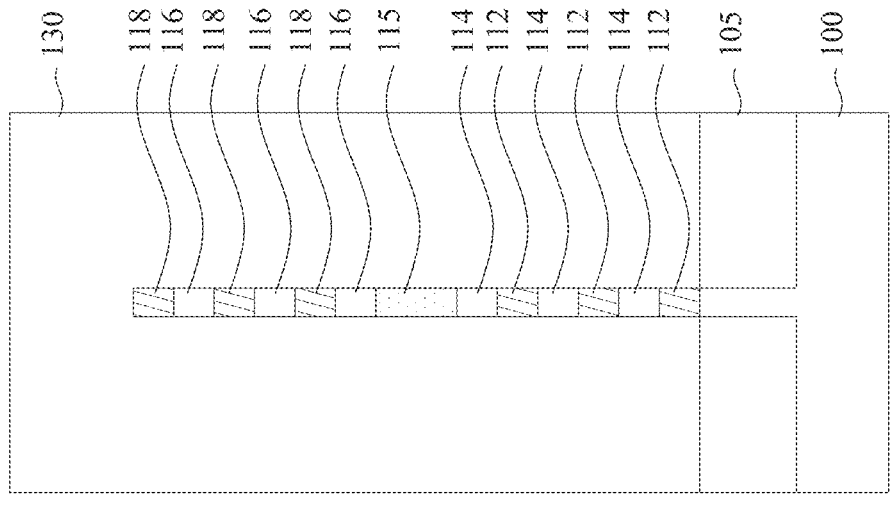
Figure 8C:
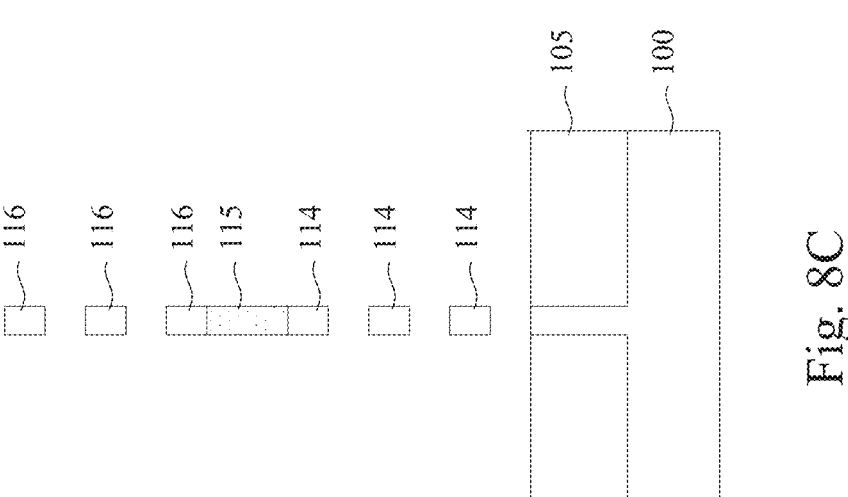

Reference is made to FIGS. 8A to 8D, in which FIG. 8A is a schematic view of a semiconductor device, FIG. 8B is a cross-sectional view along line B-B of FIG. 8A, FIG. 8C is a cross-sectional view along line C-C of FIG. 8A, and FIG. 8D is a cross-sectional view along line D-D of FIG. 8A. Portions of the first and second sacrificial layers 112 and 118 are removed through the gate trench GT1 by an etching process, leaving portions of the first channel layers 114 and second channel layer 116 suspended over the substrate 100 (see FIG. 8C). In some embodiments, because the first and second sacrificial layers 112 are made of a same material, the first and second sacrificial layers 112 and 118 can be removed simultaneously in a single etching process. The first channel layers 114, the second channel layer 116, and the isolation layer 115 may include higher etching resistance to the etching process. In some embodiments, the top surface of the semiconductor strip 102 is exposed after the first and second sacrificial layers 112 and 118 are removed.

The first and second sacrificial layers 112 and 118 may be removed using suitable etching process. For example, the first and second sacrificial layers 112 and 118 can be selectively removed using a wet etchant such as, but not limited to, ammonium hydroxide (NH4OH), tetramethylammonium hydroxide (TMAH), ethylenediamine pyrocatechol (EDP), potassium hydroxide (KOH) solutions, a hydrochloric acid (HCl) solution, or a hot ammonia solution.

After the first and second sacrificial layers 112 and 118 are removed, at least portions of the first channel layers 114 and second channel layer 116 are suspended over the substrate 100. For example, as shown in the cross-sectional view of FIG. 8C, at least one of the first channel layers 114 is suspended over the substrate 100 with four sides free from coverage by other material. Similar, at least one of the second channel layers 116 is suspended over the substrate 100 with four sides free from coverage by other material. However, the topmost one of the first channel layers 114 and the bottommost one of the second channel layers 116 remain in contact with the isolation layer 115, because the isolation layer 115 is not removed during the etching process. As a result, only three sides of the topmost first channel layer 114 are free from coverage by other material. Similar, only three sides of the bottommost second channel layer 116 are free from coverage by other material.

Figure 9B:
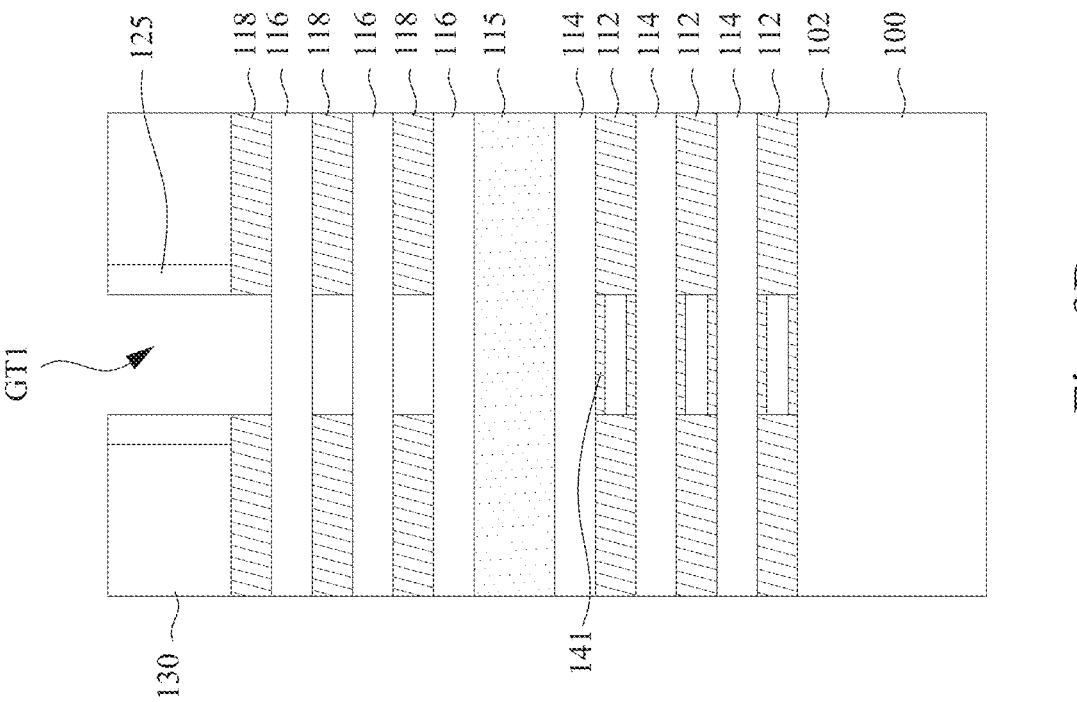
Figure 9A:
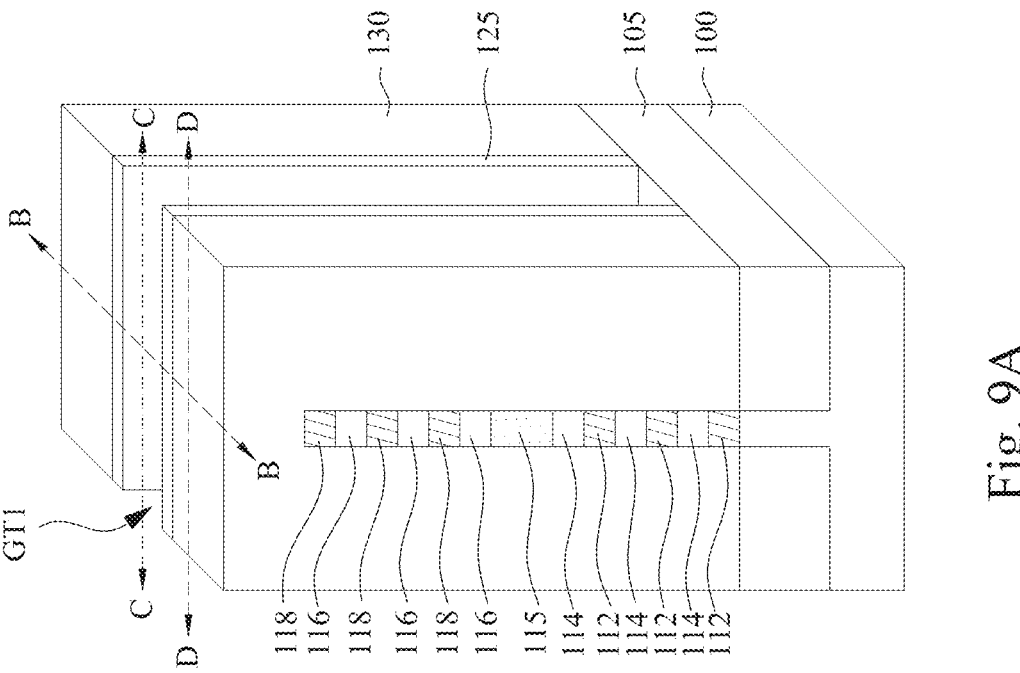
Figure 9D:
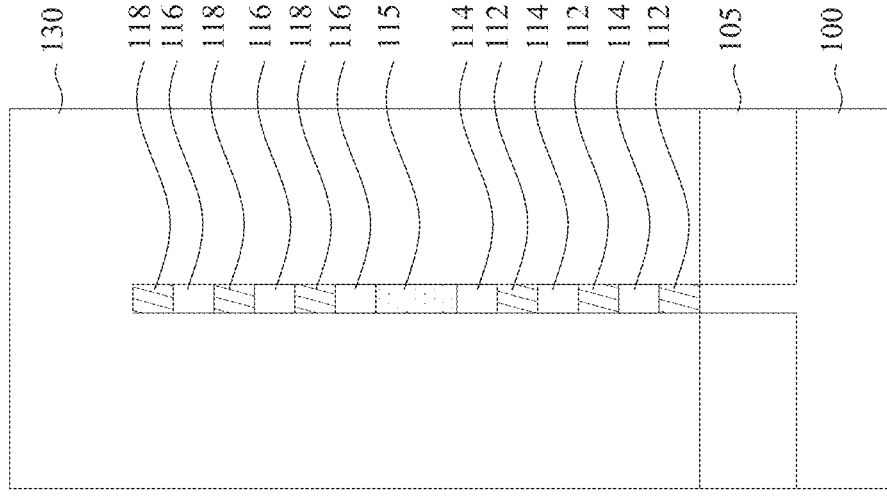
Figure 9D:
Figure 9C:
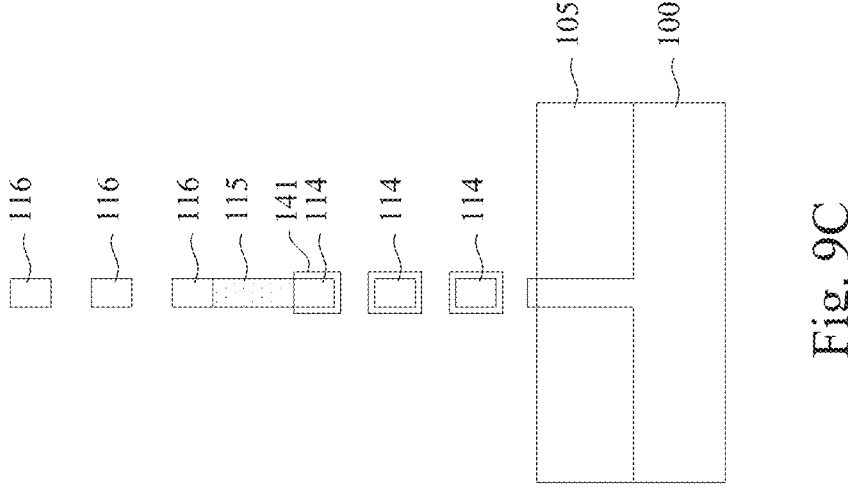

Reference is made to FIGS. 9A to 9D, in which FIG. 9A is a schematic view of a semiconductor device, FIG. 9B is a cross-sectional view along line B-B of FIG. 9A, FIG. 9C is a cross-sectional view along line C-C of FIG. 9A, and FIG. 9D is a cross-sectional view along line D-D of FIG. 9A. An interfacial layer 141 is selectively formed on exposed surfaces of the first channel layers 114 and the semiconductor strip 102. In some embodiments, the interfacial layer 141 may be formed by performing an oxidation process. In some embodiments where the first channel layers 114 are silicon-based material, such as Si or SiGe, the first channel layers 114 may be oxidized to form the interfacial layer 141 made of silicon oxide. On the other hand, because the second channel layers 116 are made of semiconductive oxide, and the isolation layer 115 are made of dielectric material, the oxidation process would not form the interfacial layer 141 on the exposed surface of the second channel layers 116 and the isolation layer 115. In some embodiments, the interfacial layer 141 may be omitted.

Figure 10B:
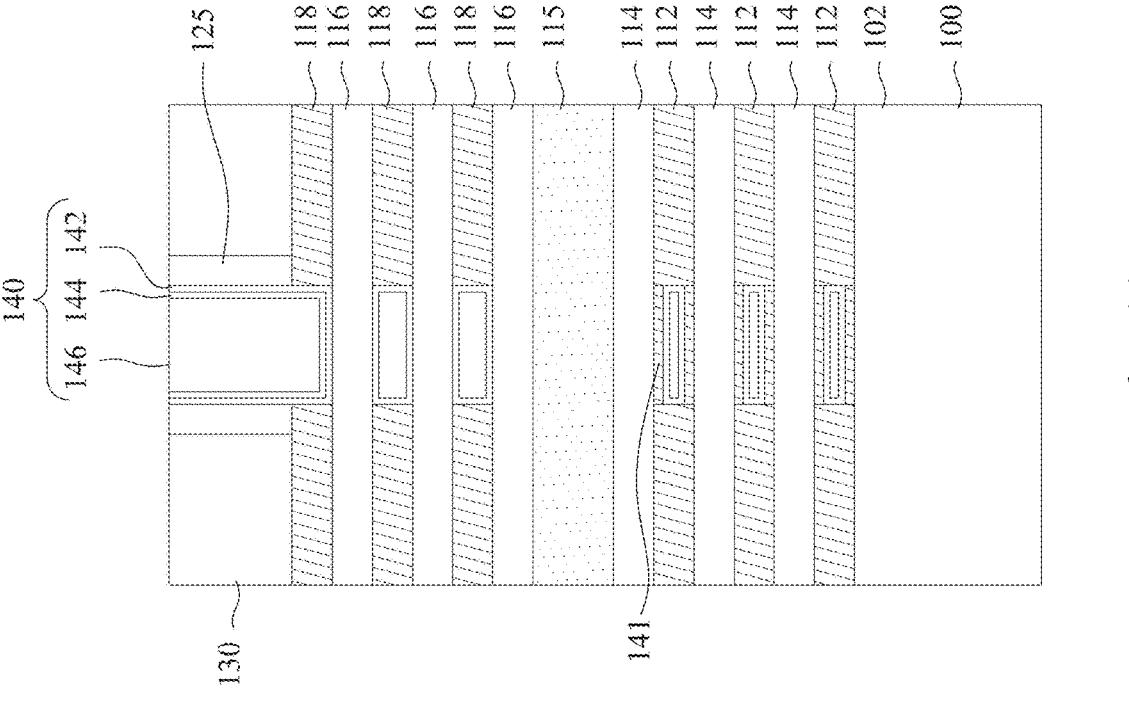
Figure 10A:
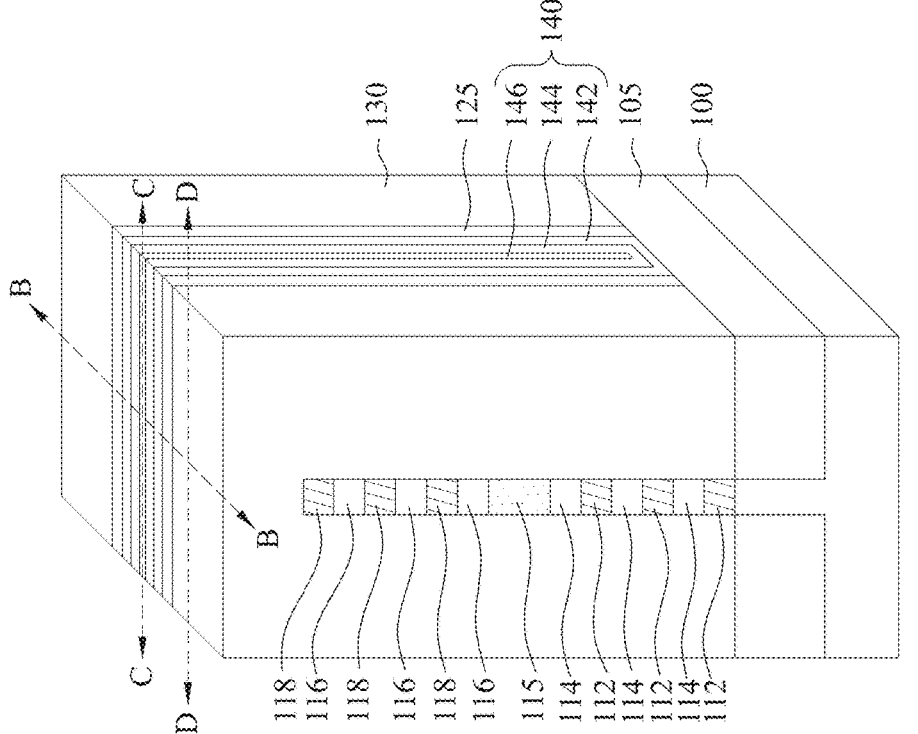
Figure 10D:
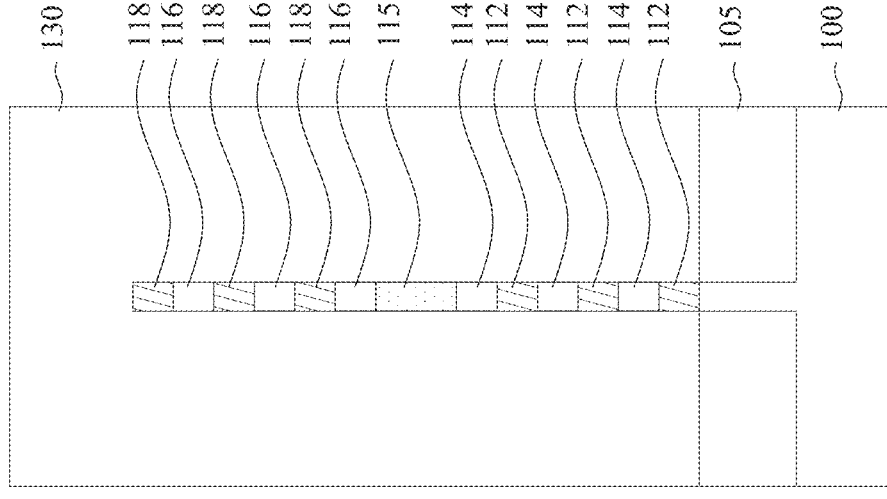
Figure 10C:
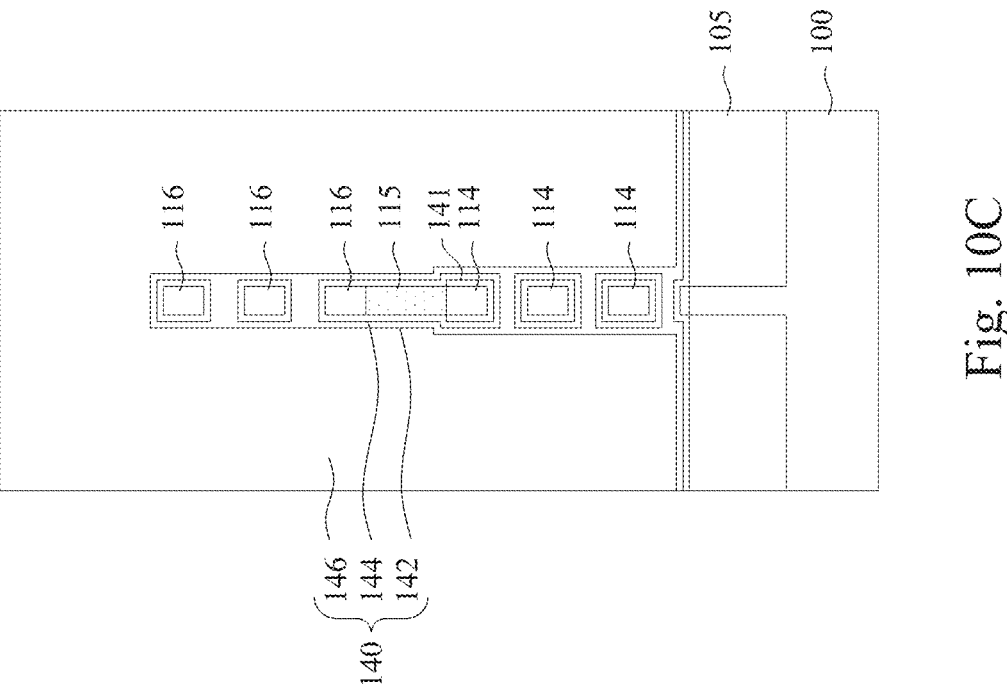

Reference is made to FIGS. 10A to 10D, in which FIG. 10A is a schematic view of a semiconductor device, FIG. 10B is a cross-sectional view along line B-B of FIG. 10A, FIG. 10C is a cross-sectional view along line C-C of FIG. 10A, and FIG. 10D is a cross-sectional view along line D-D of FIG. 10A. Gate dielectric layer 142 is formed in the gate trench GT1, a work function metal layer 144 is formed over the gate dielectric layer 142, and a gate electrode 146 is formed over the work function metal layer 144. The gate dielectric layer 142, the work function metal layer 144, and the gate electrode 146 may be collectively referred to as a gate structure 140. In some embodiments, the gate structure 140 may also include the interfacial layer 141.

In some embodiments, the gate dielectric layer 142 may be in contact with the exposed surfaces of the second channel layers 116 and the isolation layer 115, while the dielectric layer 142 may be separated from the first channel layers 112 and the semiconductor strip 102 by the interfacial layer 141. In some other embodiments where the interfacial layer 141 is omitted, the gate dielectric layer 142 may also be in contact with the first channel layers 112 and the semiconductor strip 102.

In some embodiments, the gate dielectric layer 142 may include one or more layers of a dielectric material, such as silicon oxide, silicon nitride, or high-k dielectric material, other suitable dielectric material, and/or combinations thereof. Examples of high-k dielectric material include $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof. The gate dielectric layer 142 may be formed by CVD, ALD or any suitable method.

In some embodiments, the work function metal layer 144 may be made of a conductive material such as a single layer of TiN, TaN, TaAlC, TiC, TaC, Co, Al, TiAl, HfTi, TiSi, TaSi or TiAlC, or a multilayer of two or more of these materials. For the n-channel FET, one or more of TaN, TaAlC, TiN, TiC, Co, TiAl, HfTi, TiSi and TaSi is used as the work function metal layer 144, and for the p-channel FET, one or more of TiAlC, Al, TiAl, TaN, TaAlC, TiN, TiC and Co is used as the work function metal layer 144. The work function metal layer 144 may be formed by ALD, PVD, CVD, e-beam evaporation, or other suitable process.

In some embodiments, the gate electrode 146 may include one or more layers of conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof. The gate electrode 146 may be formed by CVD, ALD, electro-plating, or other suitable method.

Figure 11B:
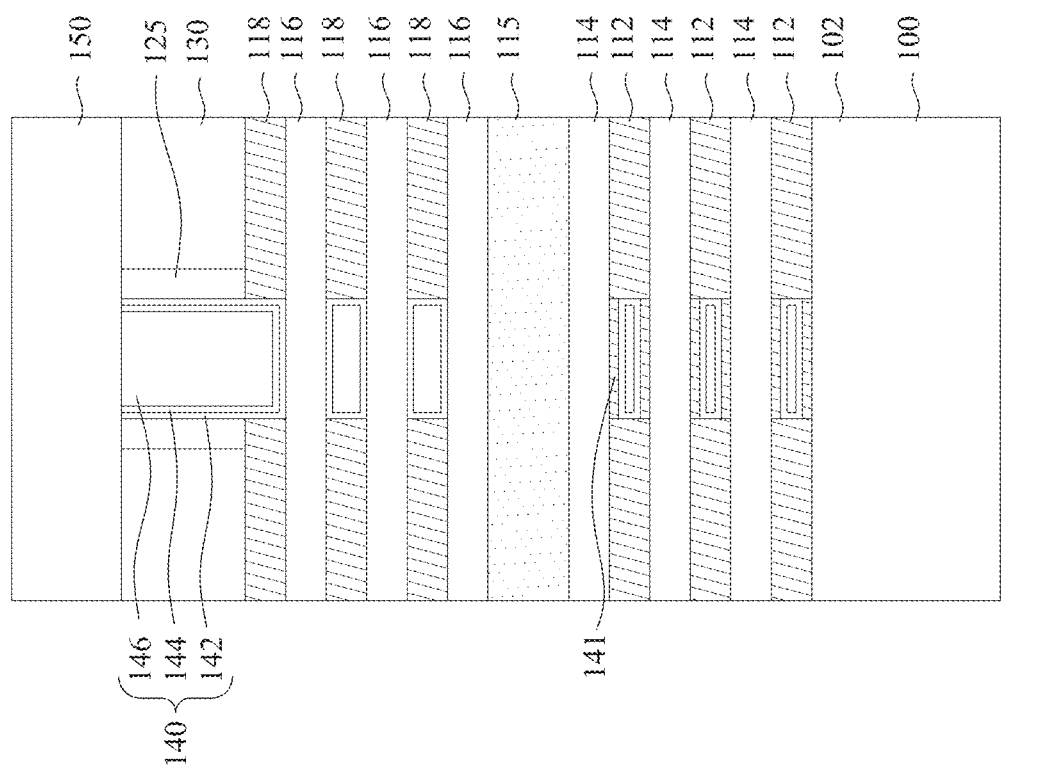
Figure 11A:
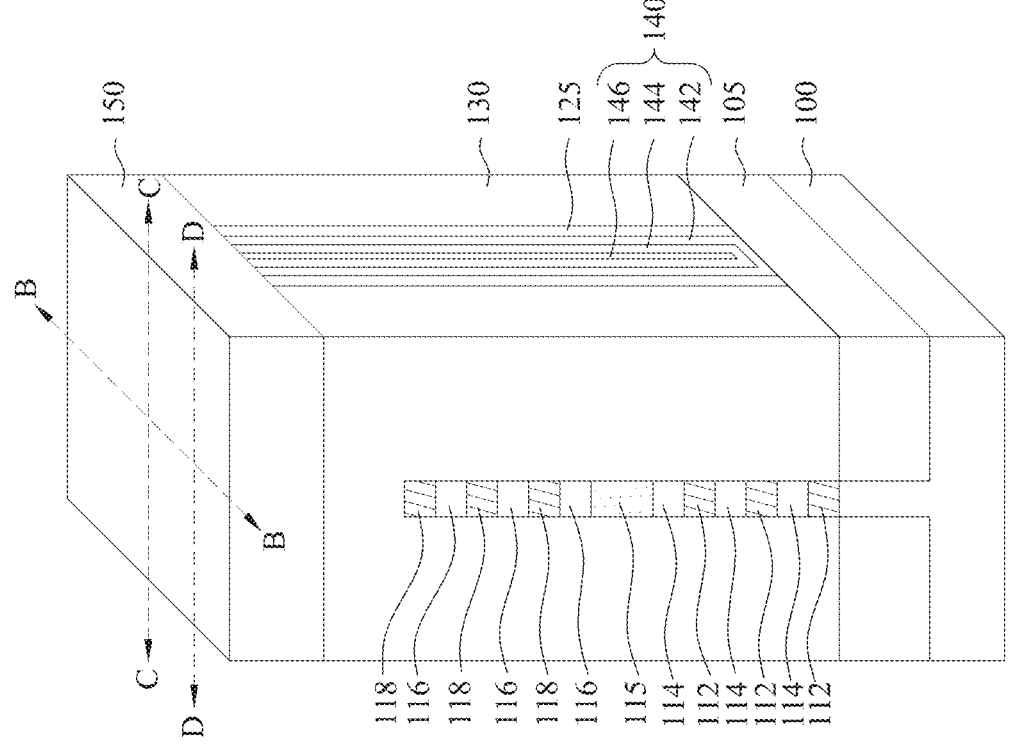
Figure 11D:
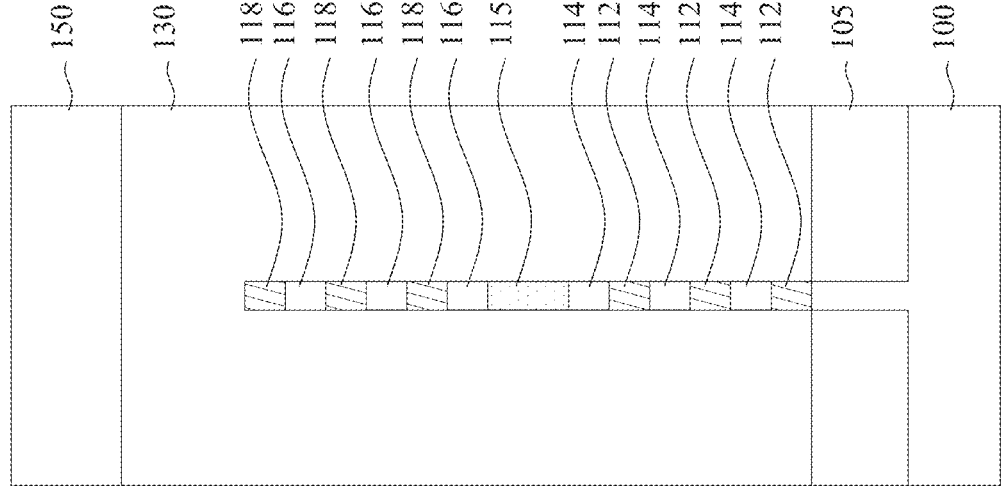
Figure 11C:
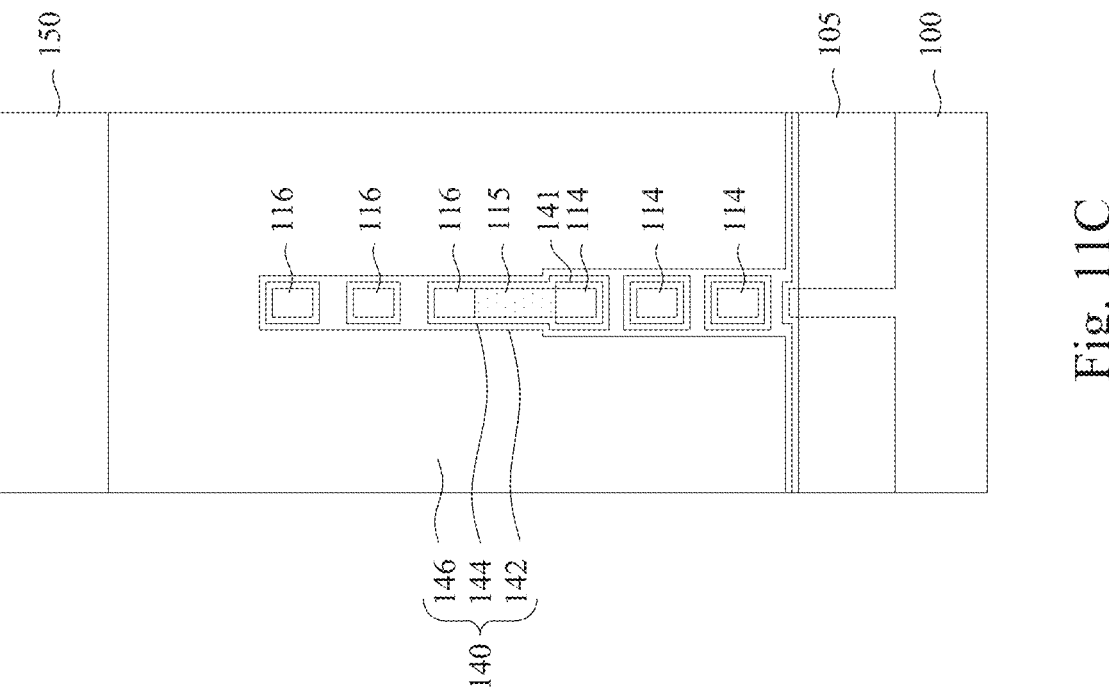

Reference is made to FIGS. 11A to 11D, in which FIG. 11A is a schematic view of a semiconductor device, FIG. 11B is a cross-sectional view along line B-B of FIG. 11A, FIG. 11C is a cross-sectional view along line C-C of FIG. 11A, and FIG. 11D is a cross-sectional view along line D-D of FIG. 11A. An interlayer dielectric (ILD) layer 150 is deposited over the ILD layer 130 and covering the gate structure 140. In some embodiments, material and method of forming the ILD layer 150 may be similar to those of the ILD layer 130.

Figures 12A, 12B:
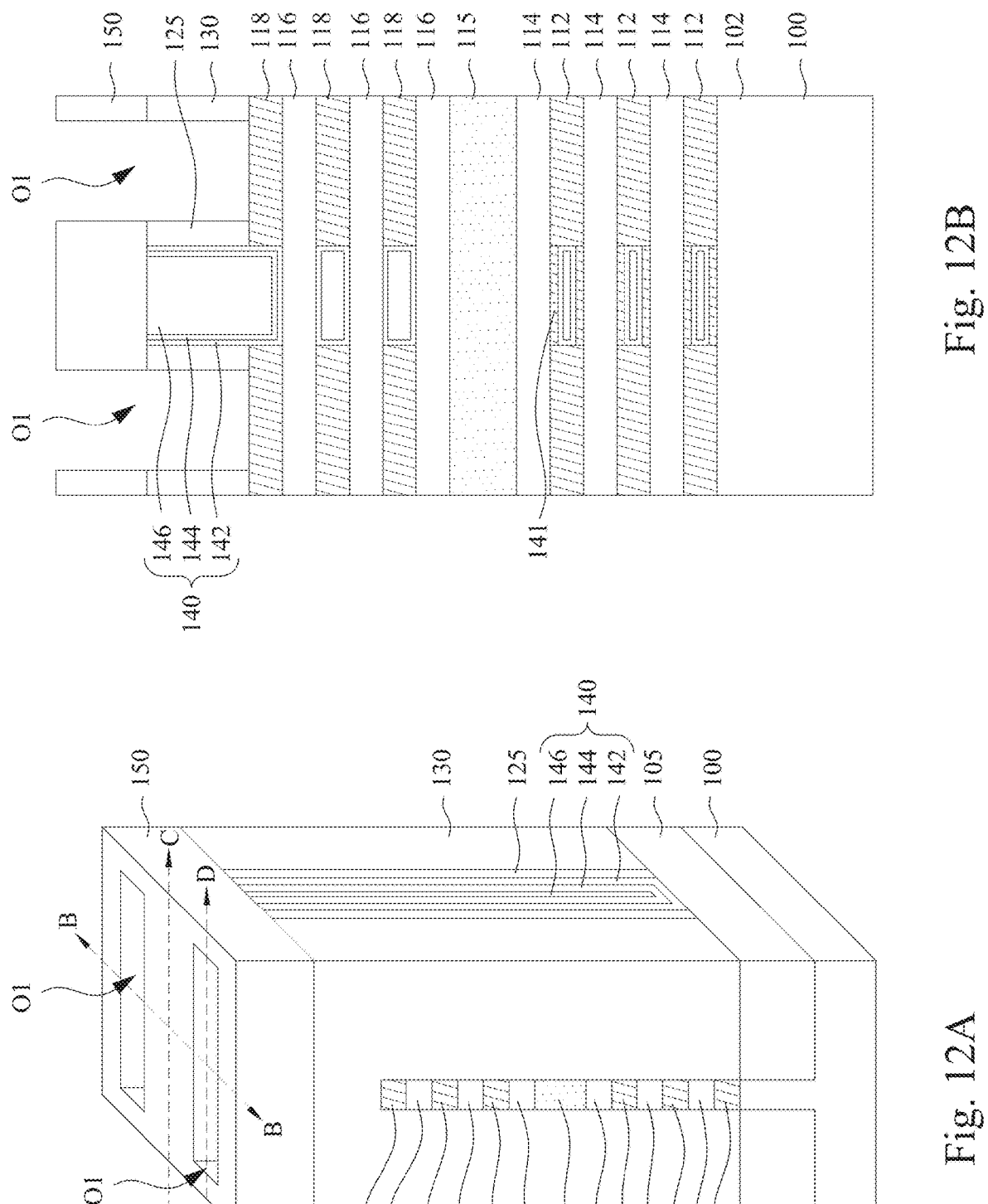
Figure 12D:
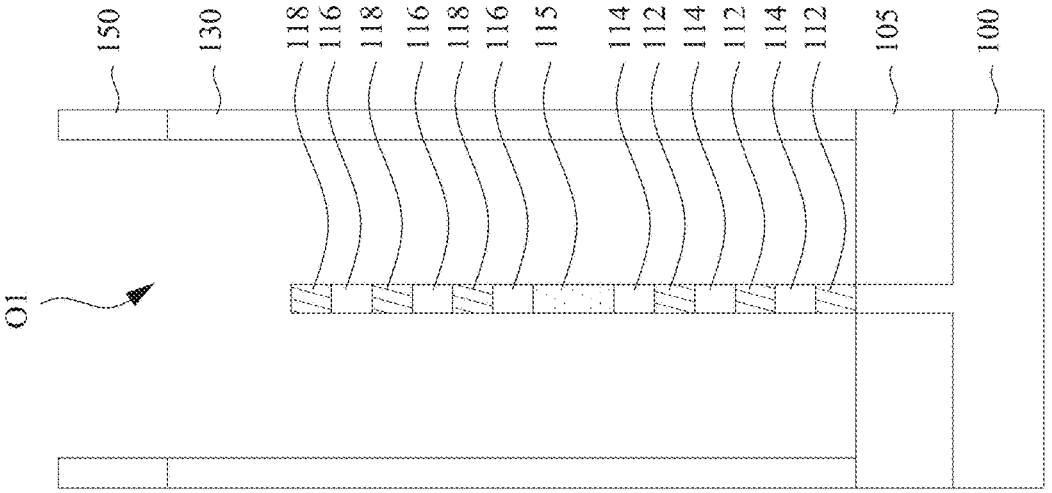
Figure 12C:
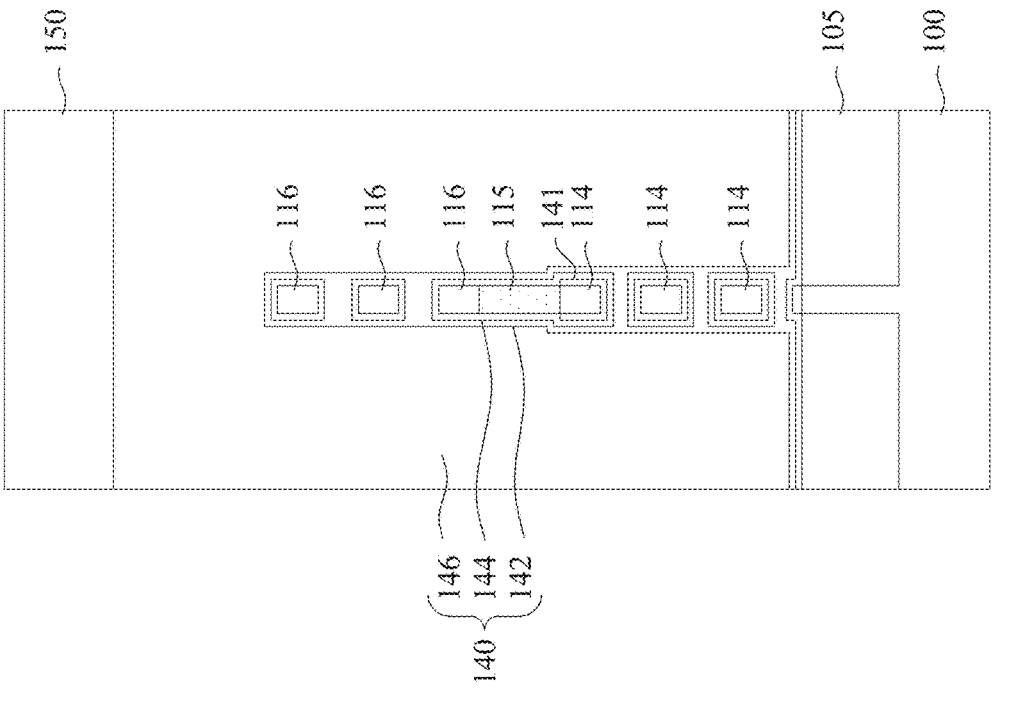

Reference is made to FIGS. 12A to 12D, in which FIG. 12A is a schematic view of a semiconductor device, FIG. 12B is a cross-sectional view along line B-B of FIG. 12A, FIG. 12C is a cross-sectional view along line C-C of FIG. 12A, and FIG. 12D is a cross-sectional view along line D-D of FIG. 12A. Source/drain openings O1 are formed in the ILD layers 130 and 150 to expose portions of the first sacrificial layers 112, the first channel layers 114, the isolation layer 115, the second channel layers 116, and the second sacrificial layers 118 (see FIG. 12D). In some embodiments, the source/drain openings O1 may be formed by using one or more lithography and etching operations.

Figure 13B:
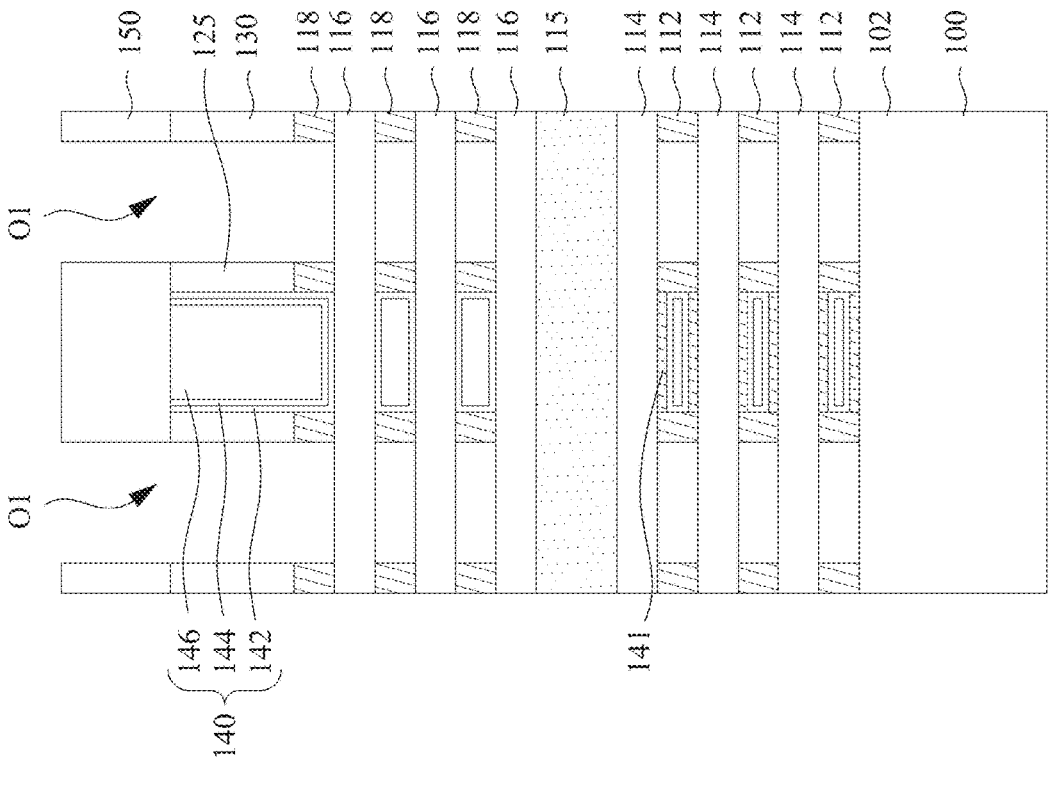
Figure 13A:
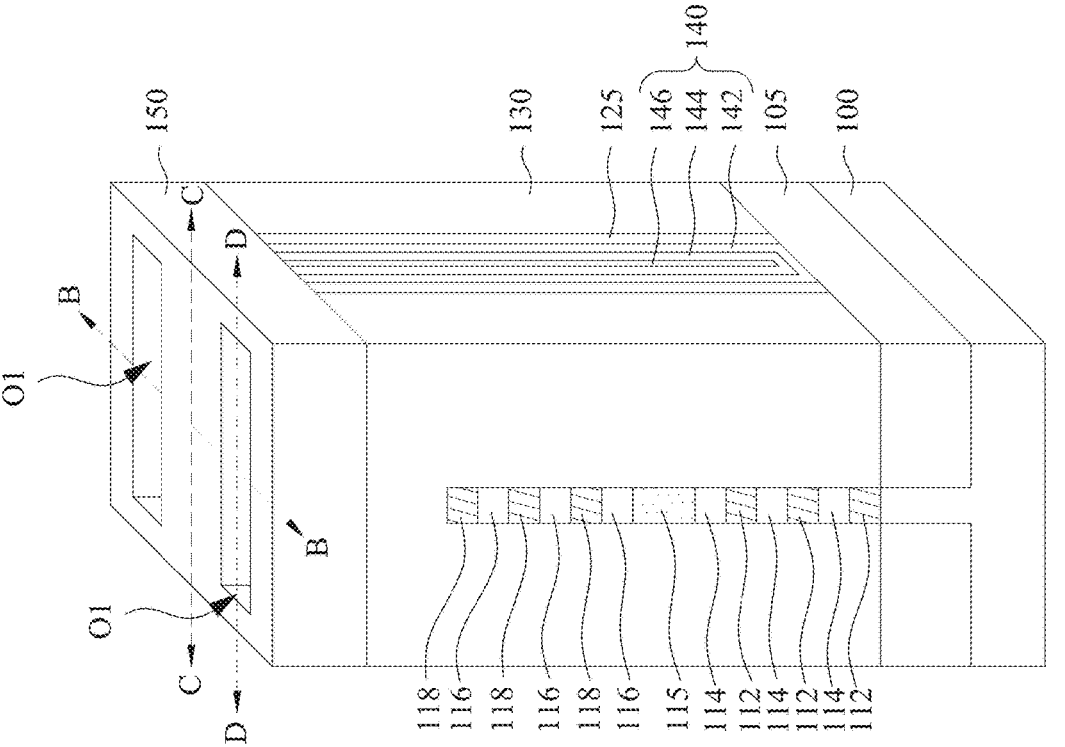
Figure 13D:
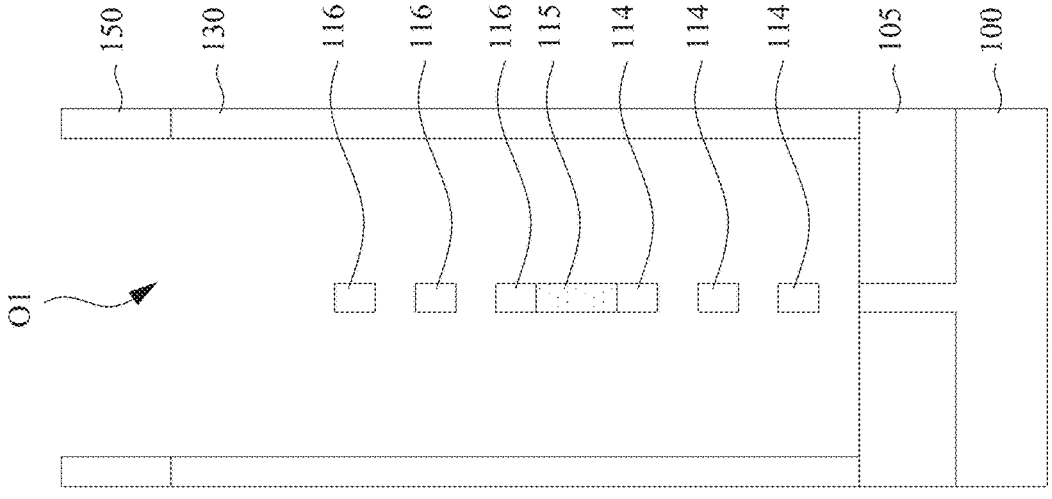
Figure 13C:
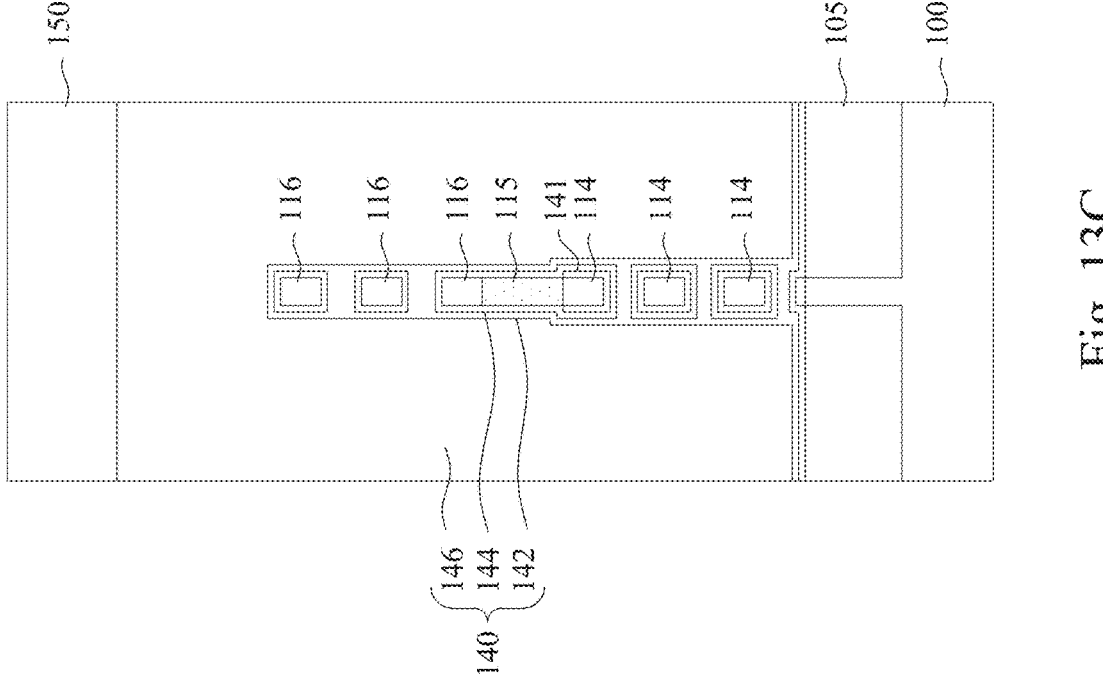

Reference is made to FIGS. 13A to 13D, in which FIG. 13A is a schematic view of a semiconductor device, FIG. 13B is a cross-sectional view along line B-B of FIG. 13A, FIG. 13C is a cross-sectional view along line C-C of FIG. 13A, and FIG. 13D is a cross-sectional view along line D-D of FIG. 13A. Portions of the first and second sacrificial layers 112 and 118 are removed through the source/drain openings O1 an etching process, leaving portions of the first channel layers 114 and second channel layer 116 suspended over the substrate 100 (see FIG. 13D). Because the first and second sacrificial layers 112 are made of a same material, the first and second sacrificial layers 112 and 118 can be removed simultaneously in a single etching process. The first channel layers 114, the second channel layer 116, and the isolation layer 115 may include higher etching resistance to the etching process. In some embodiments, the top surface of the semiconductor strip 102 is exposed after the first and second sacrificial layers 112 and 118 are removed.

The first and second sacrificial layers 112 and 118 may be removed using suitable etching process. For example, the first and second sacrificial layers 112 and 118 can be selectively removed using a wet etchant such as, but not limited to, ammonium hydroxide (NH4OH), tetramethylammonium hydroxide (TMAH), ethylenediamine pyrocatechol (EDP), potassium hydroxide (KOH) solutions, a hydrochloric acid (HCl) solution, or a hot ammonia solution.

After the first and second sacrificial layers 112 and 118 are removed, at least portions of the first channel layers 114 and second channel layer 116 suspended over the substrate 100. For example, as shown in the cross-sectional view of FIG. 13D, at least one of the first channel layers 114 is suspended over the substrate 100 with four sides free from coverage by other material. Similar, at least one of the second channel layers 116 is suspended over the substrate 100 with four sides free from coverage by other material. However, the topmost one of the first channel layers 114 and the bottommost one of the second channel layers 116 remain in contact with the isolation layer 115, because the isolation layer 115 is not removed during the etching process. As a result, only three sides of the topmost first channel layer 114 are free from coverage by other material. Similar, only three sides of the bottommost second channel layer 116 are free from coverage by other material.

Figures 14A, 14B:
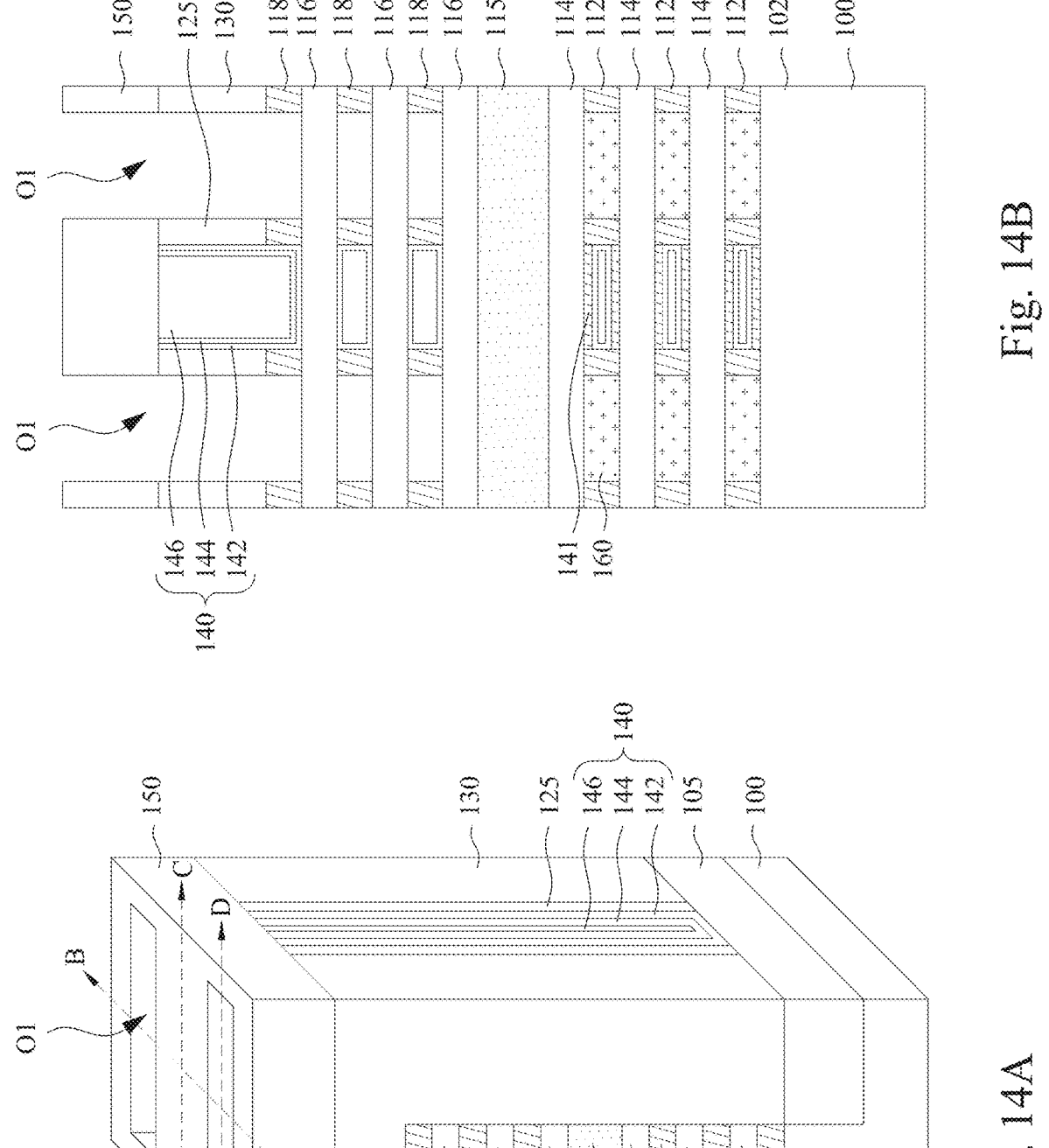
Figure 14D:
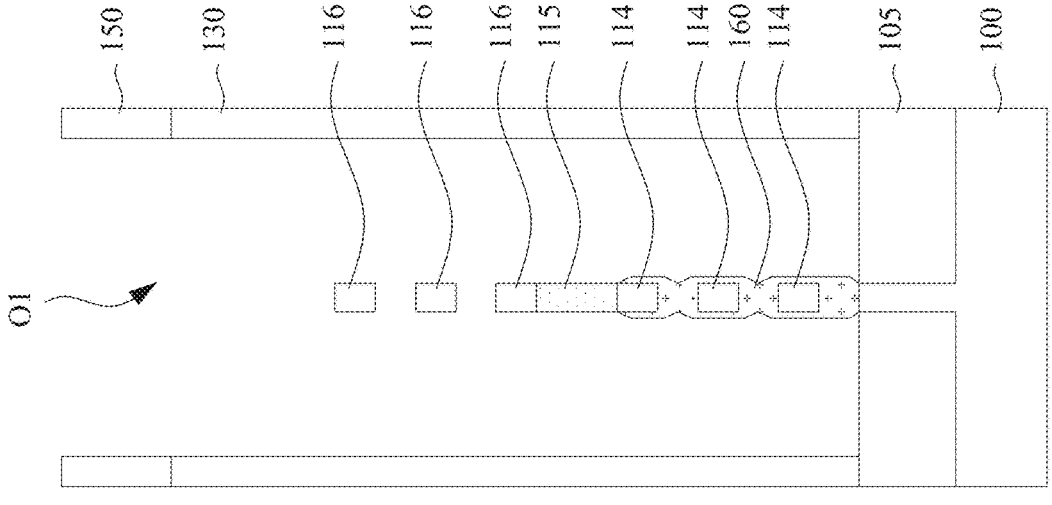
Figure 14C:
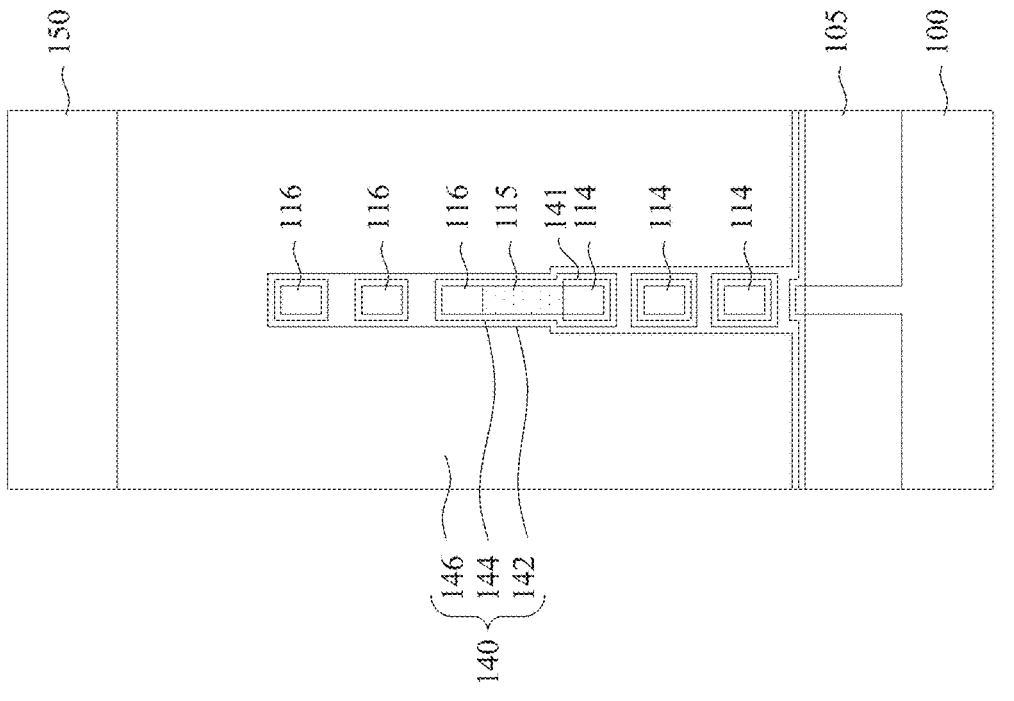

Reference is made to FIGS. 14A to 14D, in which FIG. 14A is a schematic view of a semiconductor device, FIG. 14B is a cross-sectional view along line B-B of FIG. 14A, FIG. 14C is a cross-sectional view along line C-C of FIG. 14A, and FIG. 14D is a cross-sectional view along line D-D of FIG. 14A. Source/drain epitaxy structures 160 are selectively formed over the exposed surfaces of the first channel layers 114 and the semiconductor strip 102. In some embodiments, the source/drain epitaxy structures 160 may include SiGe doped with B for a p-type gate-all-around (GAA) FET. In some embodiments, the source/drain epitaxy structures 160 may wrap around parts of the first channel layers 114. Here, the source/drain epitaxy structures may refer to a source or a drain, individually or collectively dependent upon the context.

In some embodiments, the source/drain epitaxy structures 160 may be formed by selective epitaxial growth (SEG), in which epitaxy material may be selectively formed over a semiconductor surface. Accordingly, the source/drain epitaxy structures 160 may include higher growing rate on the first channel layers 114 and the semiconductor strip 102 than on the isolation layer 115 and the second channel layers 116. In some embodiments, the isolation layer 115 and the second channel layers 116 may be free from coverage by the source/drain epitaxy structures 160.

Figure 15B:
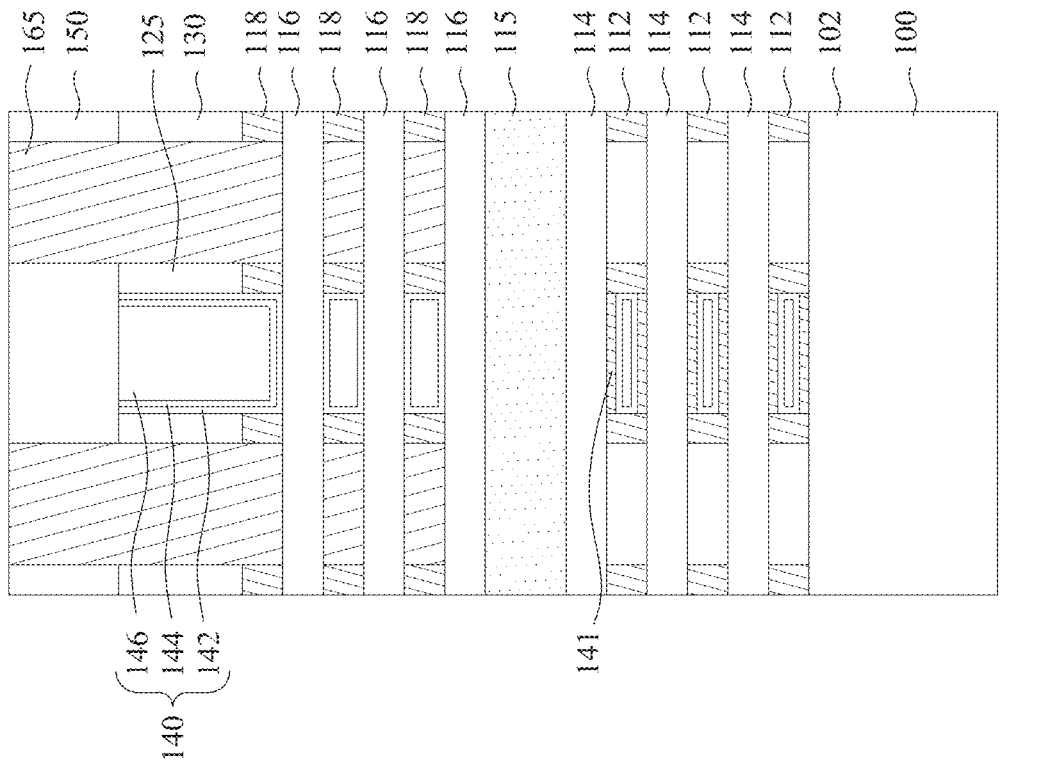
Figure 15A:
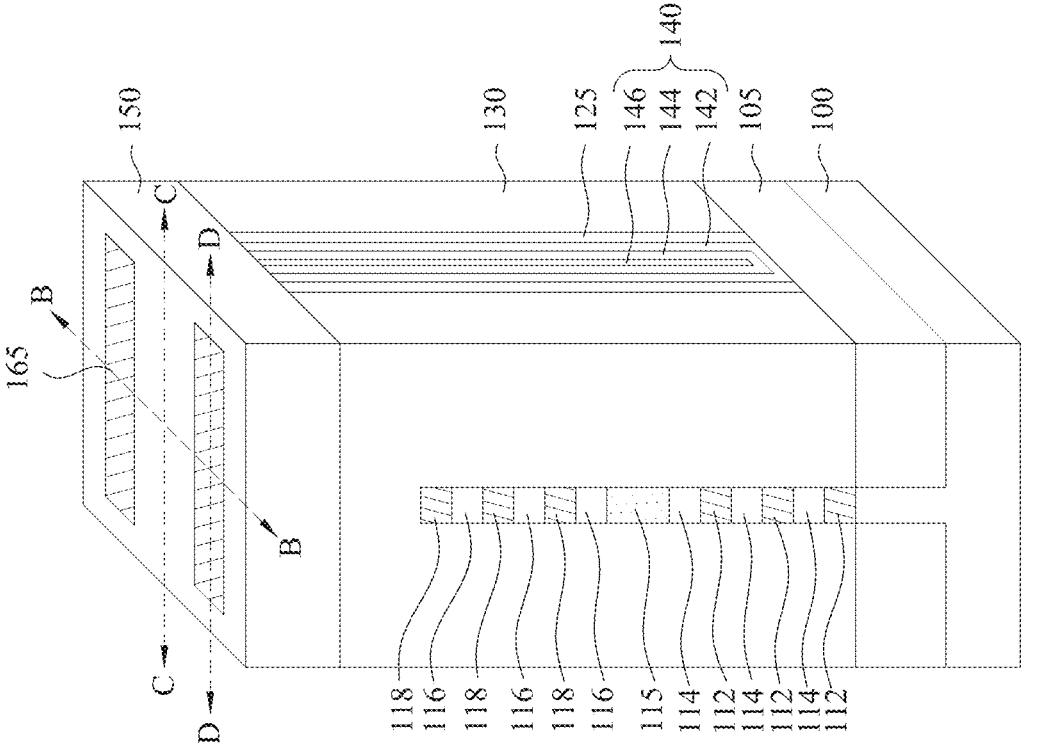
Figures 15C, 15D:
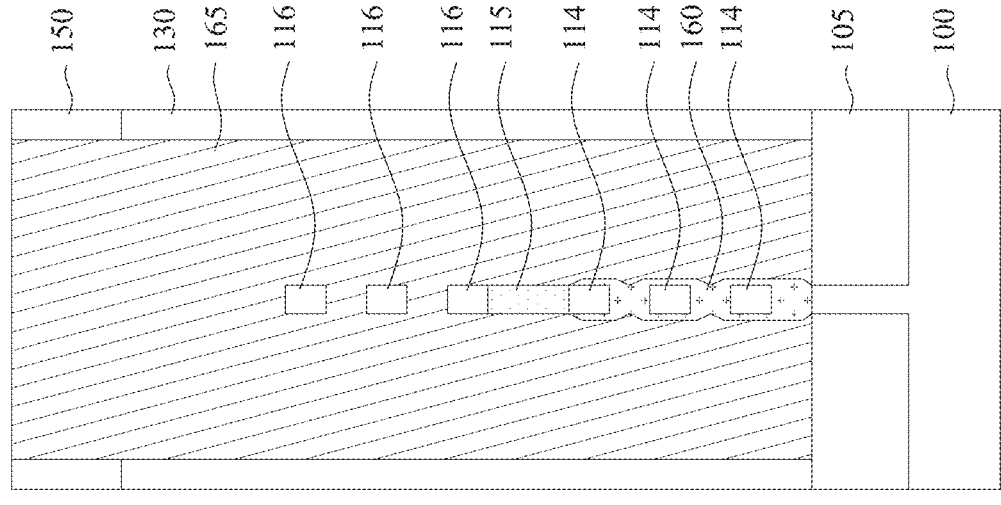

Reference is made to FIGS. 15A to 15D, in which FIG. 15A is a schematic view of a semiconductor device, FIG. 15B is a cross-sectional view along line B-B of FIG. 15A, FIG. 15C is a cross-sectional view along line C-C of FIG. 15A, and FIG. 15D is a cross-sectional view along line D-D of FIG. 15A. Source/drain contacts 165 are formed in the source/drain openings O1 and over the source/drain epitaxy structures 160. In some embodiments, the source/drain contacts 165 may be in contact with the second channel layers 114 and the isolation layer 115, while the source/drain contacts 165 may be separated from the first channel layers 114 and the semiconductor strip 102 through the source/drain epitaxy structures 160.

In some embodiments, the source/drain contacts 165 may be formed by, for example, depositing a conductive material in the source/drain openings O1, and performing a CMP process to remove excess conductive material until top surface of the ILD layer 150 is exposed. In some embodiments, the conductive material includes one or more layers of Co, Ni, W, Ti, Ta, Cu, Al, TiN and TaN, or any other suitable material.

Figure 16B:
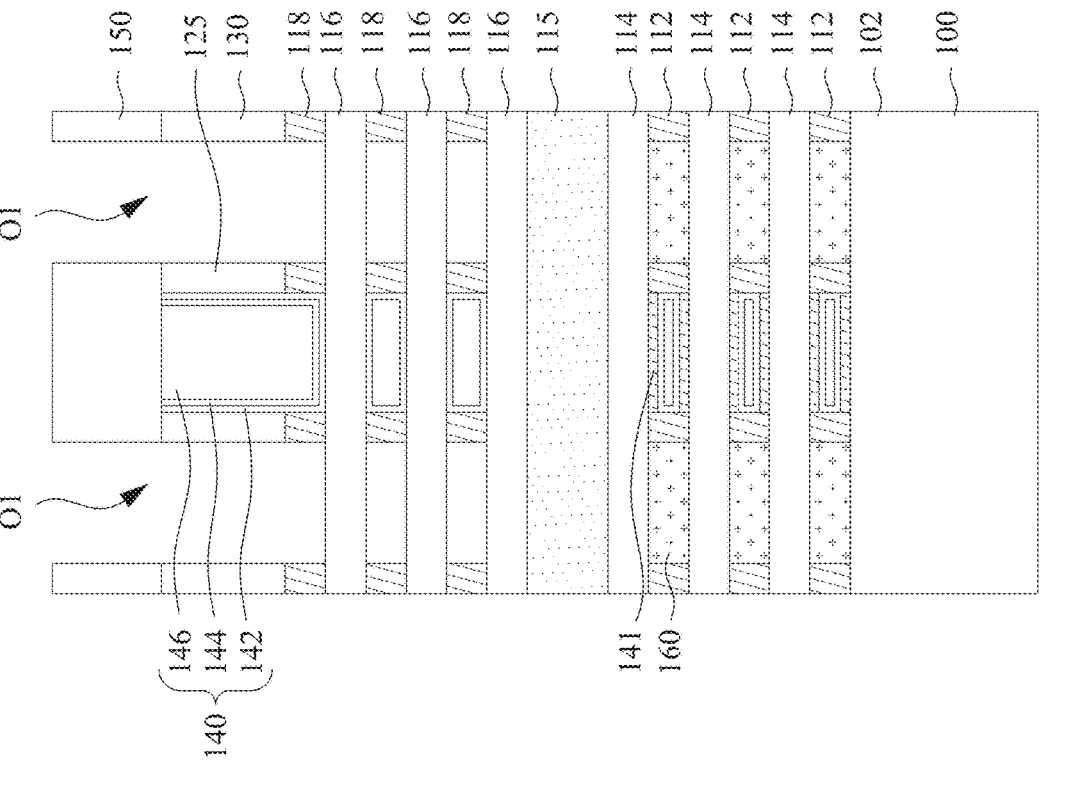
Figure 16A:
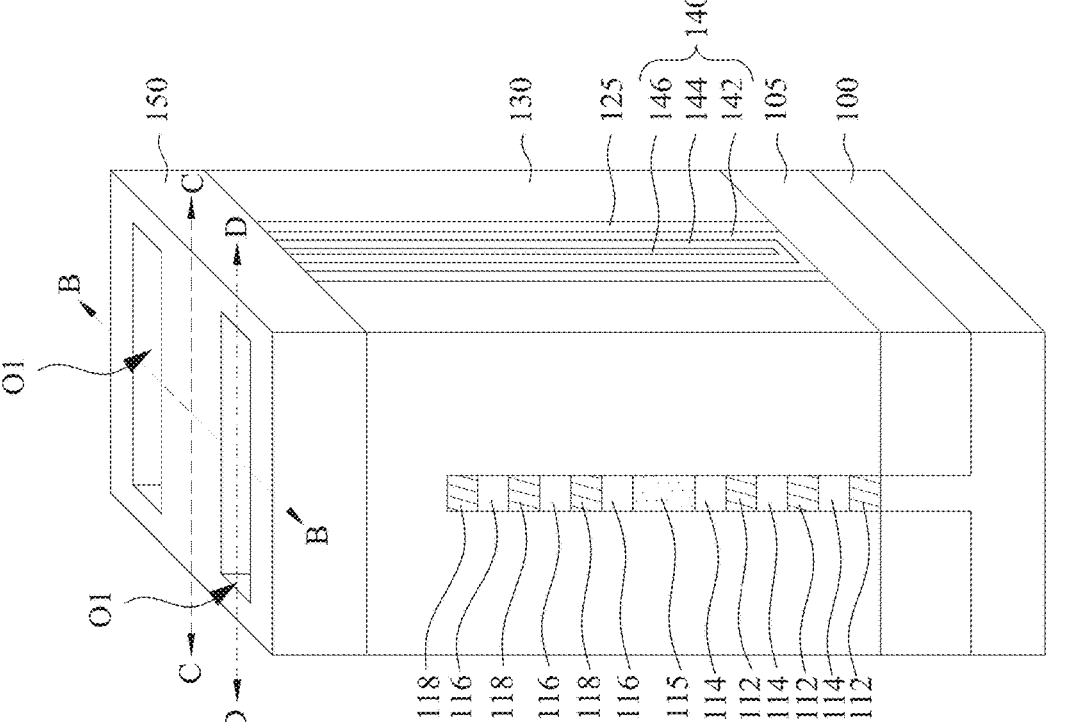
Figure 16D:
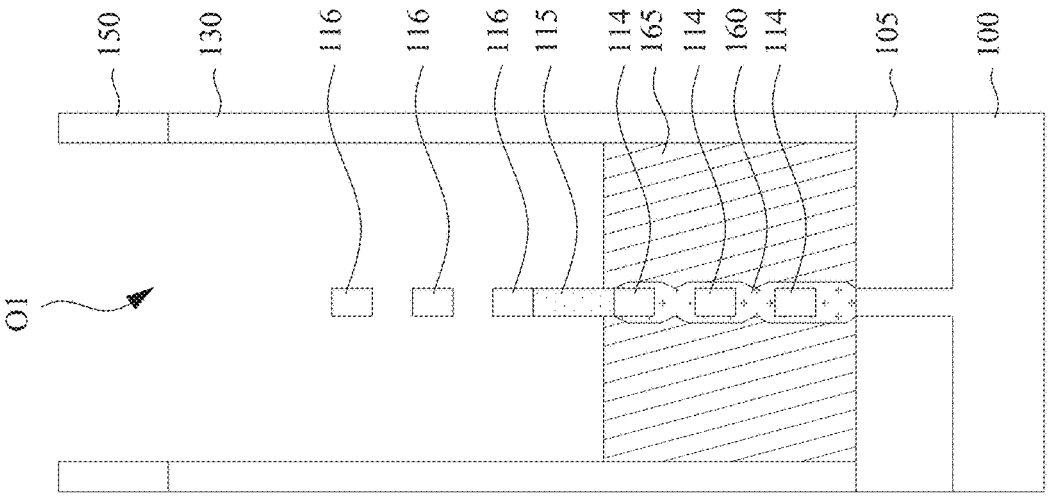
Figure 16C:
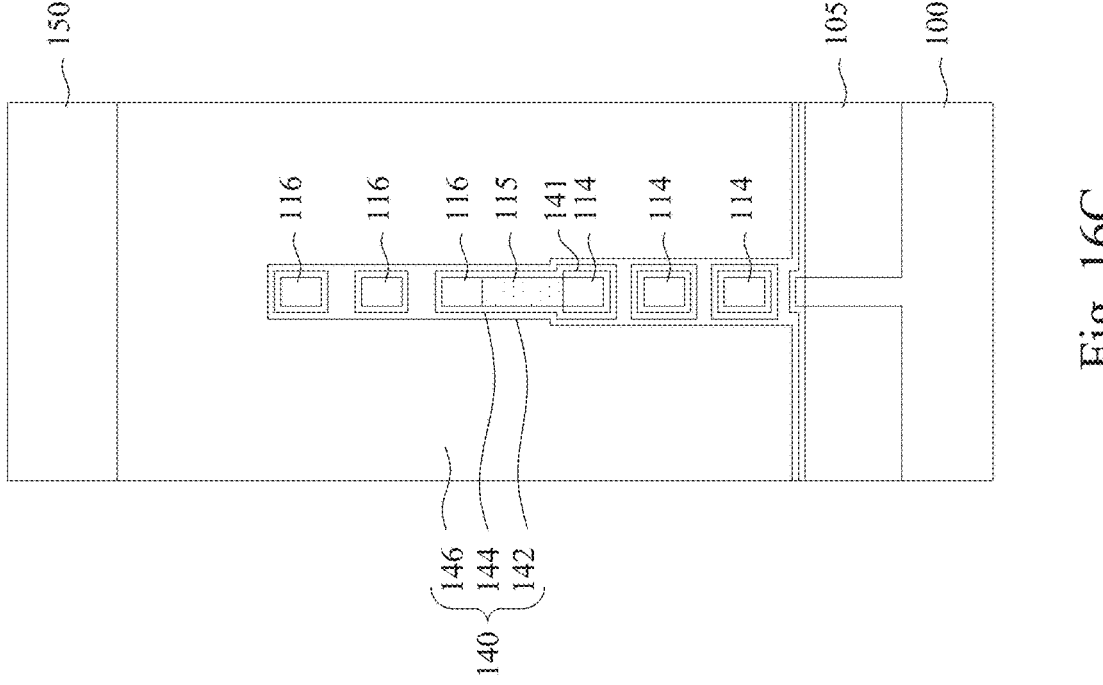

Reference is made to FIGS. 16A to 16D, in which FIG. 16A is a schematic view of a semiconductor device, FIG. 16B is a cross-sectional view along line B-B of FIG. 16A, FIG. 16C is a cross-sectional view along line C-C of FIG. 16A, and FIG. 16D is a cross-sectional view along line D-D of FIG. 16A. An etching back process is performed to the source/drain contacts 165, so as to lower top surfaces of the source/drain contacts 165. In some embodiments, the top surfaces of the source/drain contacts 165 may be lowered to a position below the top surface of the isolation layer 115. In some embodiments, the etched back source/drain contacts 165 may be in contact with lower portions of the isolation layer 115.

Figures 17A, 17B:
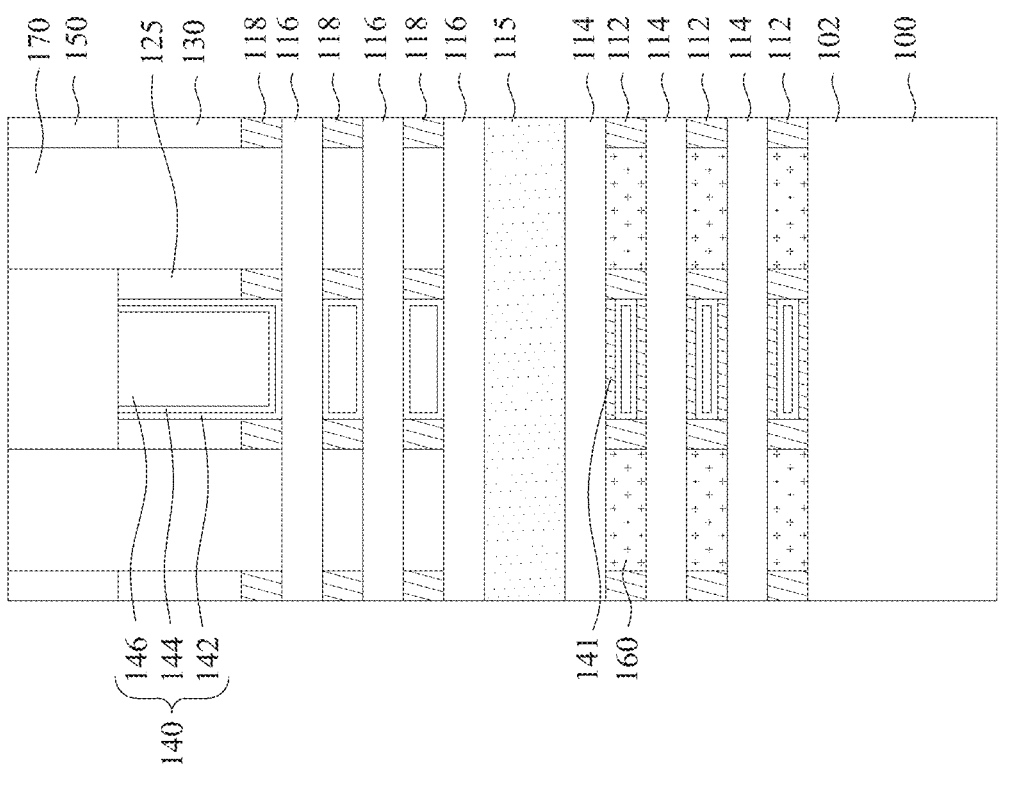
Figure 17D:
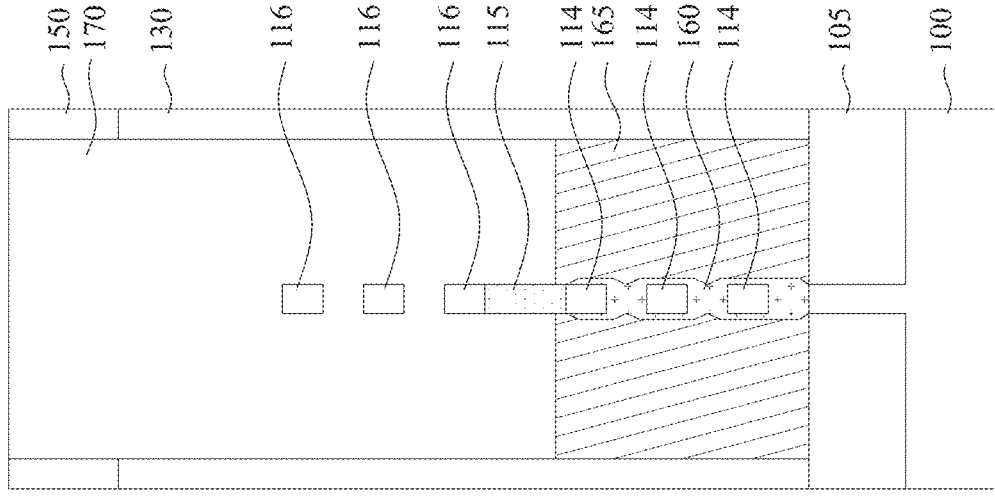
Figure 17C:
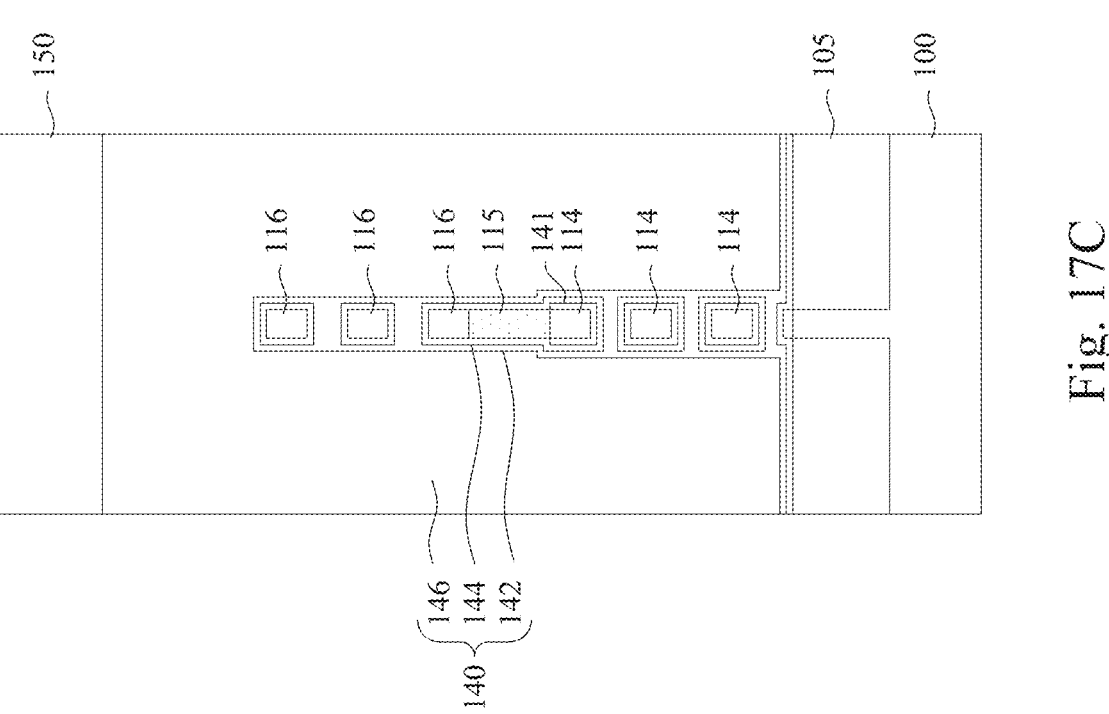

Reference is made to FIGS. 17A to 17D, in which FIG. 17A is a schematic view of a semiconductor device, FIG. 17B is a cross-sectional view along line B-B of FIG. 17A, FIG. 17C is a cross-sectional view along line C-C of FIG. 17A, and FIG. 17D is a cross-sectional view along line D-D of FIG. 17A. A dielectric layer 170 is formed in the source/drain openings O1 and covering the source/drain contacts 165. In some embodiments, the dielectric layer 170 may be in contact with the second channel layers 114 and the isolation layer 115.

In some embodiments, the dielectric layer 170 may be formed by depositing a dielectric material overfilling the source/drain openings O1, and then performing a CMP process until top surface of the ILD layer 150 is exposed. In some embodiments, the dielectric layer 170 may include silicon oxide, silicon nitride, silicon oxynitride, tetraethoxysilane (TEOS), phosphosilicate glass (PSG), borophosphosilicate glass (BPSG), low-k dielectric material, and/or other suitable dielectric materials. Examples of low-k dielectric materials include, but are not limited to, fluorinated silica glass (FSG), carbon doped silicon oxide, amorphous fluorinated carbon, parylene, bis-benzocyclobutenes (BCB), or polyimide. In some embodiments, the dielectric layer 170 can be deposited by CVD, plasma-enhanced CVD (PECVD), atomic layer deposition (ALD), plasma-enhanced ALD (PEALD) or the like, or combinations thereof.

Figure 18B:
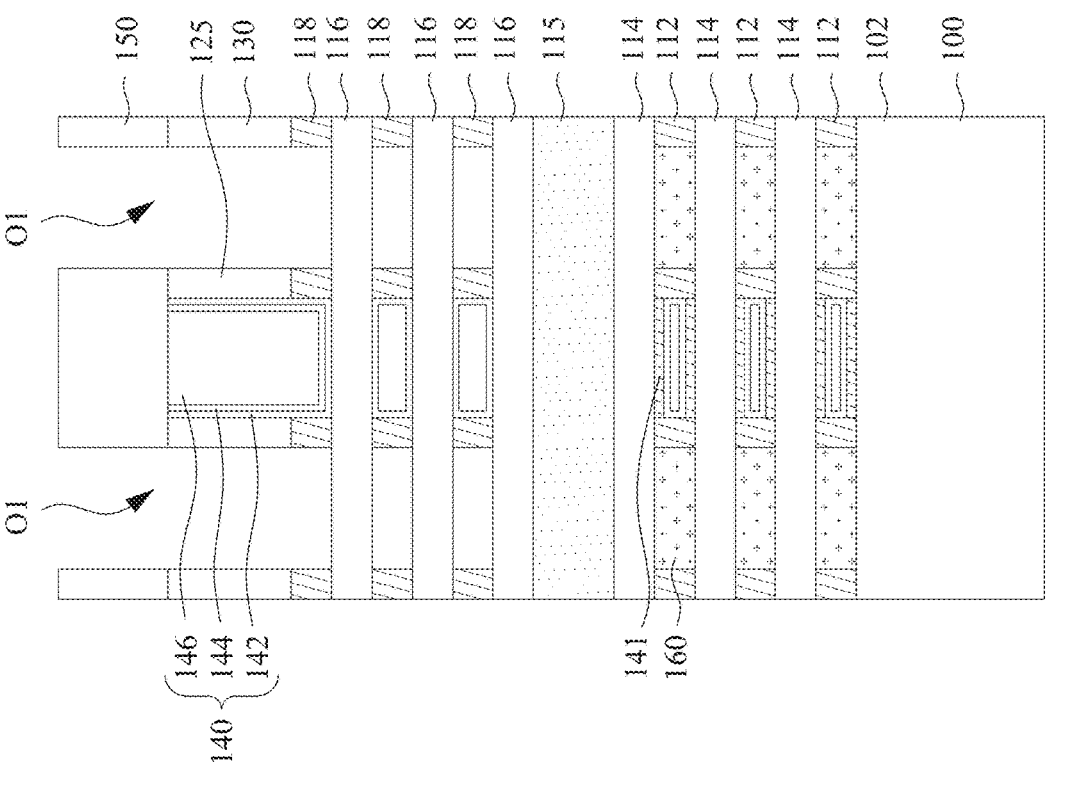
Figure 18A:
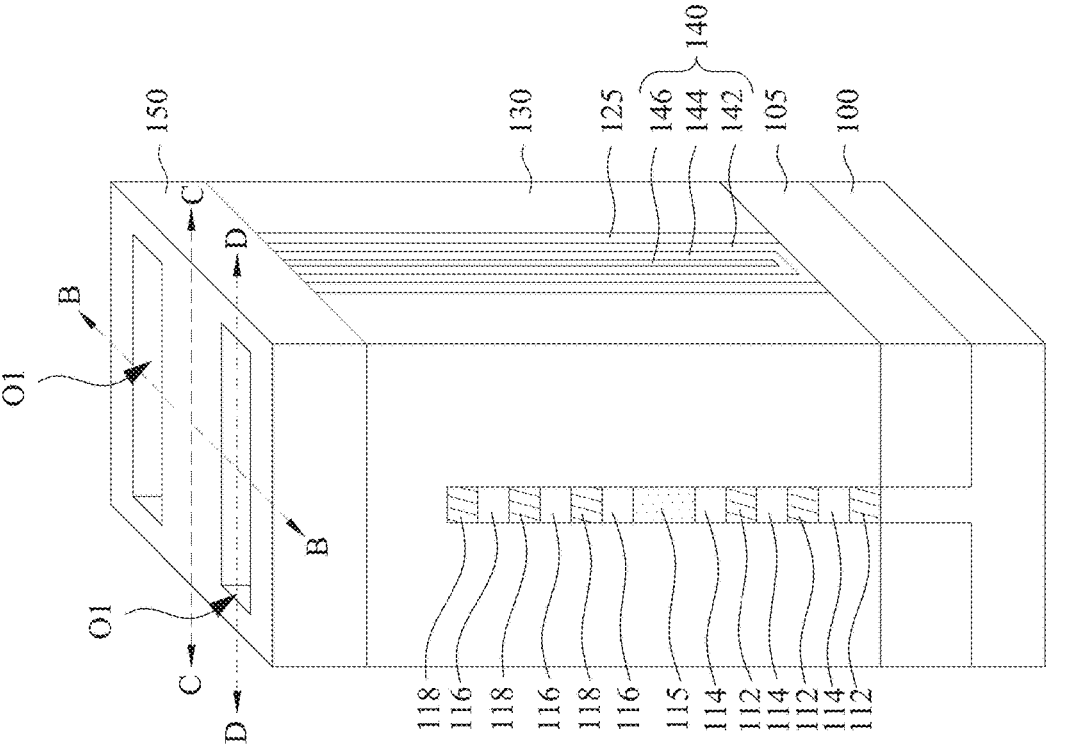
Figure 18D:
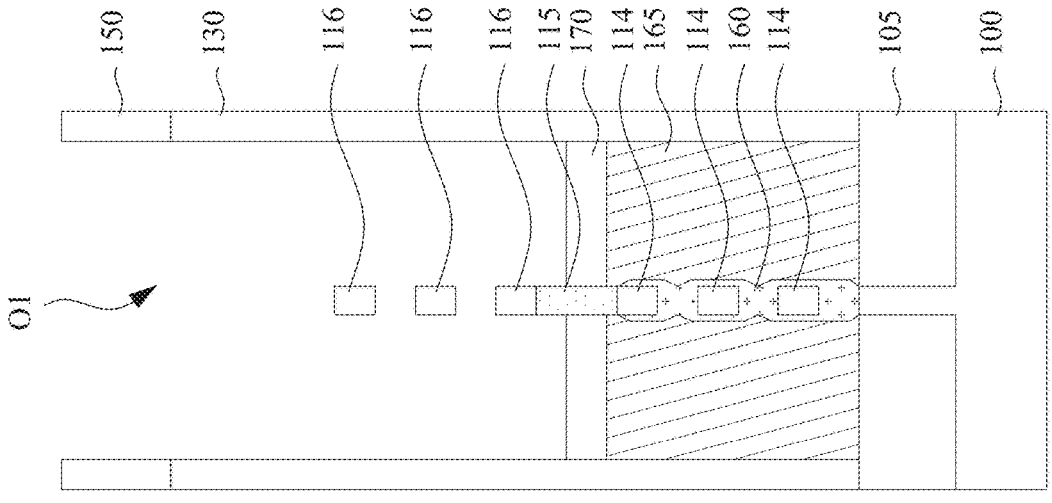
Figure 18C:
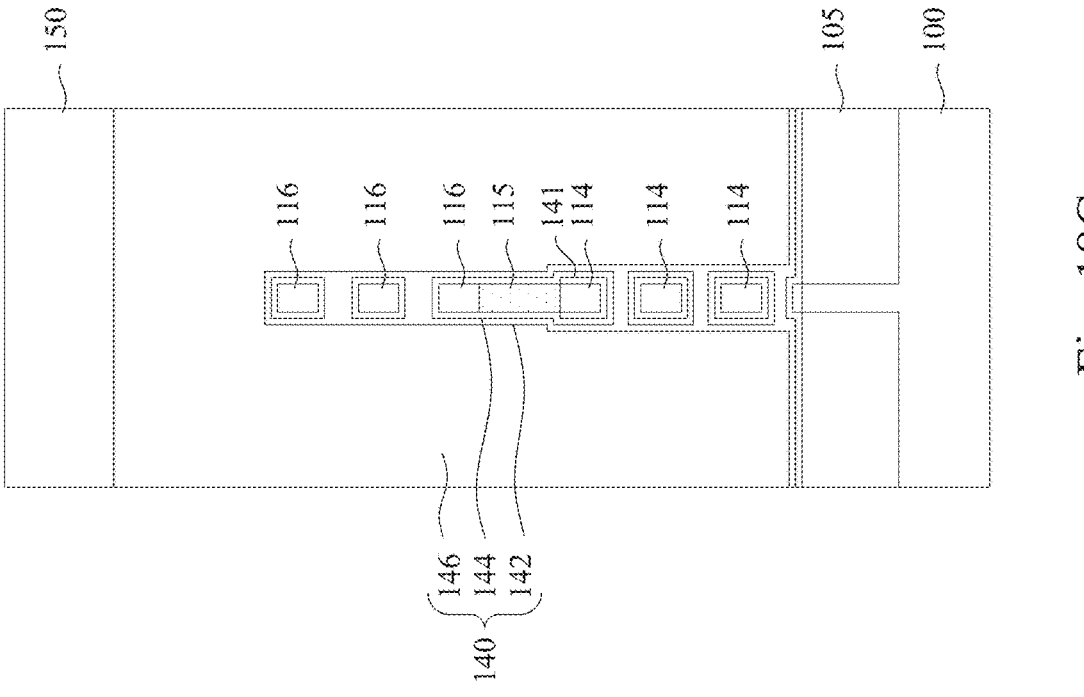

Reference is made to FIGS. 18A to 18D, in which FIG. 18A is a schematic view of a semiconductor device, FIG. 18B is a cross-sectional view along line B-B of FIG. 18A, FIG. 18C is a cross-sectional view along line C-C of FIG. 18A, and FIG. 18D is a cross-sectional view along line D-D of FIG. 18A. An etching back process is performed to the dielectric layer 170, so as to lower top surface of the dielectric layer 170. In some embodiments, the top surface of the dielectric layer 170 may be lowered to a position below the top surface of the isolation layer 115. In some other embodiments, the top surface of the dielectric layer 170 may be lowered to a position substantially level with the top surface of the isolation layer 115. In some embodiments, the dielectric layer 170 and the ILD layer 130 may be formed by a same material, and thus the dielectric layer 170 and the ILD layer 130 can be collectively referred to as an ILD layer.

Figure 19B:
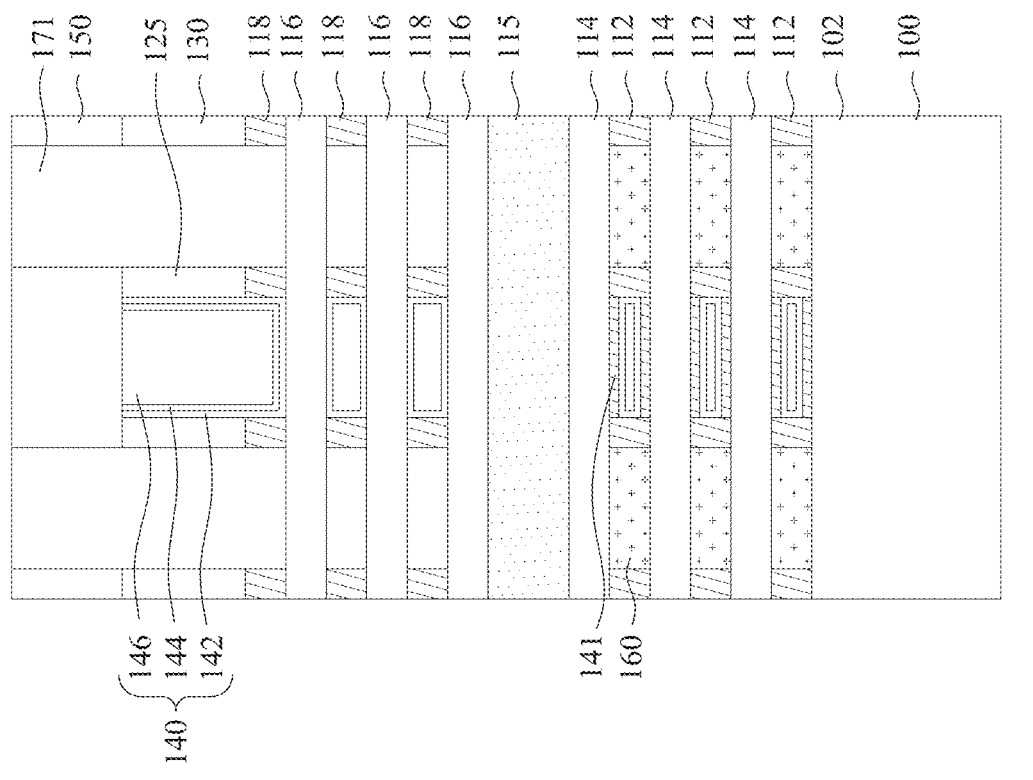
Figure 19A:
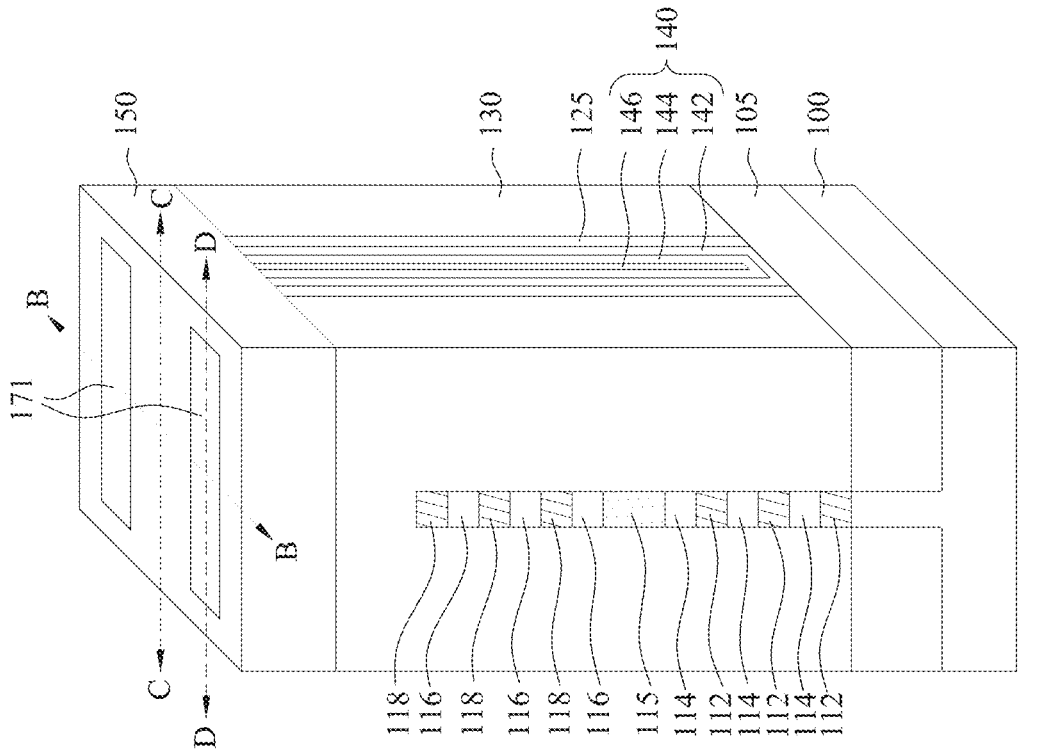
Figure 19D:
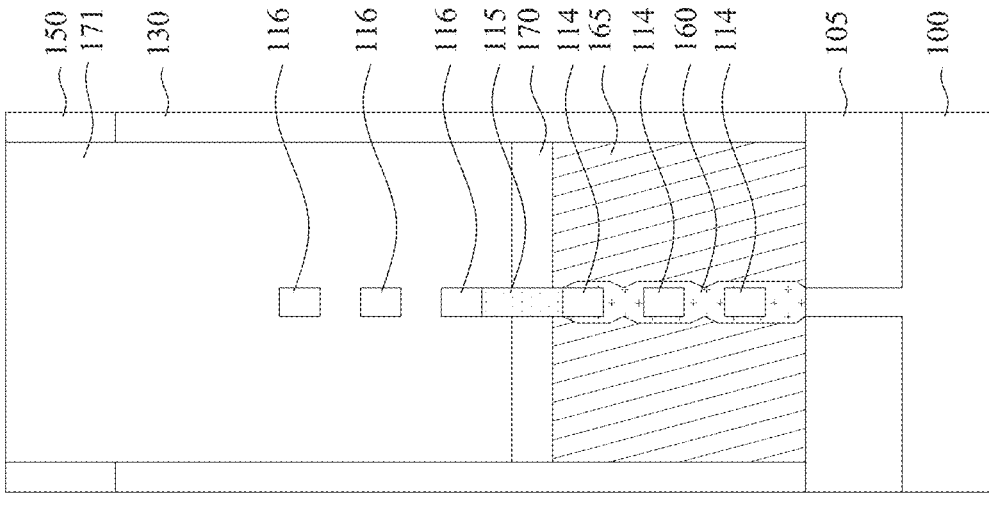
Figure 19D:
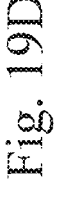
Figure 19C:
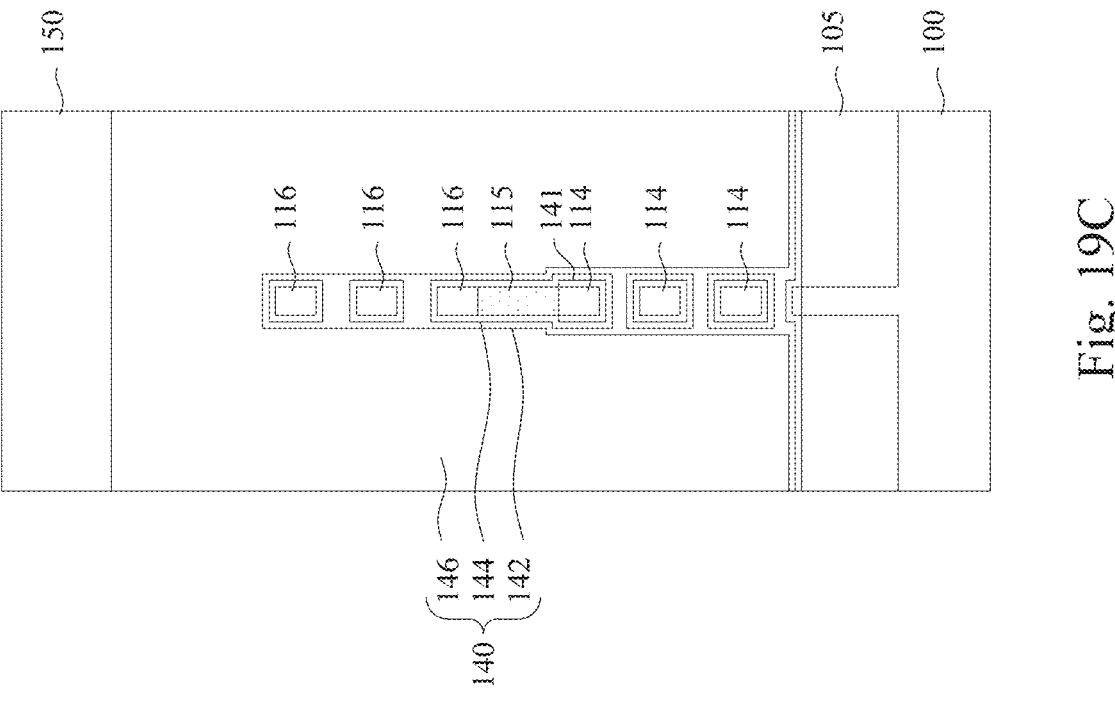

Reference is made to FIGS. 19A to 19D, in which FIG. 19A is a schematic view of a semiconductor device, FIG. 19B is a cross-sectional view along line B-B of FIG. 19A, FIG. 19C is a cross-sectional view along line C-C of FIG. 19A, and FIG. 19D is a cross-sectional view along line D-D of FIG. 19A. A dielectric layer 171 is formed in the source/drain openings O1 and covering the dielectric layer 170. In some embodiments, the dielectric layer 171 may be in contact with the second channel layers 114 and the isolation layer 115. In some embodiments, the dielectric layer 171 may include different material than the dielectric layer 170 to provide etching selectivity.

In some embodiments, the dielectric layer 171 may be formed by depositing a dielectric material overfilling the source/drain openings O1, and then performing a CMP process until top surface of the ILD layer 150 is exposed. In some embodiments, the dielectric layer 171 may include silicon oxide, silicon nitride, silicon oxynitride, tetraethoxysilane (TEOS), phosphosilicate glass (PSG), borophosphosilicate glass (BPSG), low-k dielectric material, and/or other suitable dielectric materials. Examples of low-k dielectric materials include, but are not limited to, fluorinated silica glass (FSG), carbon doped silicon oxide, amorphous fluorinated carbon, parylene, bis-benzocyclobutenes (BCB), or polyimide. In some embodiments, the dielectric layer 171 can be deposited by CVD, plasma-enhanced CVD (PECVD), atomic layer deposition (ALD), plasma-enhanced ALD (PEALD) or the like, or combinations thereof.

Figures 20A, 20B:
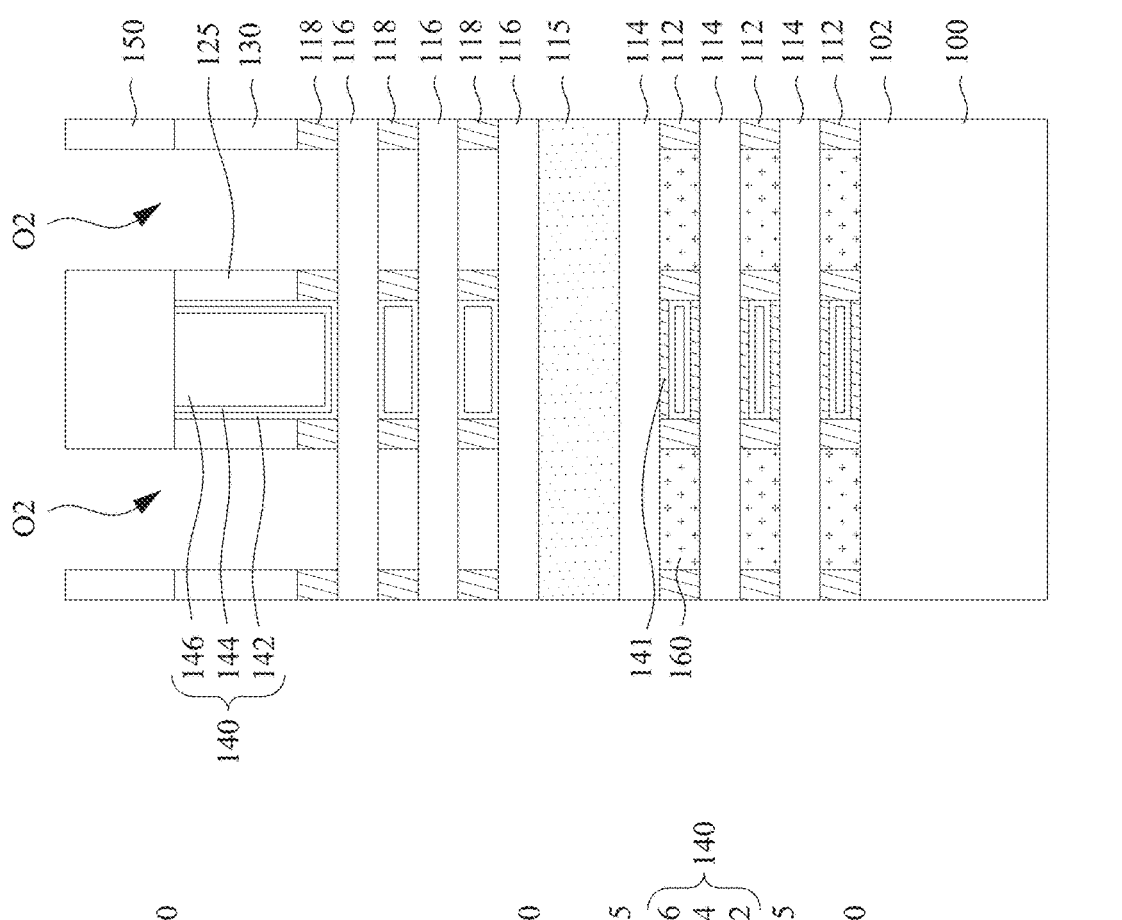
Figure 20D:
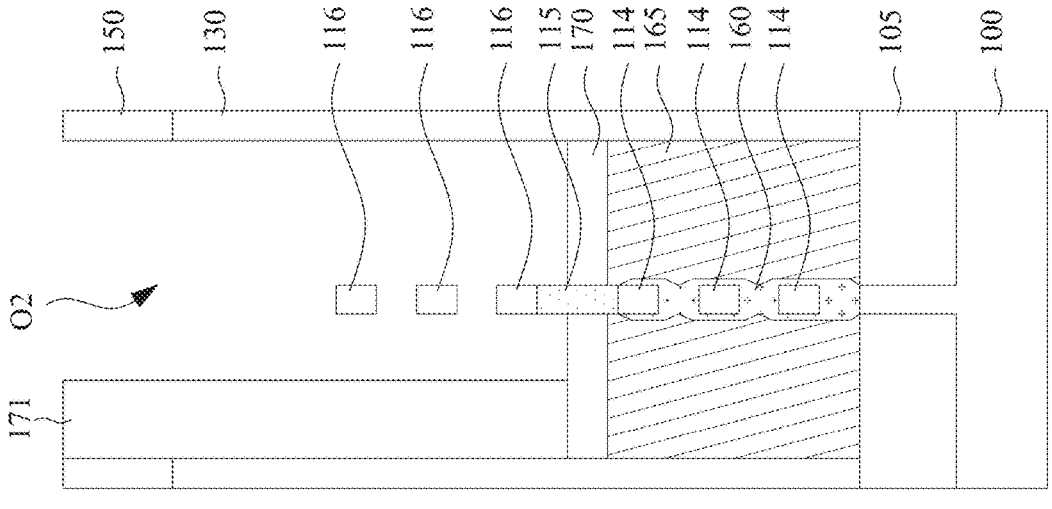
Figure 20D:
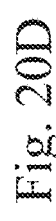
Figure 20C:
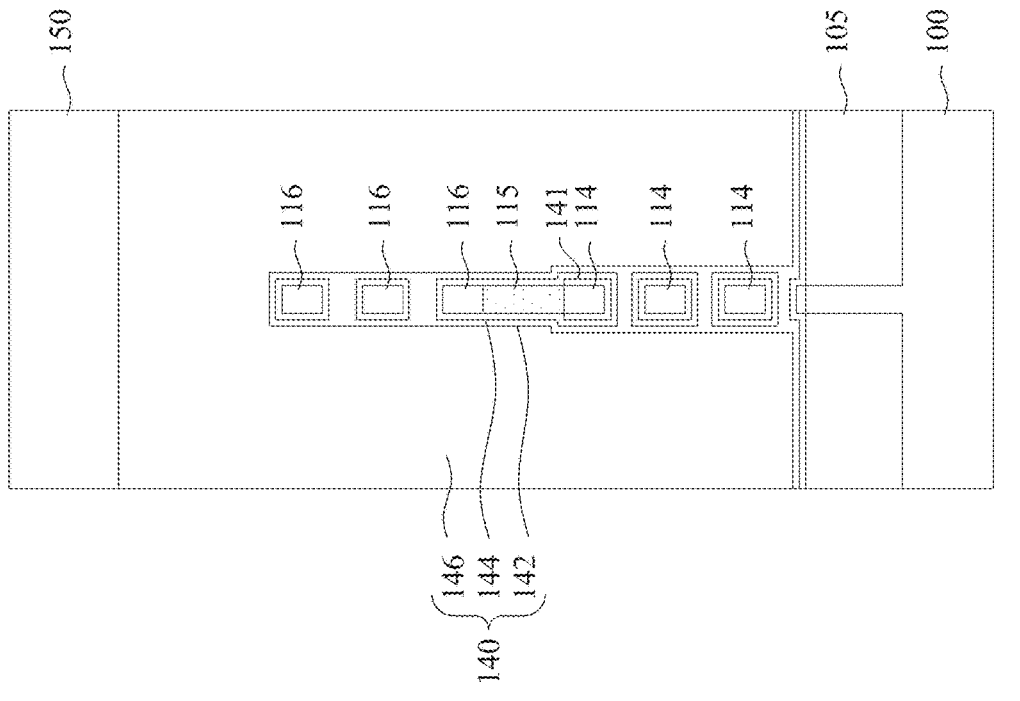

Reference is made to FIGS. 20A to 20D, in which FIG. 20A is a schematic view of a semiconductor device, FIG. 20B is a cross-sectional view along line B-B of FIG. 20A, FIG. 20C is a cross-sectional view along line C-C of FIG. 20A, and FIG. 20D is a cross-sectional view along line D-D of FIG. 20A. The dielectric layer 171 is patterned to form source/drain openings O2 to expose the second channel layers 116. In some embodiments, the source/drain openings O2 may be formed by using one or more lithography and etching operations. In some embodiments, the source/drain openings O2 may also expose top portion of the isolation layer 115. In some embodiments where the dielectric layers 170 and 171 are made of different materials, the etching process may stop at the dielectric layer 170. In some embodiments, the source/drain openings O2 may be narrower than the source/drain openings O1 (see FIG. 12D).

Figures 21A, 21B:
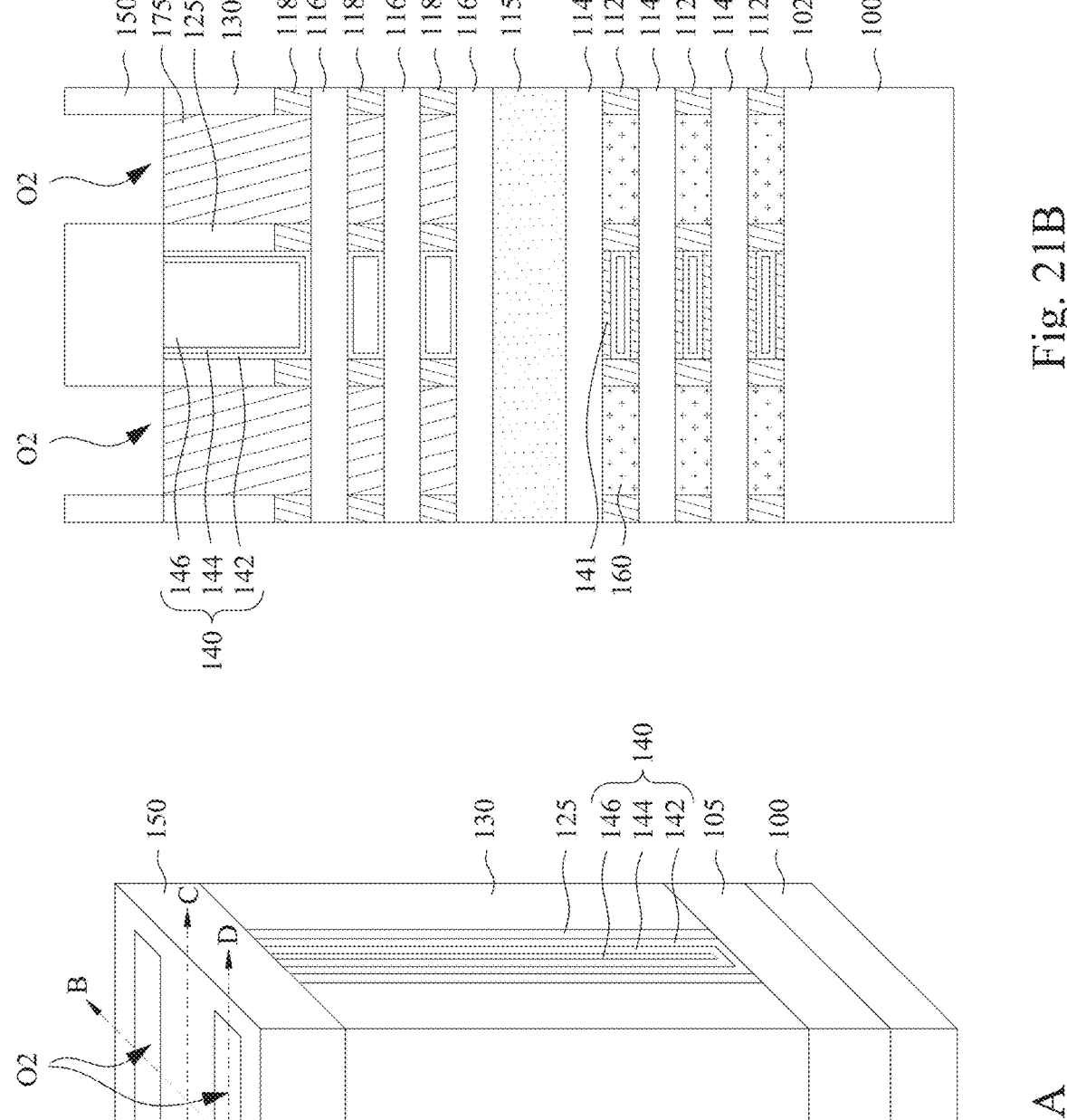
Figure 21D:
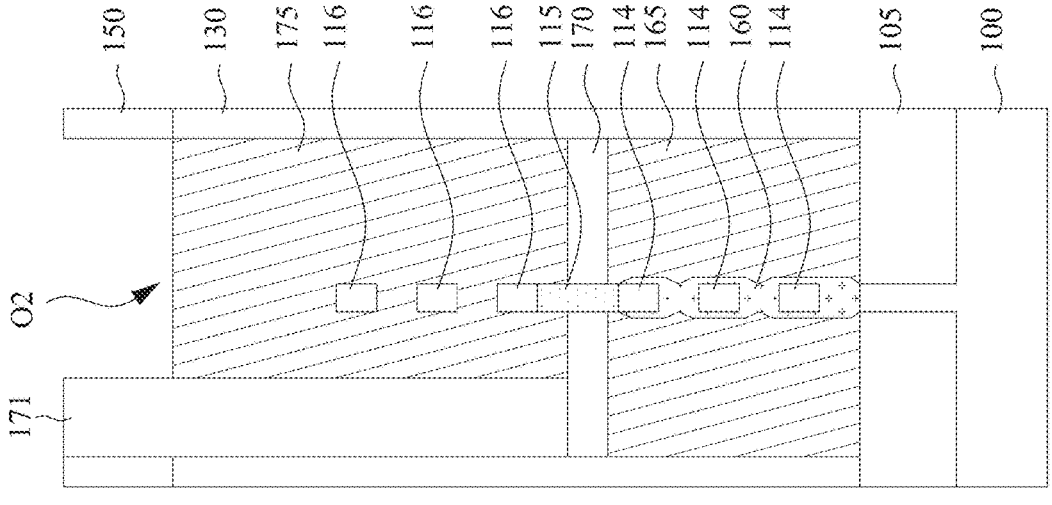
Figure 21C:
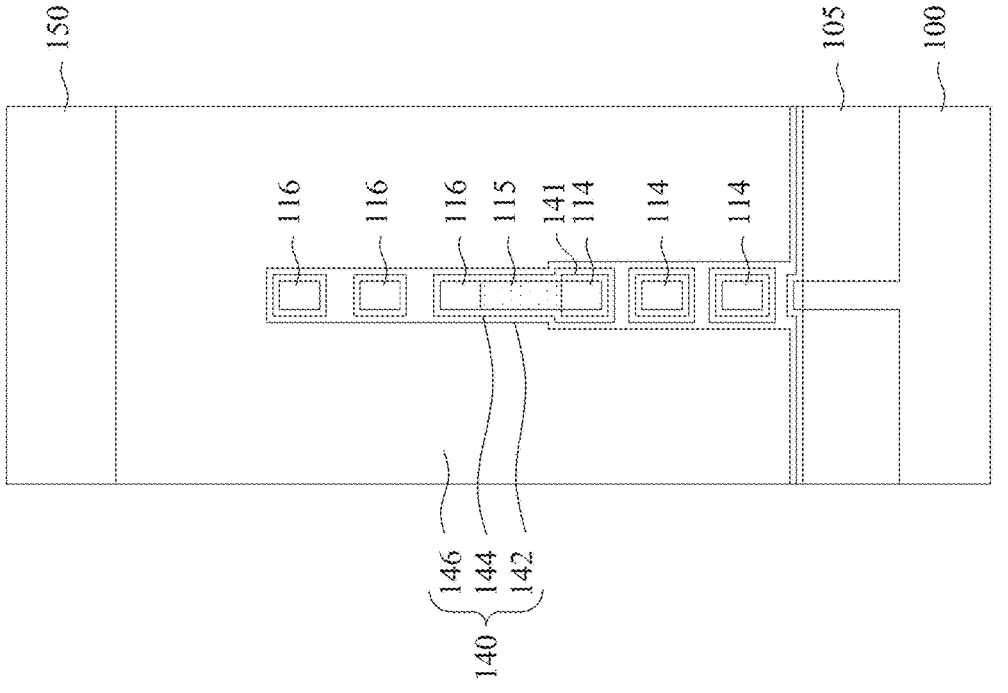

Reference is made to FIGS. 21A to 21D, in which FIG. 21A is a schematic view of a semiconductor device, FIG. 21B is a cross-sectional view along line B-B of FIG. 21A, FIG. 21C is a cross-sectional view along line C-C of FIG. 21A, and FIG. 21D is a cross-sectional view along line D-D of FIG. 21A. Source/drain contacts 175 are formed in the source/drain openings O2 and over the dielectric layer 170. In some embodiments, the source/drain contacts 175 may be in contact with the second channel layers 114 and the isolation layer 115. In greater details, the source/drain contacts 175 may wrap around parts of the second channel layers 114.

In some embodiments, the source/drain contacts 175 may be formed by, for example, depositing a conductive material in the source/drain openings O2, and performing a CMP process to remove excess conductive material until top surface of the ILD layer 150 is exposed. Afterwards, an etching back process is performed to the source/drain contacts 175 to lower top surfaces of the source/drain contacts 175 to a position below the top surface of the ILD layer 150. In some embodiments, the conductive material includes one or more layers of Co, Ni, W, Ti, Ta, Cu, Al, TiN and TaN, or any other suitable material.

Figure 22B:
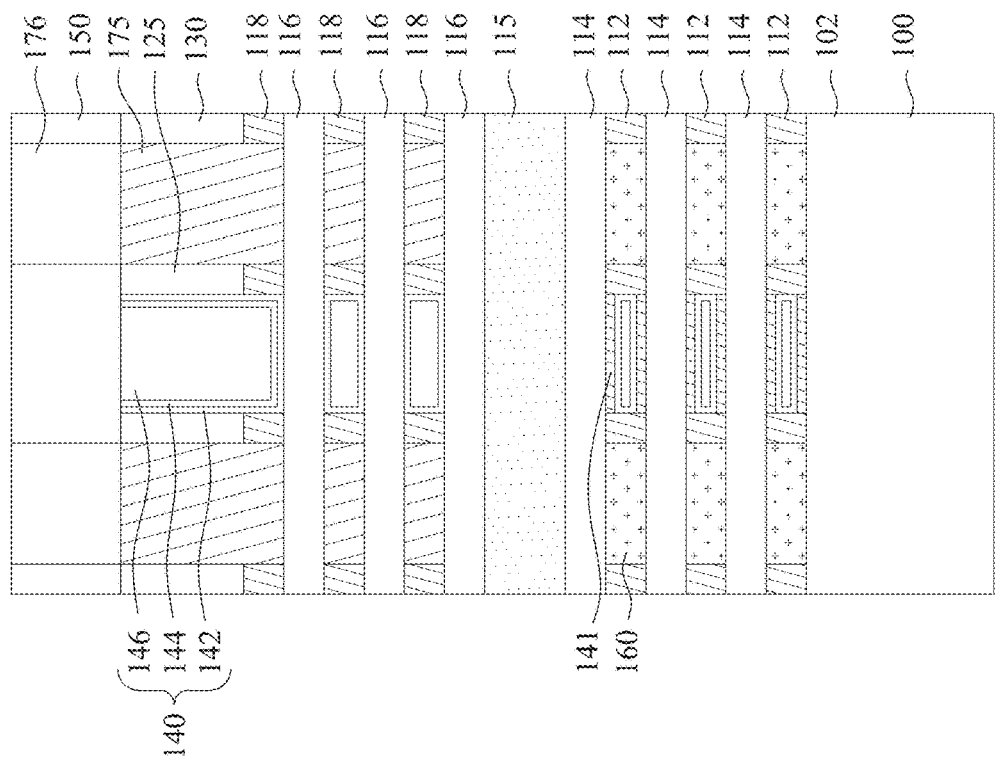
Figure 22A:
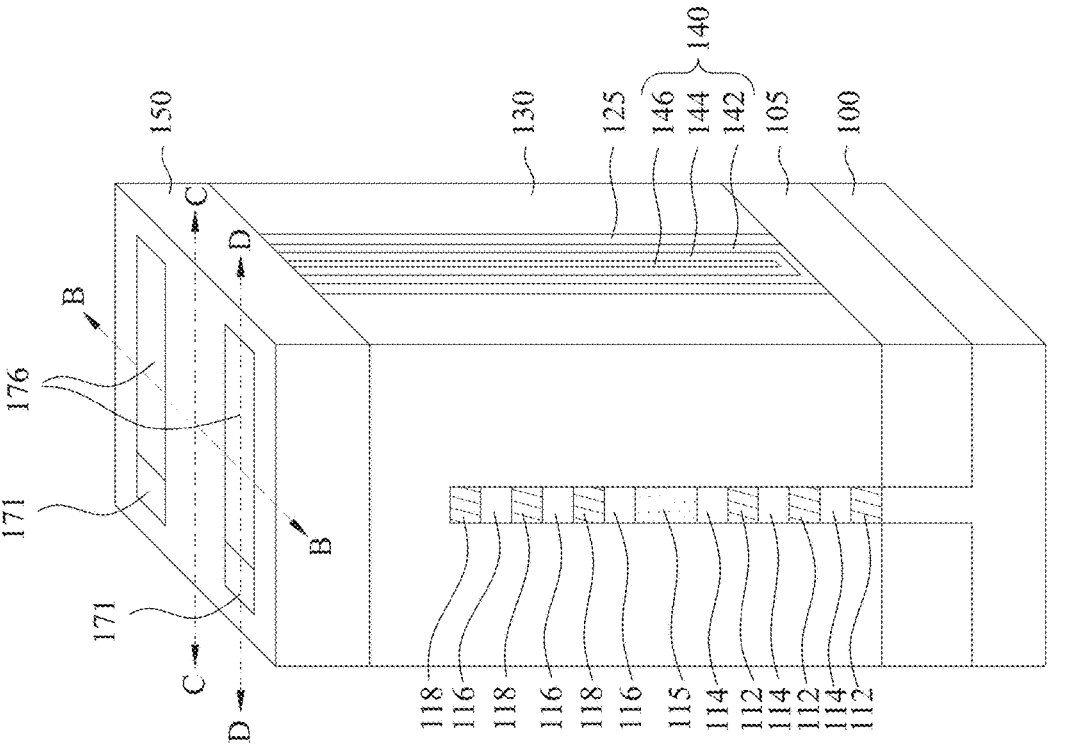
Figure 22D:
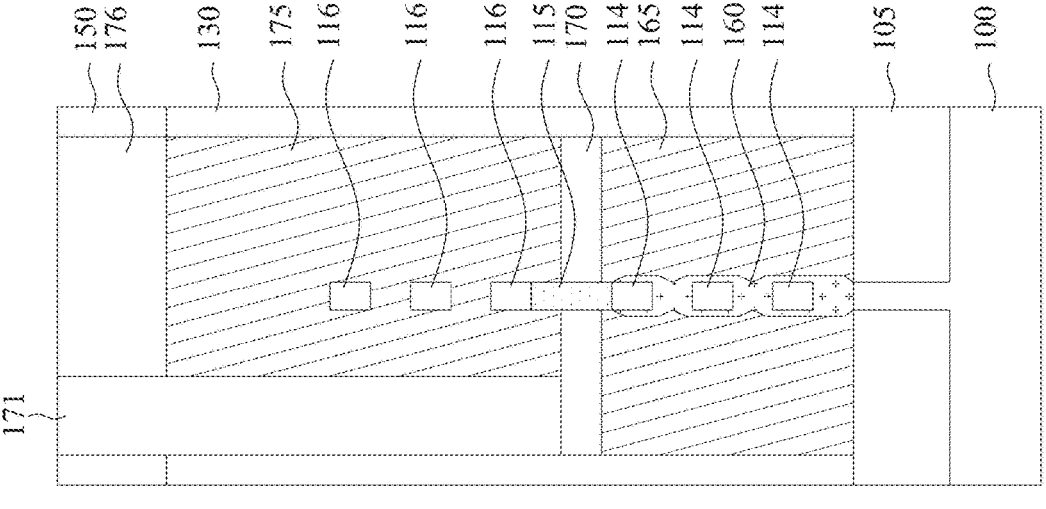
Figure 22C:
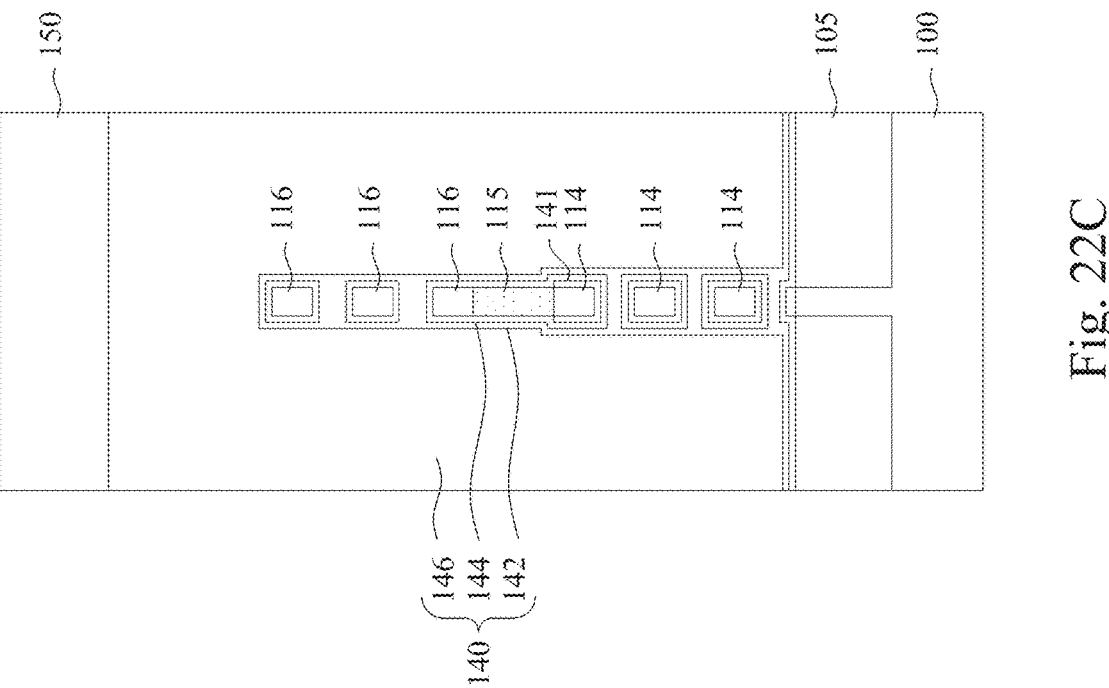

Reference is made to FIGS. 22A to 22D, in which FIG. 22A is a schematic view of a semiconductor device, FIG. 22B is a cross-sectional view along line B-B of FIG. 22A, FIG. 22C is a cross-sectional view along line C-C of FIG. 22A, and FIG. 22D is a cross-sectional view along line D-D of FIG. 22A. A dielectric layer 176 is formed in the source/drain openings O2 and covering the source/drain contacts 175. In some embodiments, the dielectric layer 176 may be formed by depositing a dielectric material overfilling the source/drain openings O2, and then performing a CMP process until top surface of the ILD layer 150 is exposed. In some embodiments, the dielectric layer 176 may include silicon oxide, silicon nitride, silicon oxynitride, tetraethoxysilane (TEOS), phosphosilicate glass (PSG), borophosphosilicate glass (BPSG), low-k dielectric material, and/or other suitable dielectric materials. Examples of low-k dielectric materials include, but are not limited to, fluorinated silica glass (FSG), carbon doped silicon oxide, amorphous fluorinated carbon, parylene, bis-benzocyclobutenes (BCB), or polyimide. In some embodiments, the dielectric layer 176 can be deposited by CVD, plasma-enhanced CVD (PECVD), atomic layer deposition (ALD), plasma-enhanced ALD (PEALD) or the like, or combinations thereof.

Figures 23A, 23B:
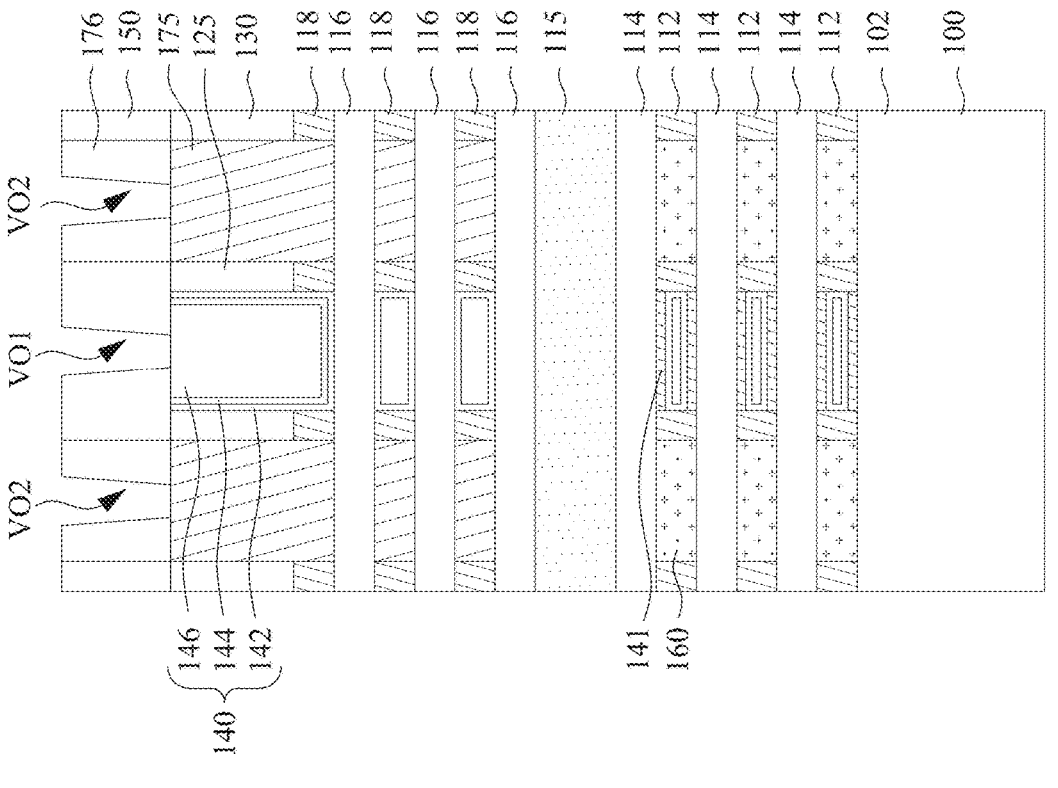
Figure 23D:
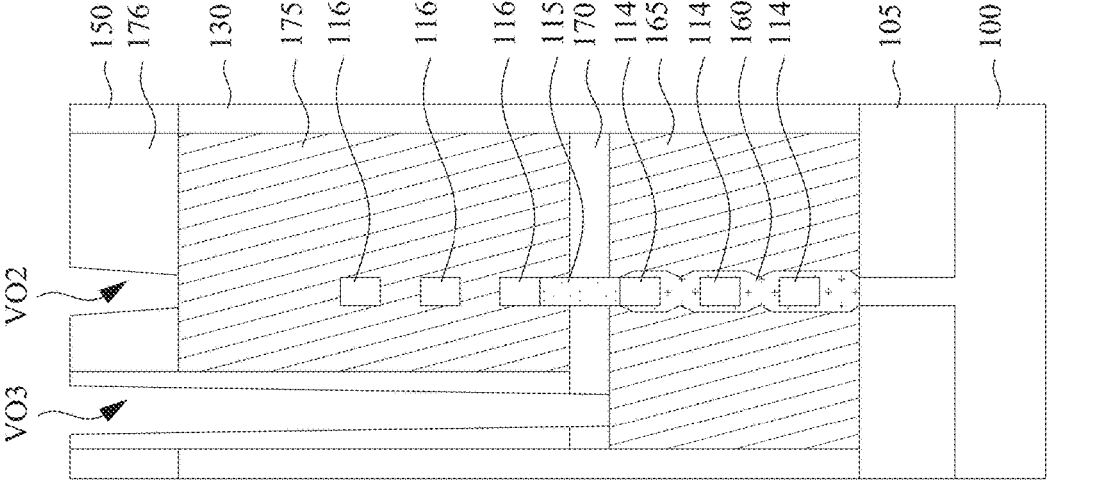
Figure 23C:
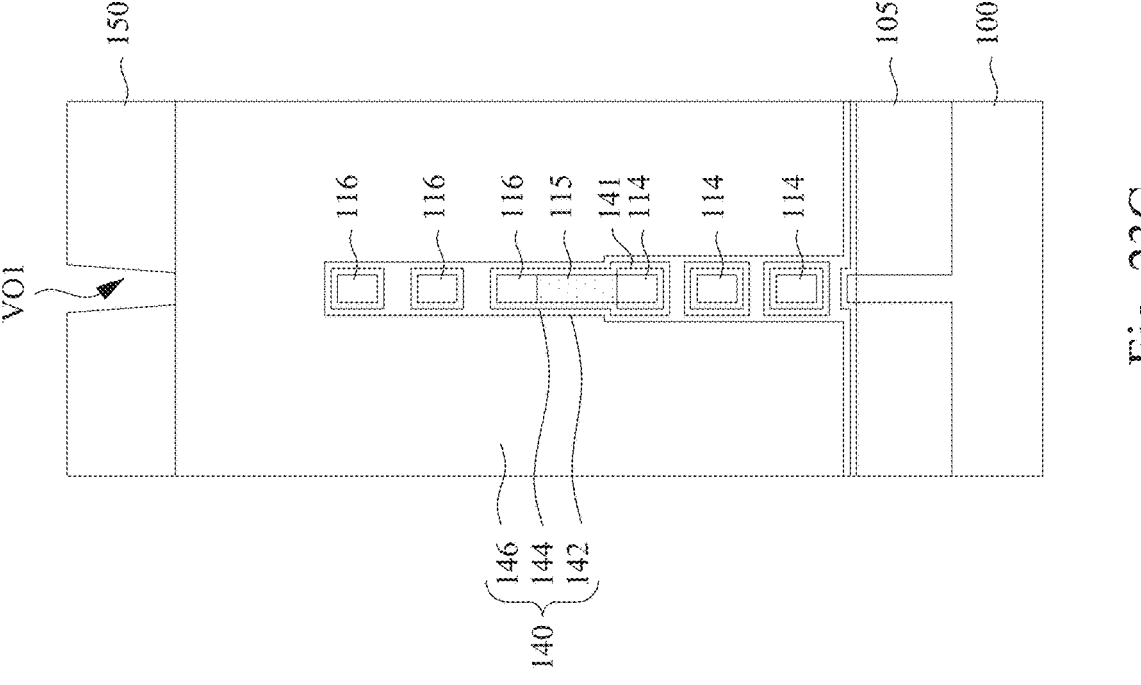

Reference is made to FIGS. 23A to 23D, in which FIG. 23A is a schematic view of a semiconductor device, FIG. 23B is a cross-sectional view along line B-B of FIG. 23A, FIG. 23C is a cross-sectional view along line C-C of FIG. 23A, and FIG. 23D is a cross-sectional view along line D-D of FIG. 23A. Via openings VO1, VO2, VO3 are formed. In greater details, the via opening VO1 is formed in the ILD layer 150 and exposing the gate structure 140. The via openings VO2 are formed in the ILD layer 150 and exposing the source/drain contacts 175. The via openings VO3 are formed in the ILD layer 150 and the dielectric layers 170 and 171, and exposing the source/drain contacts 165. In some embodiments, the Via openings VO1, VO2, VO3 may be formed by suitable lithography and etching operations.

Figures 24A, 24B:
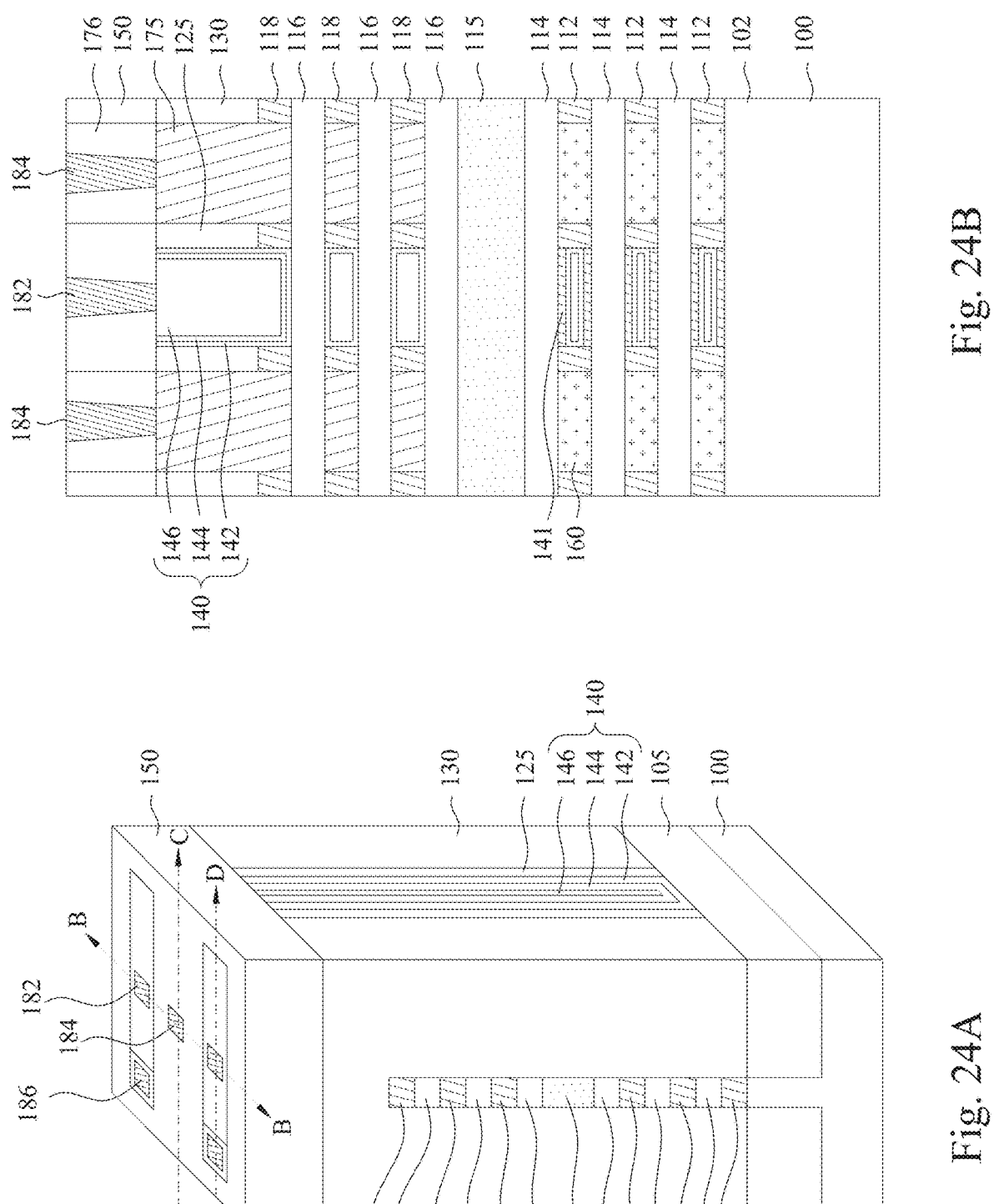
Figure 24D:
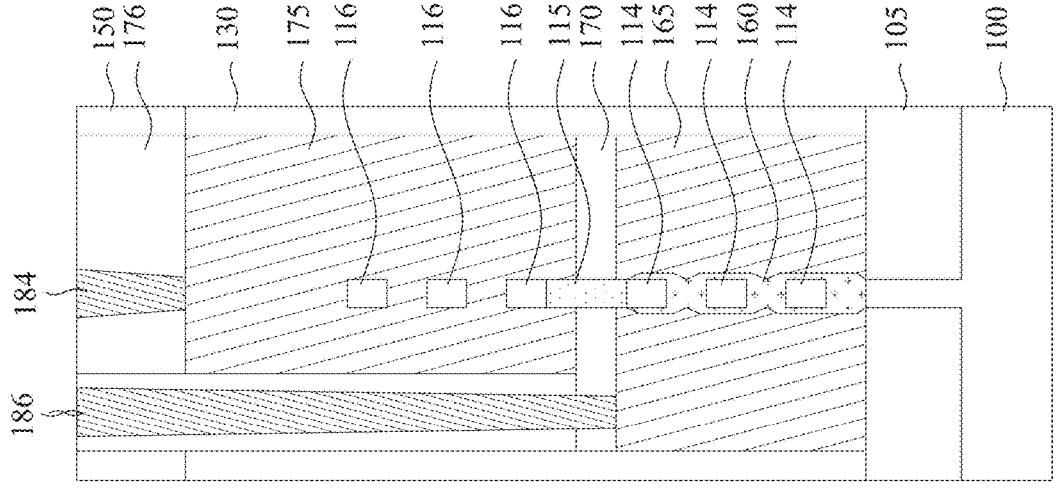
Figure 24C:
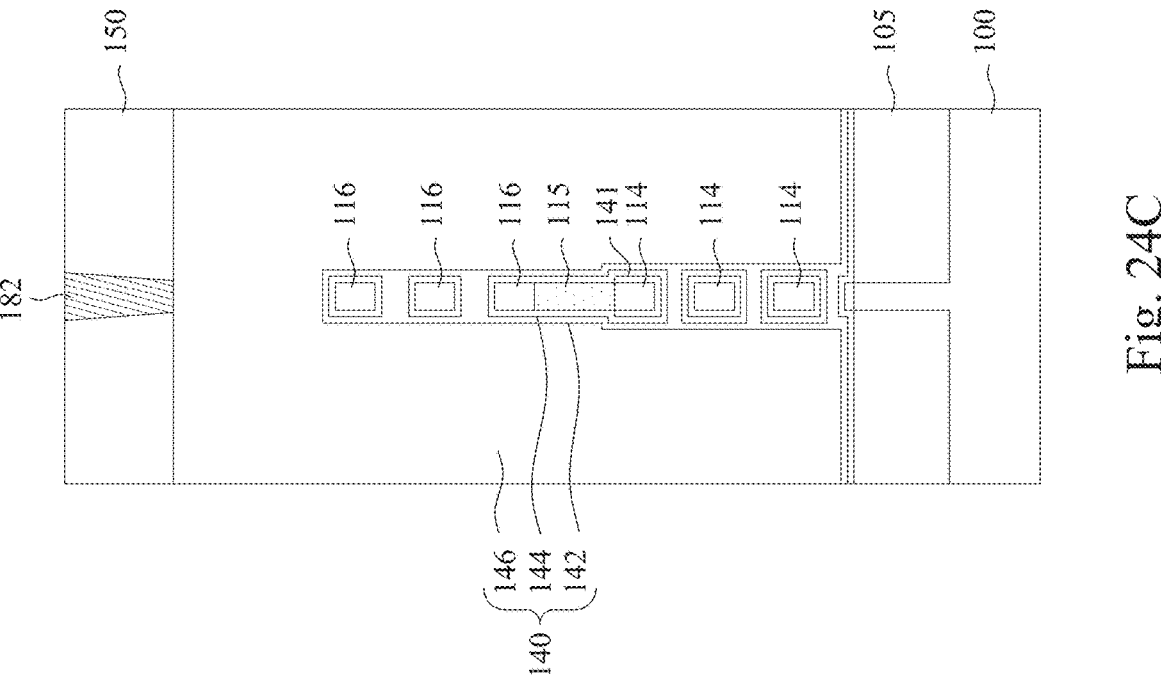

Reference is made to FIGS. 24A to 24D, in which FIG. 24A is a schematic view of a semiconductor device, FIG. 24B is a cross-sectional view along line B-B of FIG. 24A, FIG. 24C is a cross-sectional view along line C-C of FIG. 24A, and FIG. 24D is a cross-sectional view along line D-D of FIG. 24A. Vias 182, 184, and 186 are formed in the via openings VO1, VO2, VO3, respectively. In greater details, the via 182 is formed in the via opening VO1 and in contact with the gate structure 140, and can also be referred to as gate via. The vias 184 are formed in the via openings VO2 and in contact with the source/drain contacts 175, and can also be referred to as source/drain vias. The vias 186 are formed in the via openings VO3 and in contact with the source/drain contacts 165, and can also be referred to as source/drain vias.

In some embodiments, the vias 182, 184, and 186 may be formed by, for example, filling the via openings VO1, VO2, and VO3 with conductive material, and then performing a CMP process to remove excess conductive material until top surface of the ILD layer 150 is exposed. In some embodiments, the conductive material may include W, Co, Ru, TiN, Ti, TaN, Ta, Al, Mo, Ag, Sc, Hf, Sn, Au, Pt, Pd, or combinations thereof.

In some embodiments of the present disclosure, a CFET device is provided, which includes a p-type transistor disposed over the substrate 100 and an n-type transistor stacked over the p-type transistor. As shown in FIGS. 24A to 24D, the p-type transistor include a GAA configuration, which includes a gate structure 140, channel layers 114, and source/drain epitaxy structures 160. Similarly, the n-type transistor includes a GAA configuration, which includes a gate structure 140, channel layers 116, and source/drain contacts 175. The channel layers 116 of the n-type device are formed of a semiconductive oxide material instead of a semiconductor material. If the channel layers 116 of the top-tier n-type device is formed of a semiconductor material, it is hard to form the semiconductor material having satisfying crystalline quality. However, because the semiconductive oxide material is an amorphous structure, the n-type transistor of the CFET device may be formed with no limitation in device height and crystalline quality. Moreover, an isolation layer 115 is formed between the p-type transistor and the n-type transistor. The isolation layer 115 can be formed over the channel layers 114 of the p-type transistor without crystalline concern, which can not only serve as a template for growing the channel layers 116 of the n-type device, but also facilitate top to bottom isolation for the CFET device. Moreover, the n-type device with semiconductive oxide channel layer may include lower thermal budget, which facilitate the formation of the CFET device.

FIGS. 25A to 35D show various stages of manufacturing operations for a semiconductor device according to some embodiments of the present disclosure. It is noted that some elements of FIGS. 25A to 35D are similar to those described with respect to FIGS. 1A to 24D, such elements are labeled the same, and relevant details will not be repeated for brevity. The embodiment of FIGS. 25A to 35D is different from the embodiments of FIGS. 1A to 24D, in that first sacrificial layers 211 and first channel layers 212 are formed alternately stacked over the substrate 100. An isolation layer 310 is then formed over the topmost one of the first channel layers 212.

Second sacrificial layers 213 and second channel layers 214 are formed alternately stacked over the isolation layer 310. An isolation layer 312 is then formed over the topmost one of the second channel layers 214.

Third channel layers 215 and third sacrificial layers 216 are formed alternately stacked over the isolation layer 312. An isolation layer 314 is then formed over the topmost one of the third sacrificial layers 216.

Fourth channel layers 217 and fourth sacrificial layers 218 are formed alternately stacked over the isolation layer 314.

In some embodiments, the first, second, third, and fourth sacrificial layers 211, 213, 216, and 218 may be made of a semiconductor material, and thus can also be referred to as semiconductor layers. For example, the first, second, third, and fourth sacrificial layers 211, 213, 216, and 218 are made of $Si_xGe_{1-x}$, where $0.1 < x < 0.9$ (hereinafter may be referred as SiGe). In some embodiments, the first, second, third, and fourth sacrificial layers 211, 213, 216, and 218 are made of a same material.

The first and second channel layers 212 ad 214 can be made of a semiconductor material, and thus can also be referred to as semiconductor layers. In some embodiments, the first and second channel layers 212 ad 214 are made of a same material. In some embodiments, the first and second channel layers 212 ad 214 may include a semiconductor material different from the first, second, third, and fourth sacrificial layers 211, 213, 216, and 218. In some embodiments, the first and second channel layers 212 ad 214 can be made of $Si_xGe_{1-y}$, where x<y. For example, the first and second channel layers 212 ad 214 can be made of pure silicon (y=1). In some other embodiments, the first and second channel layers 212 ad 214 can be made of $Si_xGe_{1-y}$, where x>y. For example, the first and second channel layers 212 ad 214 can be made of pure germanium (y=0). In some other embodiments, the first and second channel layers 212 ad 214 are made of Si, Ge, GeSn, SiGe, GaAs, InSb, GaP, GaSb, InAlAs, InGaAs, GaSbP, GaAsSb, GaN, GaP, and InP.

The third and fourth channel layers 215 and 217 are made of a material that is different from the first and second channel layers 212 ad 214. In some embodiments, the third and fourth channel layers 215 and 217 are made of a same material. In some embodiments, the third and fourth channel layers 215 and 217 can be made of semiconductive oxide material, and thus can also be referred to as semiconductive oxide layers. In some embodiments, the third and fourth channel layers 215 and 217 can be made of semiconductive oxide material suitable for an n-type device, such as indium gallium zinc oxide (IGZO), or a similar conducting oxide semiconductor material such as indium zinc oxide (IZO), indium oxide ($InO_x$), gallium oxide ($GaO_x$), or combinations thereof. In some embodiments, the third and fourth channel layers 215 and 217 may be deposited by a CVD process or ALD process.

The isolation layers 310, 312, and 314 may be made of dielectric material such as silicon oxide, silicon nitride, silicon oxynitride (SiON), SiCN, fluorine-doped silicate glass (FSG), or a low-K dielectric material. In some embodiments, isolation layers 310, 312, and 314 are made of oxide, and can also be referred to as an oxide layer. In some embodiments, the isolation layers 310, 312, and 314 may be formed by LPCVD (low pressure chemical vapor deposition), plasma-CVD or flowable CVD or any other suitable film formation methods.

Figure 25B:
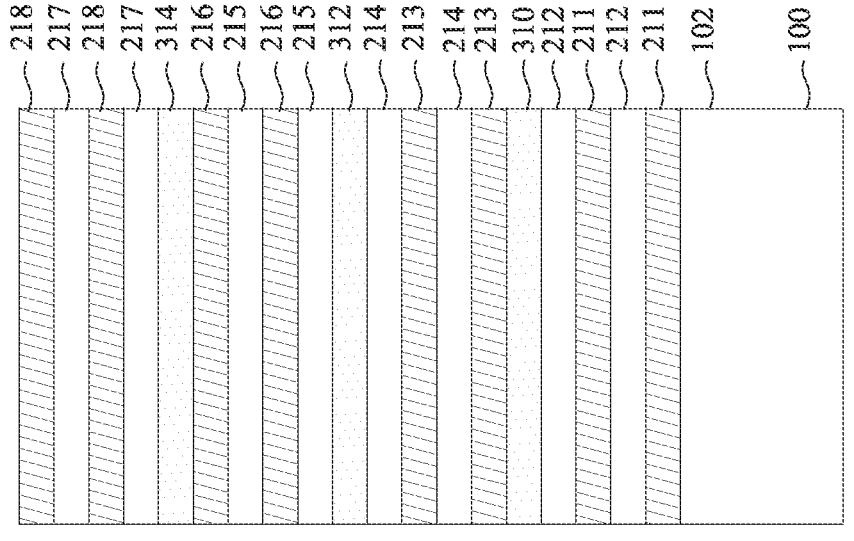
FIGS. 25A to 35D show various stages of manufacturing operations for a semiconductor device according to some embodiments of the present disclosure.
Figure 25A:
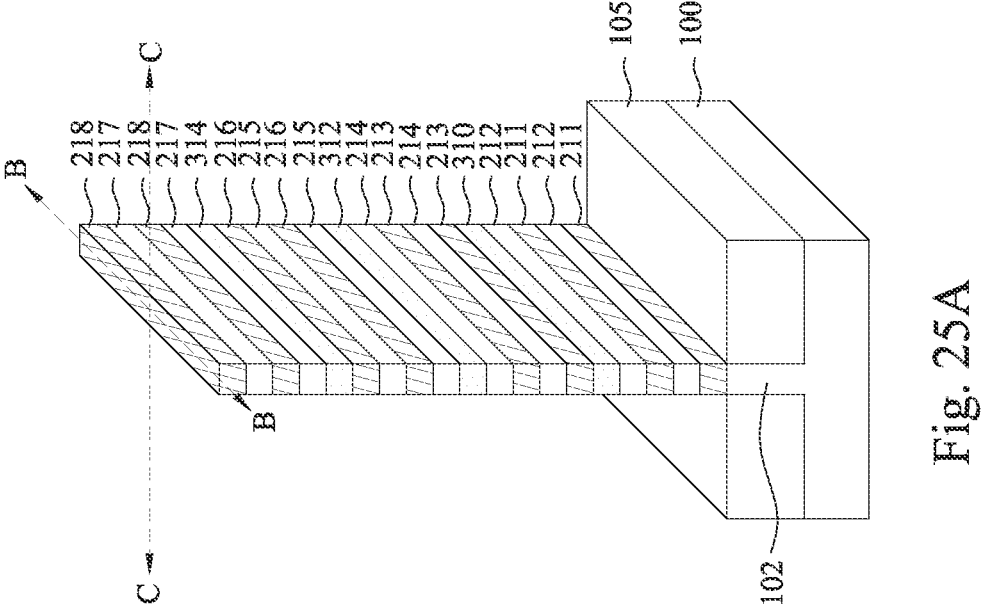
Figure 25C:
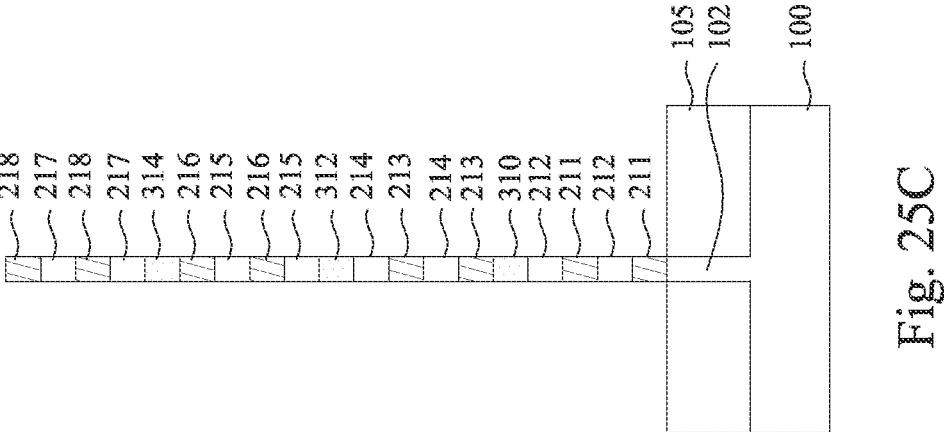

The first sacrificial layers 211, the first channel layers 212, the isolation layer 310, the second sacrificial layers 213, the second channel layers 214, the isolation layer 312, the third channel layers 215, the third sacrificial layers 216, the isolation layer 315, the fourth channel layers 217, and the fourth sacrificial layers 218 may undergo the processes as shown in FIGS. 1A to 3C, and the resulting structure is shown in FIGS. 25A to 25C. For example, a semiconductor strip 102 may be formed protruding over the top surface of the substrate 100, and isolation structures 105 are formed over the substrate 100 and laterally surrounding the semiconductor strip 102. In some embodiments, the semiconductor strip 102, the first sacrificial layers 211, the first channel layers 212, the isolation layer 310, the second sacrificial layers 213, the second channel layers 214, the isolation layer 312, the third channel layers 215, the third sacrificial layers 216, the isolation layer 315, the fourth channel layers 217, and the fourth sacrificial layers 218 can be collectively referred to as a fin structure.

Figure 26B:
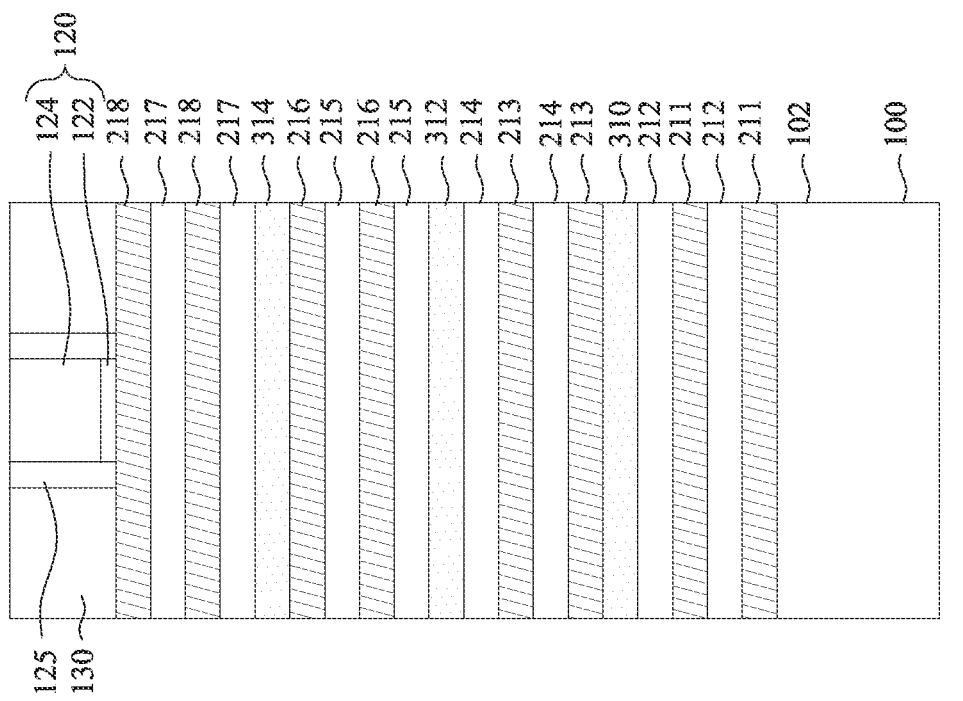
Figure 26A:
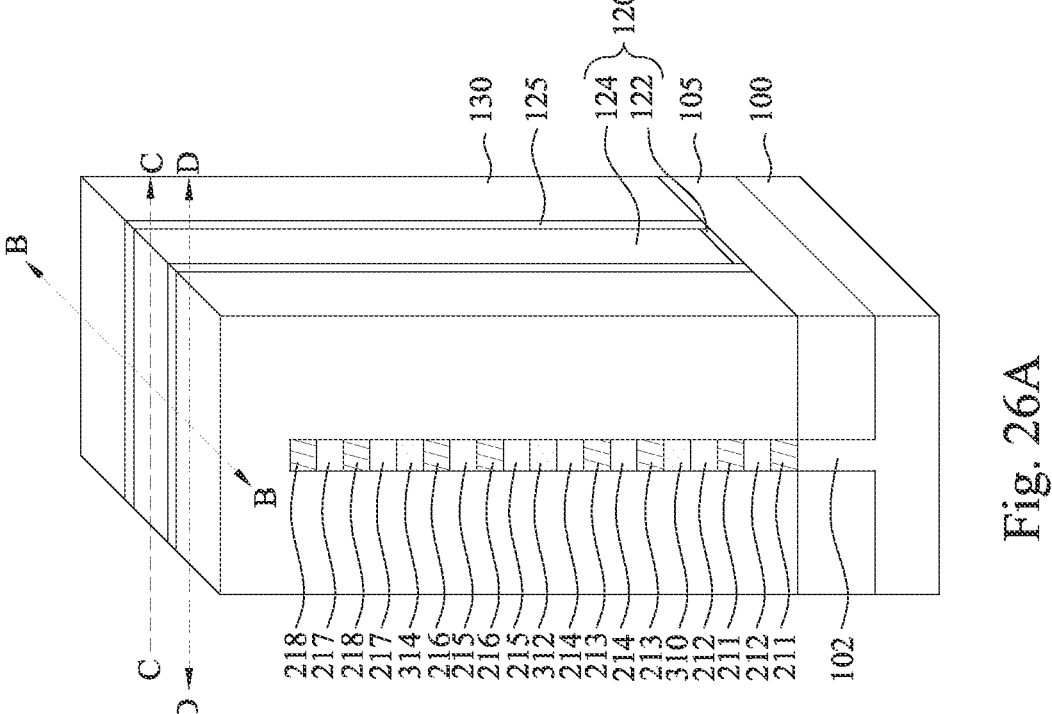
Figure 26D:
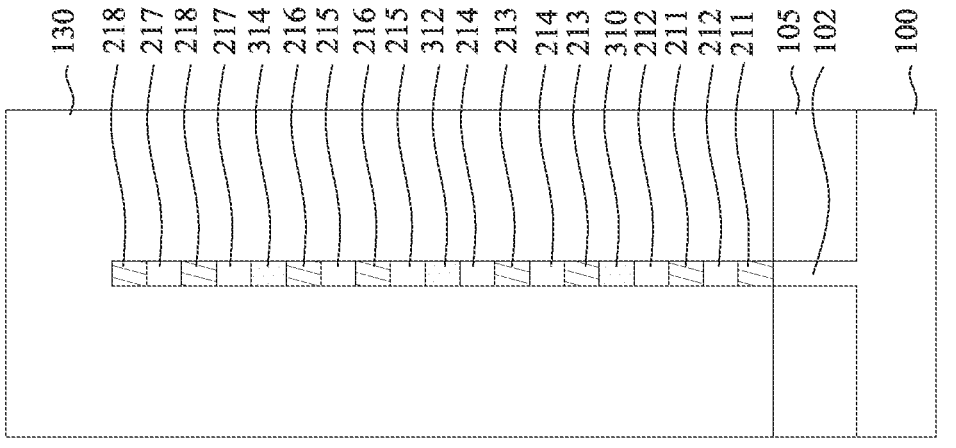
Figure 26C:
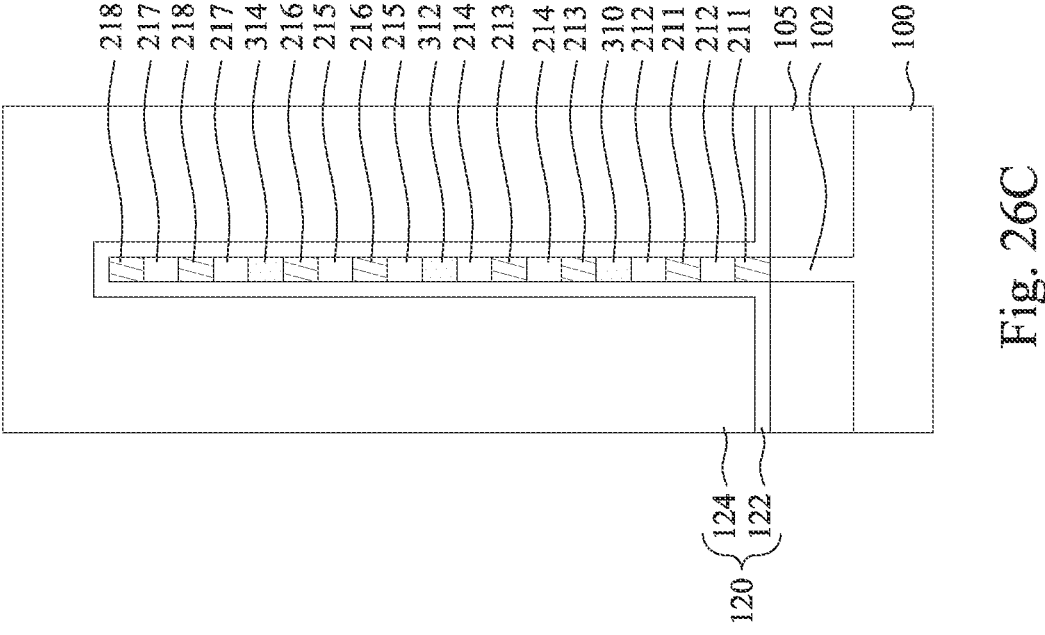

Reference is made to FIGS. 26A to 26D, in which FIG. 26A is a schematic view of a semiconductor device, FIG. 26B is a cross-sectional view along line B-B of FIG. 26A, FIG. 26C is a cross-sectional view along line C-C of FIG. 26A, and FIG. 26D is a cross-sectional view along line D-D of FIG. 26A. A dummy gate structure 120 is formed over the substrate 100 and crossing the fin structure formed by the semiconductor strip 102, the first sacrificial layers 211, the first channel layers 212, the isolation layer 310, the second sacrificial layers 213, the second channel layers 214, the isolation layer 312, the third channel layers 215, the third sacrificial layers 216, the isolation layer 315, the fourth channel layers 217, and the fourth sacrificial layers 218. In some embodiments, the dummy gate structure 120 includes a dummy gate dielectric 122 and a dummy gate electrode 124 over the dummy gate dielectric 122. Gate spacers 125 are formed on opposite sidewalls of the dummy gate structure 120. An interlayer dielectric (ILD) layer 130 is deposited over the substrate 100 and laterally surrounding the dummy gate structure 120.

Figure 27B:
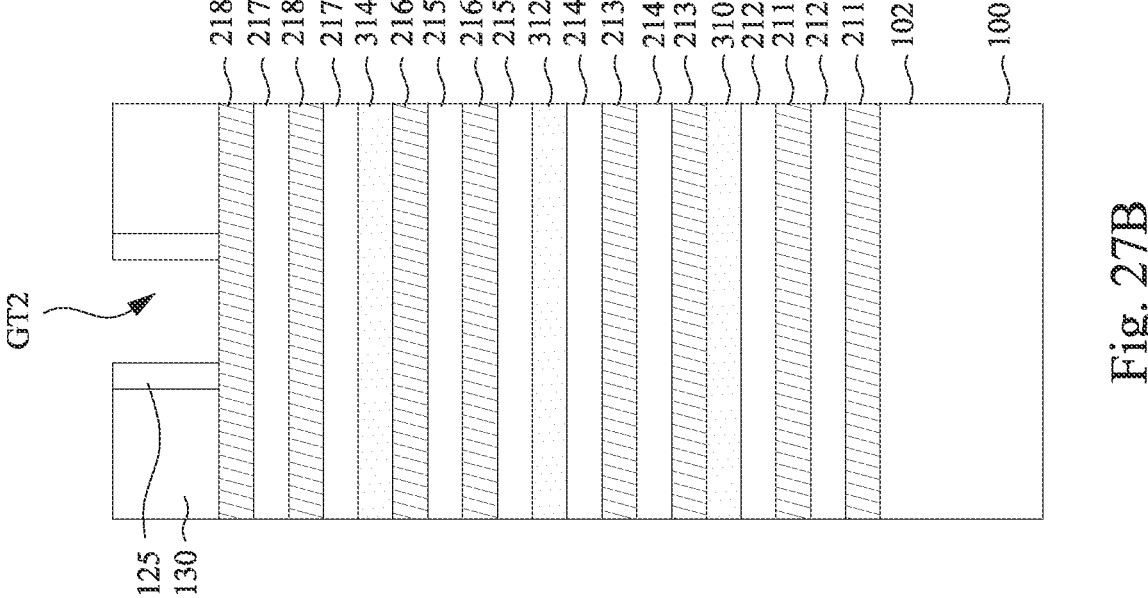
Figure 27A:
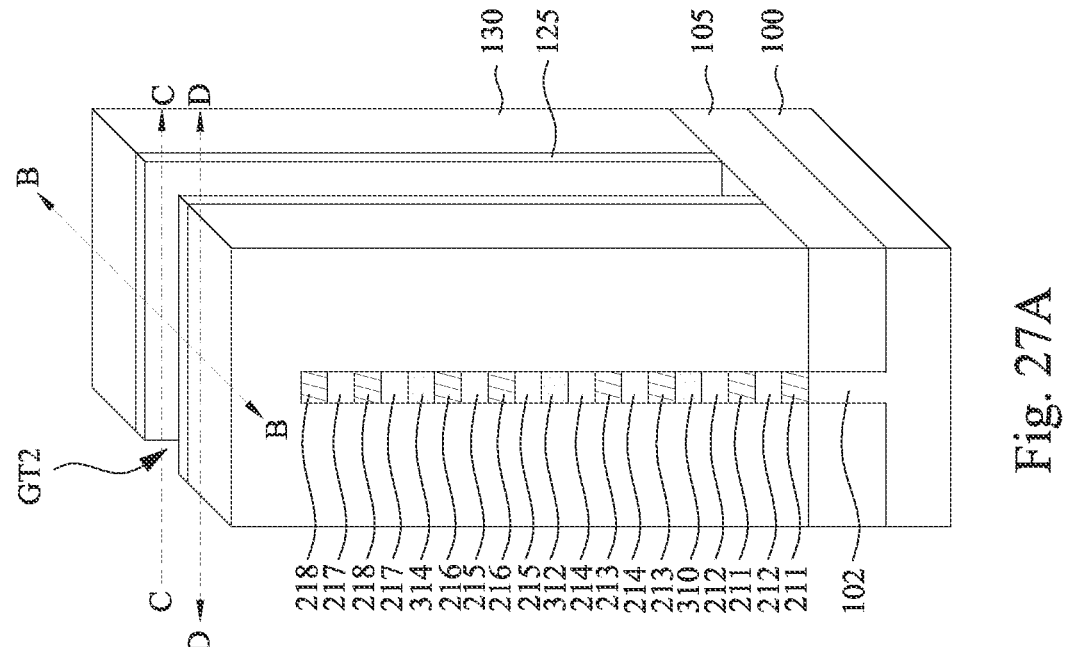
Figure 27D:
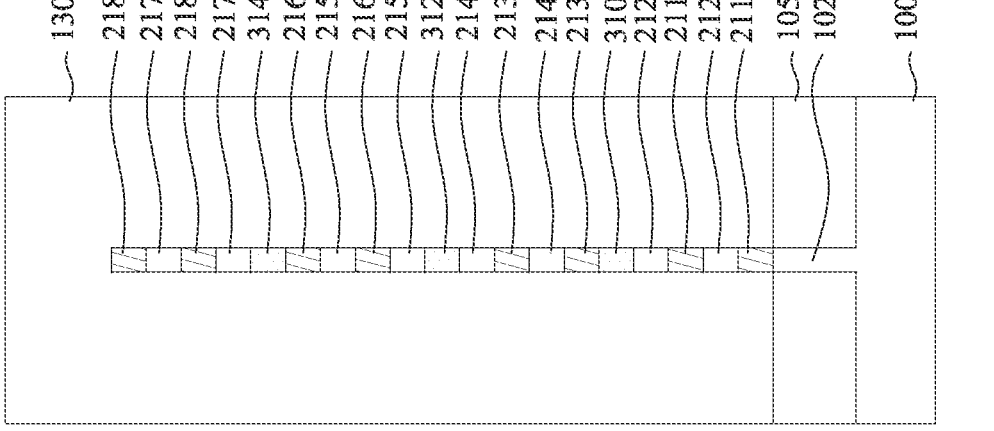
Figure 27C:
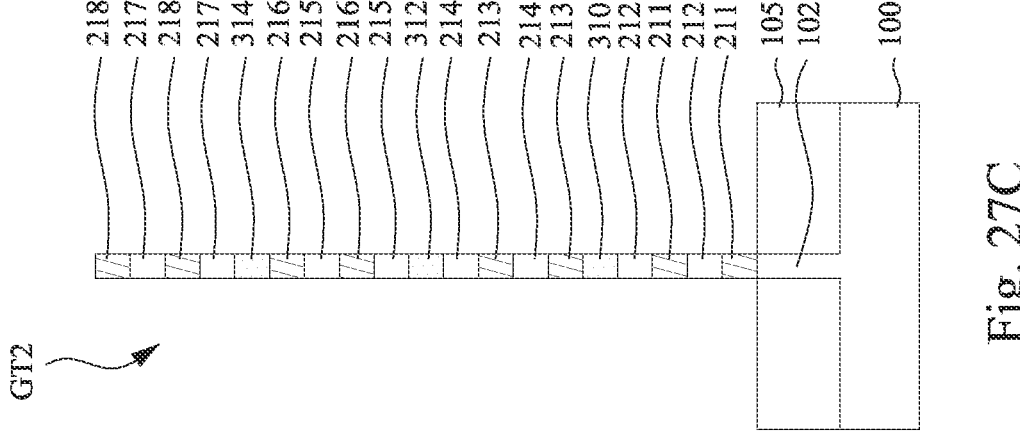

Reference is made to FIGS. 27A to 27D, in which FIG. 27A is a schematic view of a semiconductor device, FIG. 27B is a cross-sectional view along line B-B of FIG. 27A, FIG. 27C is a cross-sectional view along line C-C of FIG. 27A, and FIG. 27D is a cross-sectional view along line D-D of FIG. 27A. The dummy gate structure 120 is removed to form a gate trench GT2. In greater details, after the dummy gate structure 120 is removed, portions of the first sacrificial layers 211, the first channel layers 212, the isolation layer 310, the second sacrificial layers 213, the second channel layers 214, the isolation layer 312, the third channel layers 215, the third sacrificial layers 216, the isolation layer 315, the fourth channel layers 217, and the fourth sacrificial layers 218 are exposed through the gate trench GT2 (see FIG. 27C).

Figure 28B:
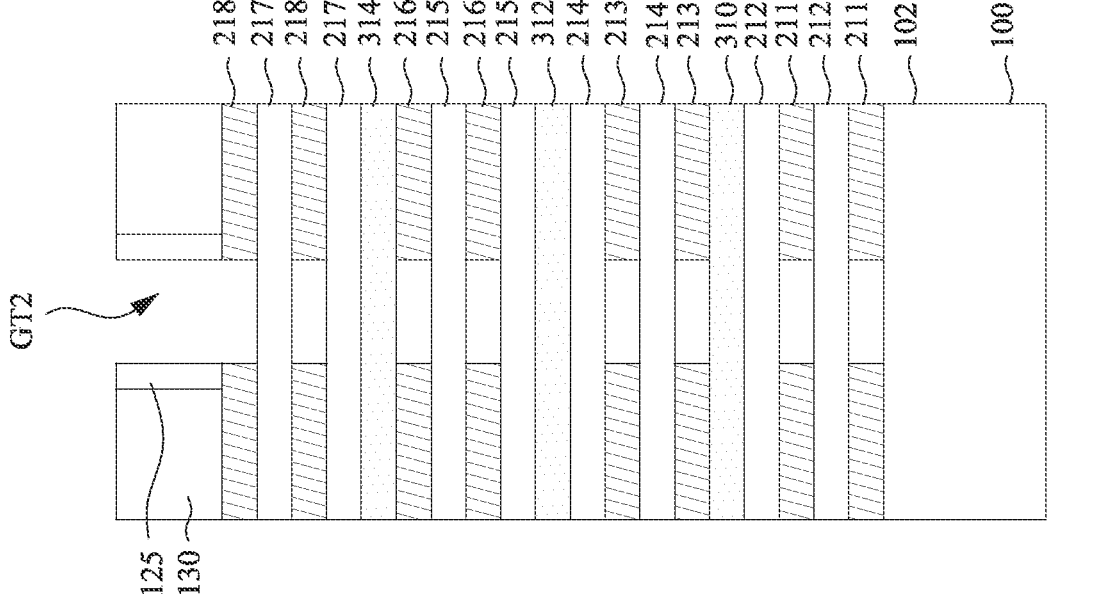
Figure 28A:
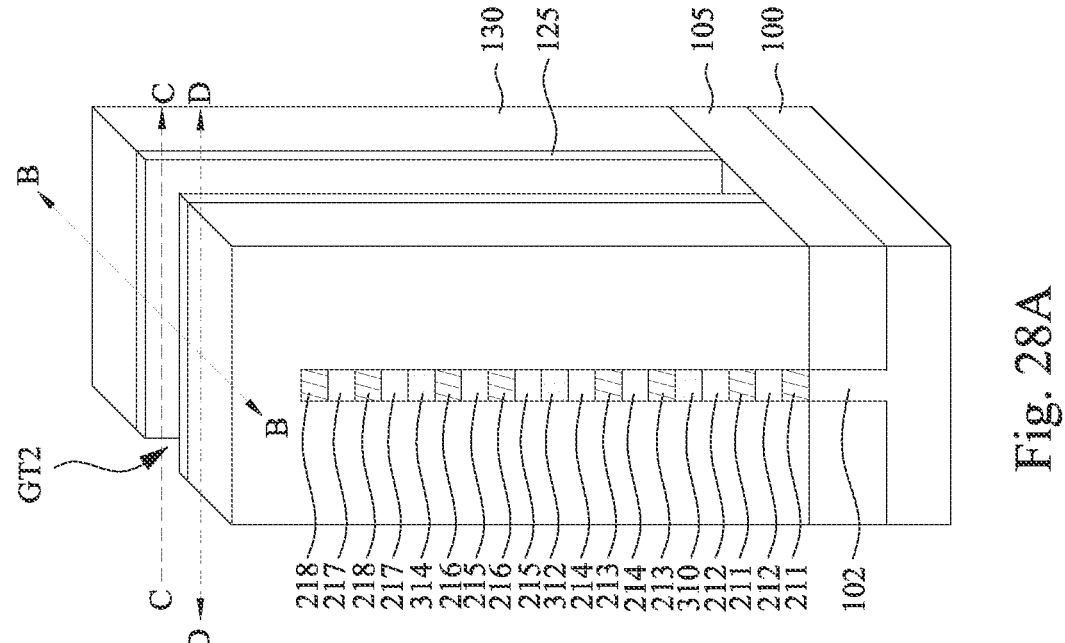
Figure 28D:
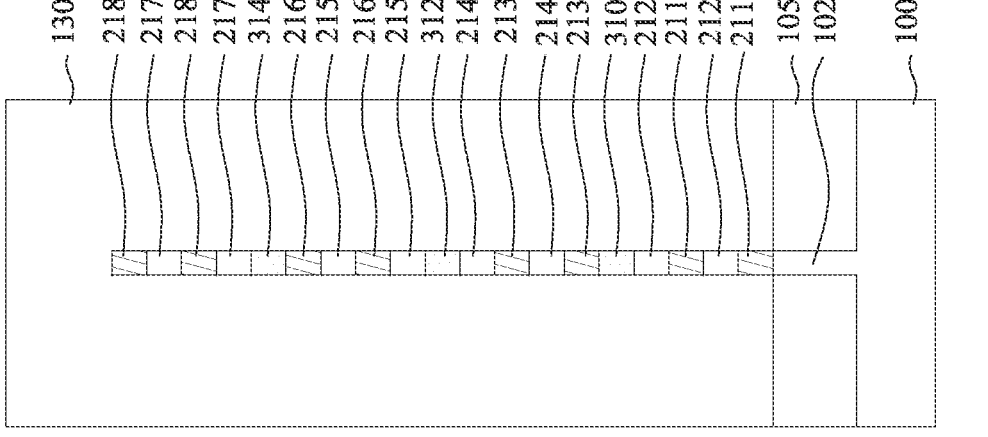
Figure 28C:
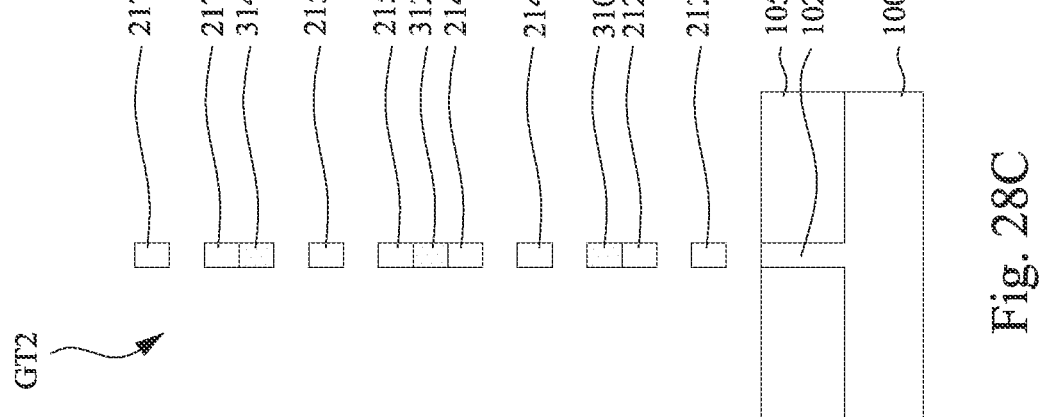

Reference is made to FIGS. 28A to 28D, in which FIG. 28A is a schematic view of a semiconductor device, FIG. 28B is a cross-sectional view along line B-B of FIG. 28A, FIG. 28C is a cross-sectional view along line C-C of FIG. 28A, and FIG. 28D is a cross-sectional view along line D-D of FIG. 28A. Portions of the first, second, third, and fourth sacrificial layers 211, 213, 216, and 218 are removed through the gate trench GT2 by an etching process, leaving portions of the first, second, third, and fourth channel layers 212, 214, 215, and 217 suspended over the substrate 100. Because the first, second, third, and fourth sacrificial layers 211, 213, 216, and 218 are made of a same material, the first, second, third, and fourth sacrificial layers 211, 213, 216, and 218 can be removed simultaneously in a single etching process. The first, second, third, and fourth channel layers 212, 214, 215, and 217, and the isolation layers 310, 312, and 314 may include higher etching resistance to the etching process. In some embodiments, the top surface of the semiconductor strip 102 is exposed after the first, second, third, and fourth sacrificial layers 211, 213, 216, and 218 are removed.

Figure 29B:
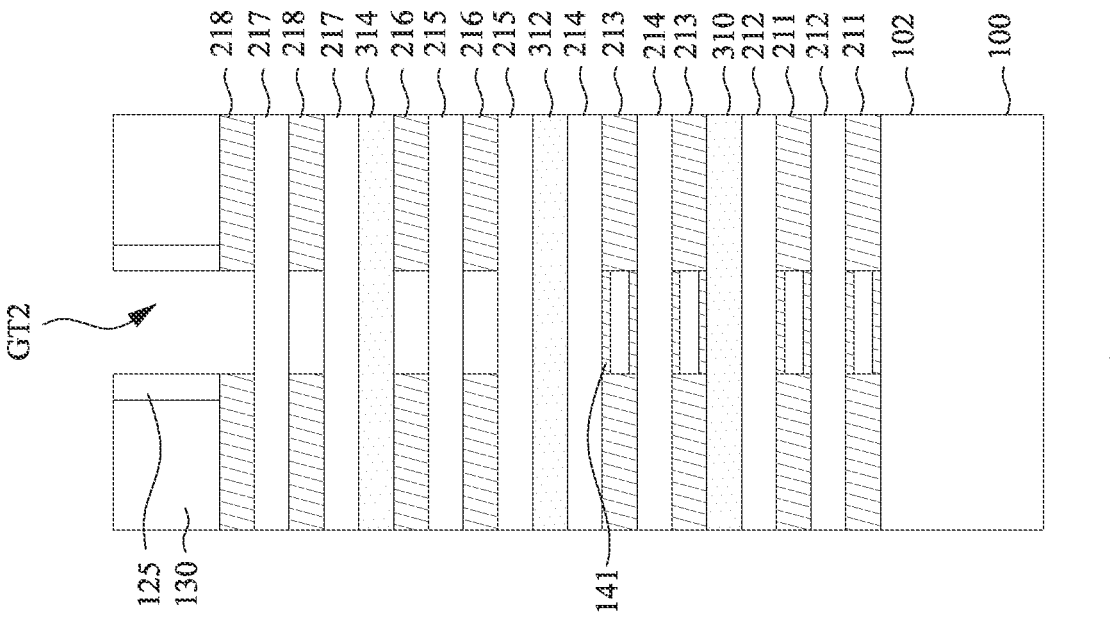
Figure 29A:
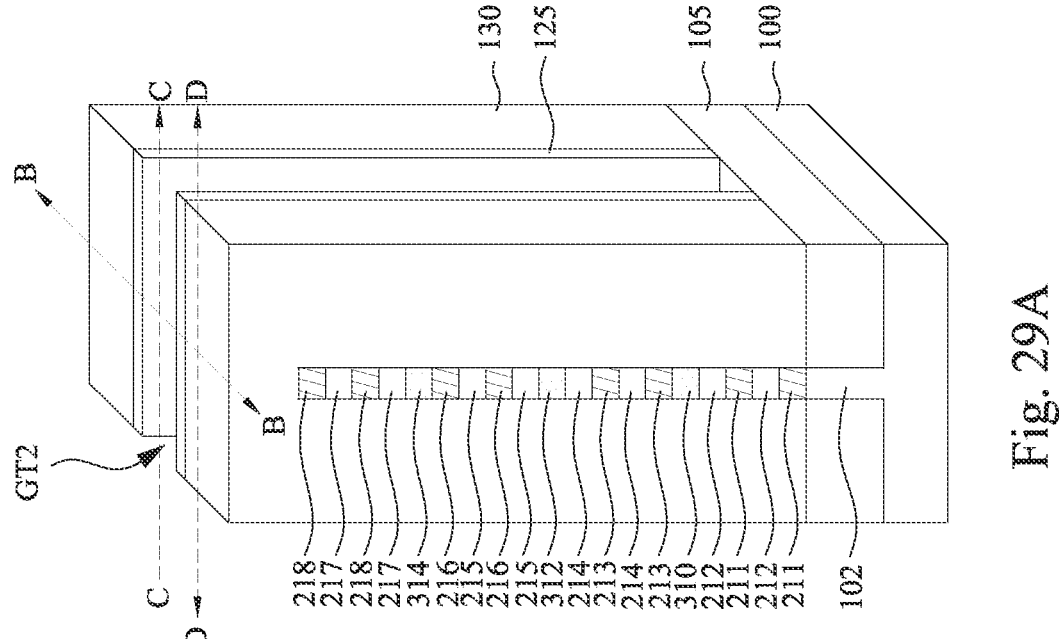
Figure 29D:
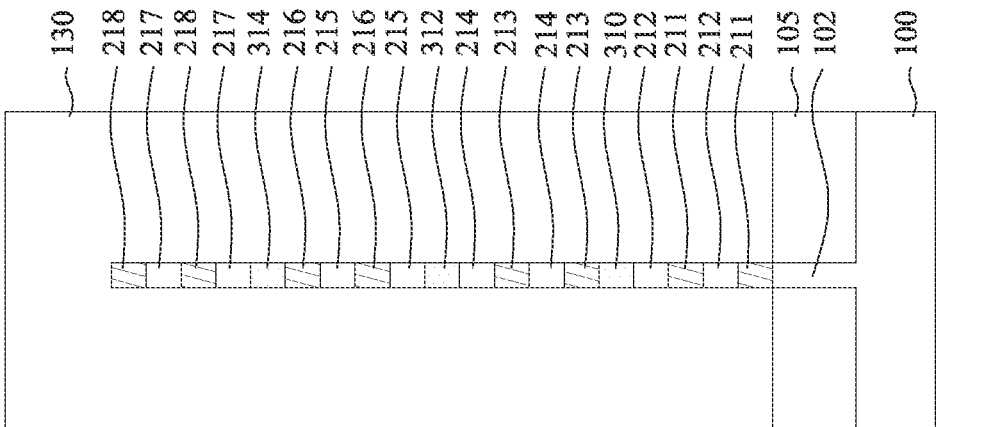
Figure 29C:
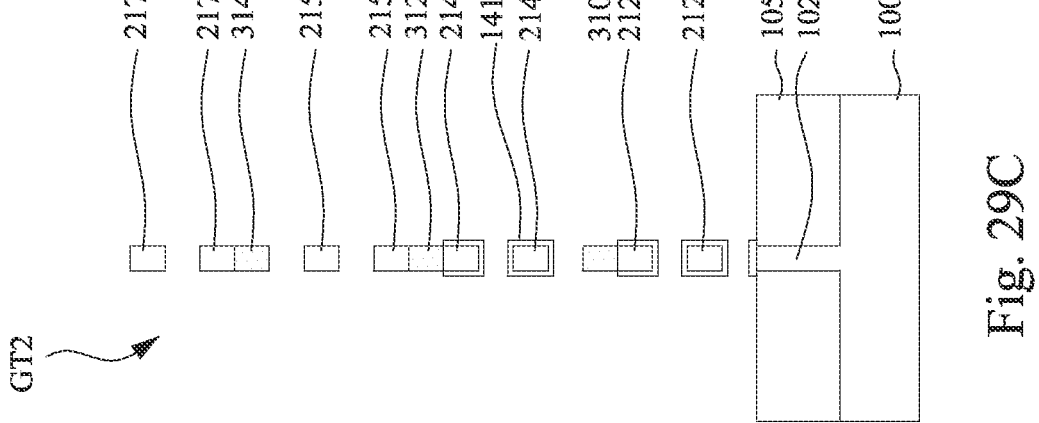

Reference is made to FIGS. 29A to 29D, in which FIG. 29A is a schematic view of a semiconductor device, FIG. 29B is a cross-sectional view along line B-B of FIG. 29A, FIG. 29C is a cross-sectional view along line C-C of FIG. 29A, and FIG. 29D is a cross-sectional view along line D-D of FIG. 29A. An interfacial layer 141 is selectively formed on exposed surfaces of the first and second channel layers 212, 214 and the semiconductor strip 102. In some embodiments, the interfacial layer 141 may be formed by performing an oxidation process. In some embodiments where the first and second channel layers 212, 214 are silicon-based material, such as Si or SiGe, the first and second channel layers 212, 214 may be oxidized to form the interfacial layer 141 made of silicon oxide. On the other hand, because the third and fourth channel layers 215 and 217 are made of semiconductive oxide, and the isolation layers 310, 312, 314 are made of dielectric material, the oxidation process would not form the interfacial layer 141 on the exposed surface of the third and fourth channel layers 215 and 217 and the isolation layers 310, 312, 314. In some embodiments, the interfacial layer 141 may be omitted.

Figure 30B:
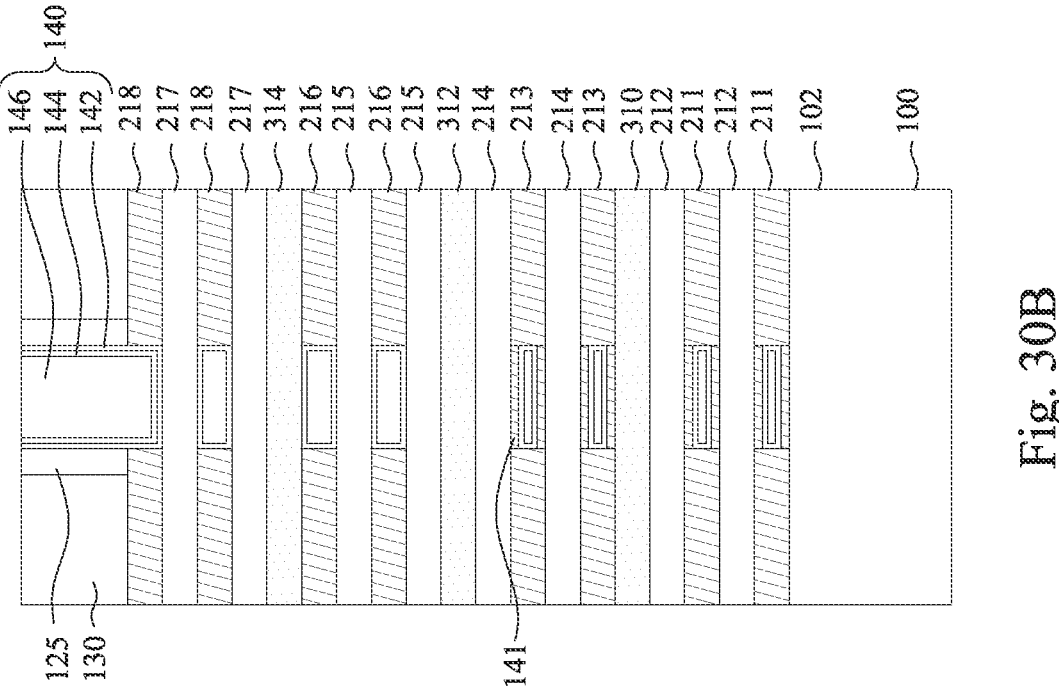
Figure 30A:
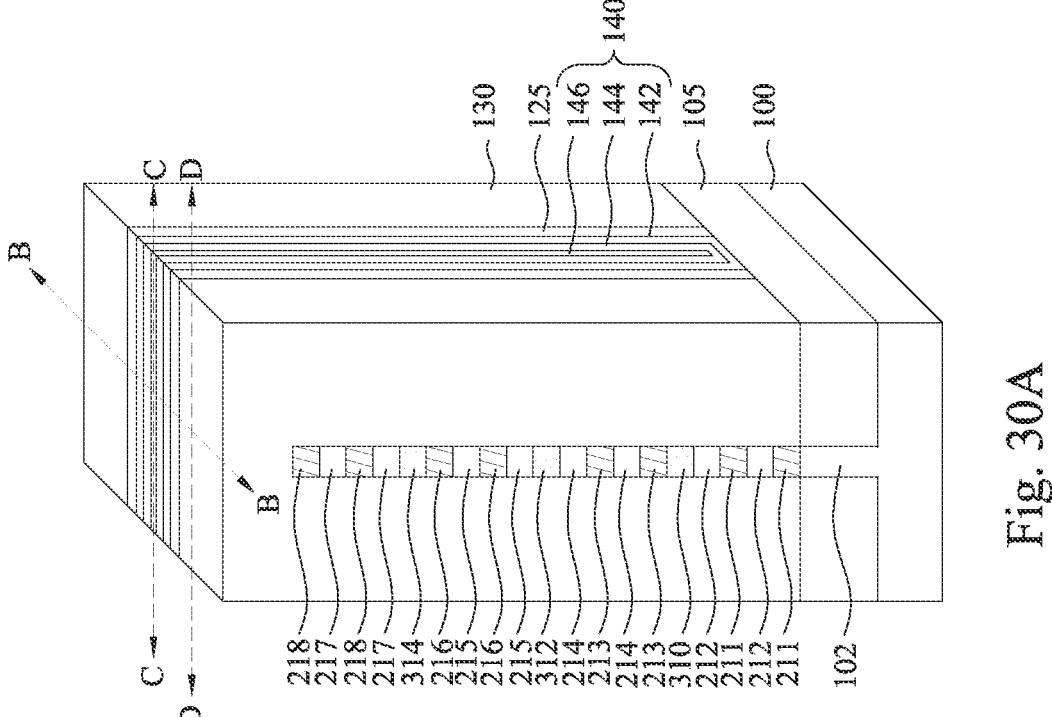
Figure 30D:
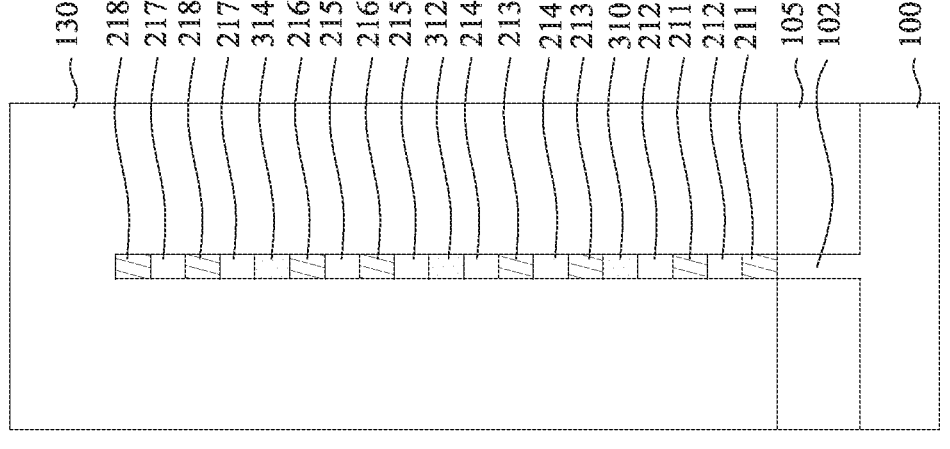
Figure 30C:
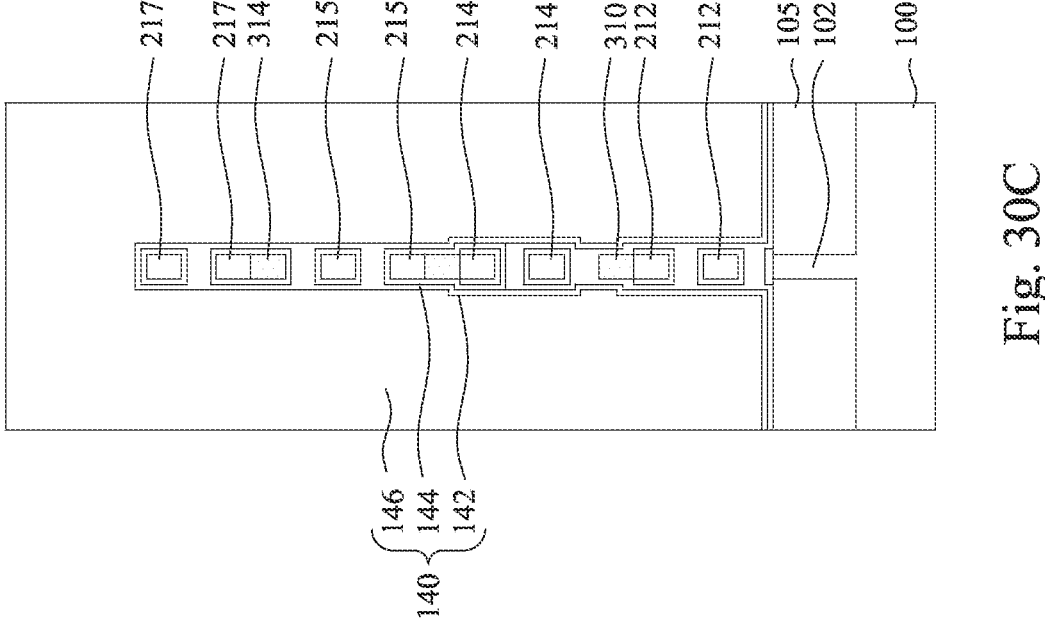

Reference is made to FIGS. 30A to 30D, in which FIG. 30A is a schematic view of a semiconductor device, FIG. 30B is a cross-sectional view along line B-B of FIG. 30A, FIG. 30C is a cross-sectional view along line C-C of FIG. 30A, and FIG. 30D is a cross-sectional view along line D-D of FIG. 30A. Gate dielectric layer 142 is formed in the gate trench GT2, a work function metal layer 144 is formed over the gate dielectric layer 142, and a gate electrode 146 is formed over the work function metal layer 144. The gate dielectric layer 142, the work function metal layer 144, and the gate electrode 146 may be collectively referred to as a gate structure 140. In some embodiments, the gate structure 140 may also include the interfacial layer 141.

In some embodiments, the gate dielectric layer 142 may be in contact with the exposed surfaces of the third and fourth channel layers 215 and 217 and the isolation layers 310, 312, 314, while the dielectric layer 142 may be separated from the first and second channel layers 212, 214 and the semiconductor strip 102 by the interfacial layer 141. In some other embodiments where the interfacial layer 141 is omitted, the gate dielectric layer 142 may also be in contact with the first and second channel layers 212, 214 and the semiconductor strip 102.

Figure 31B:
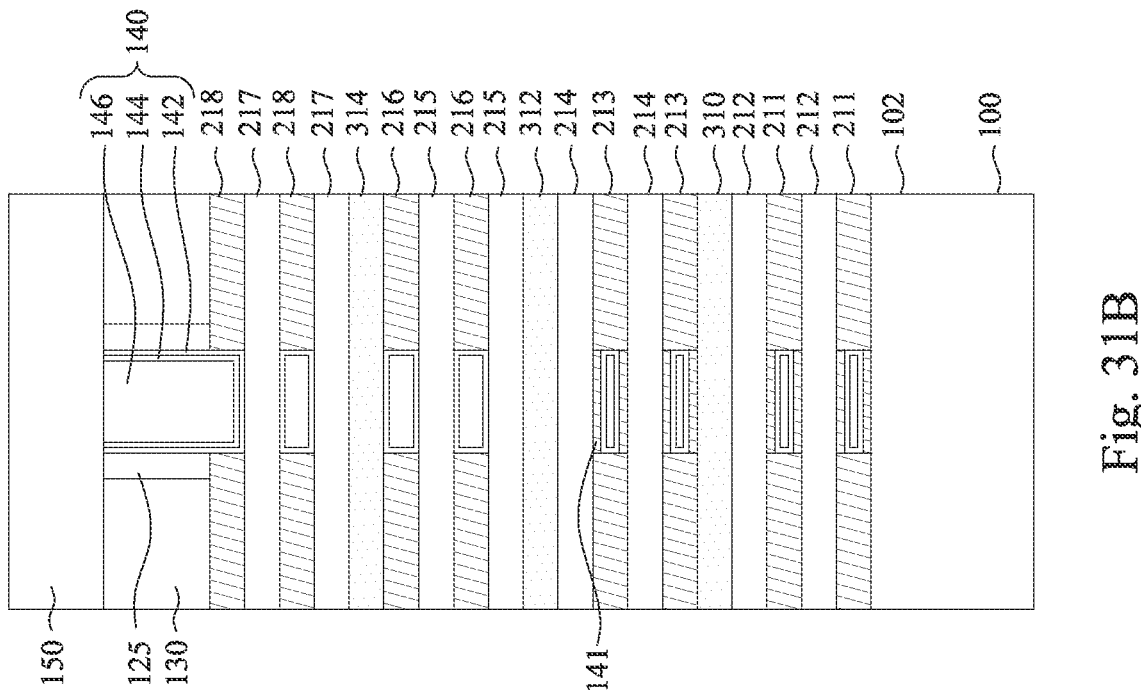
Figure 31A:
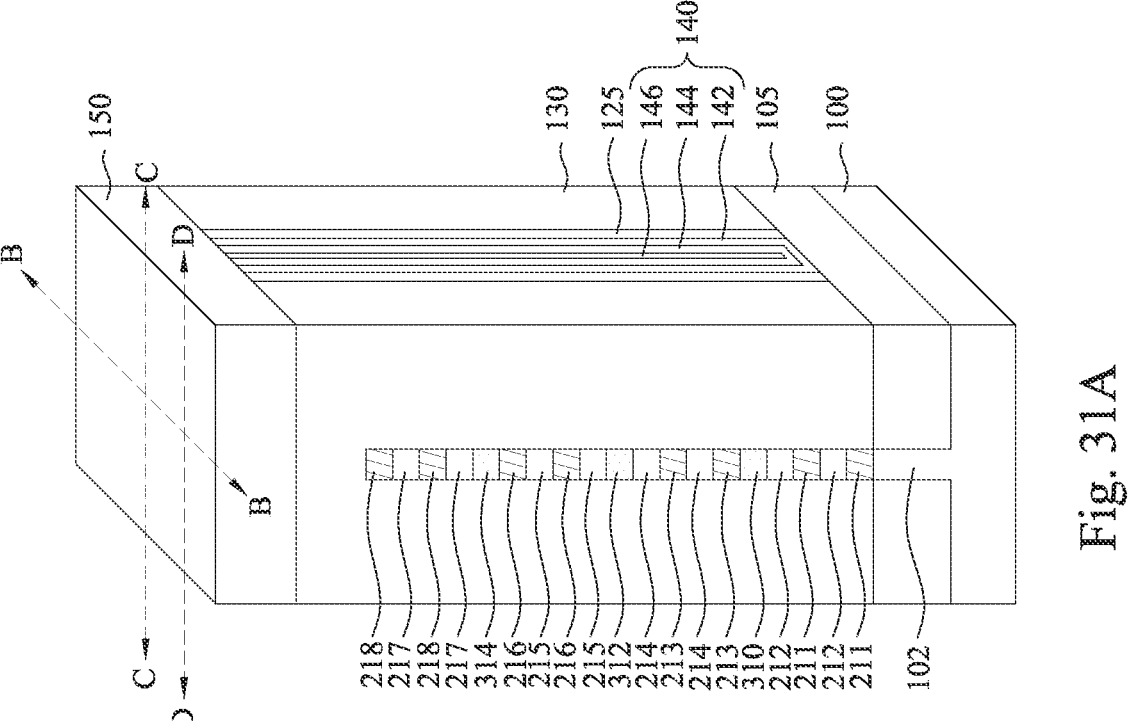
Figure 31D:
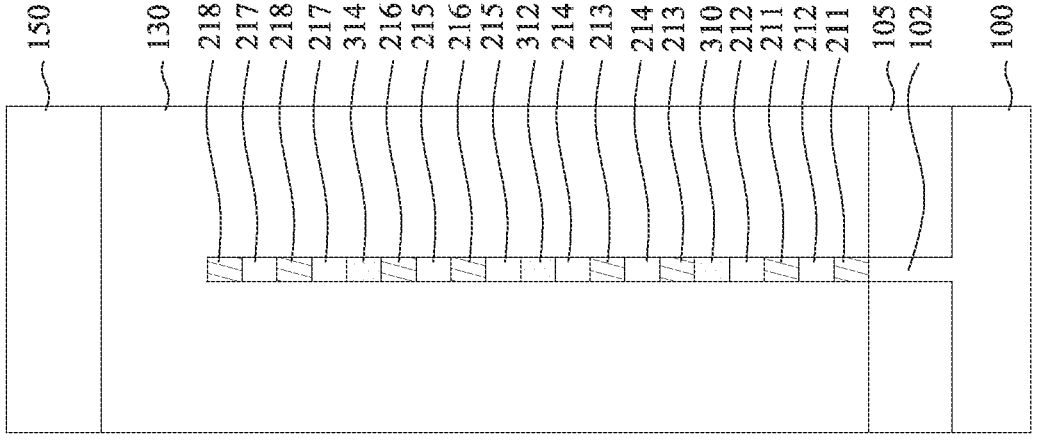
Figure 31C:
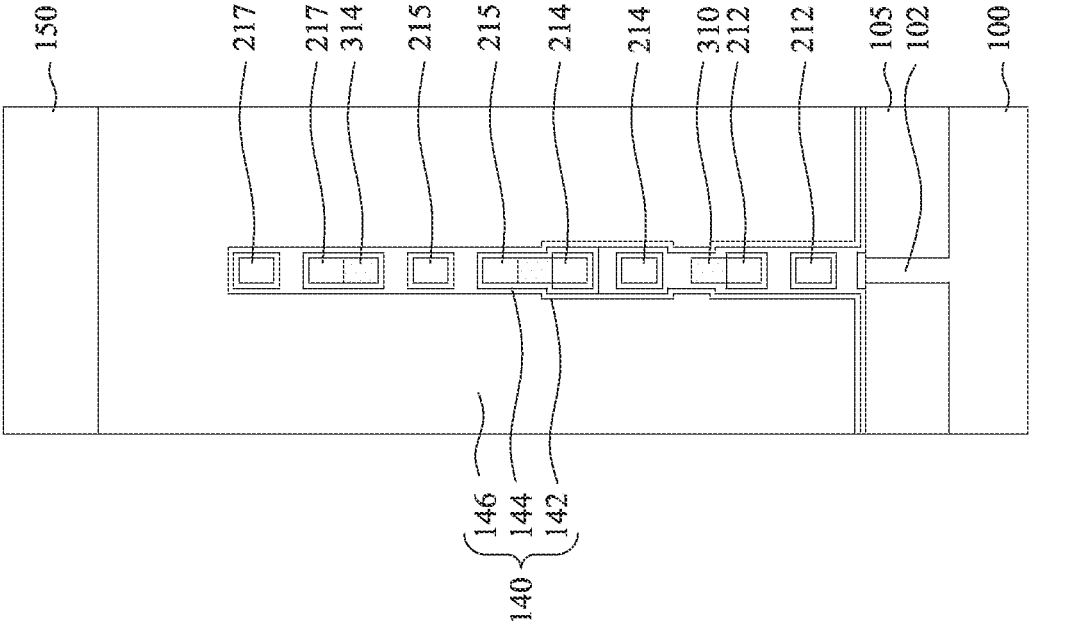

Reference is made to FIGS. 31A to 31D, in which FIG. 31A is a schematic view of a semiconductor device, FIG. 31B is a cross-sectional view along line B-B of FIG. 31A, FIG. 31C is a cross-sectional view along line C-C of FIG. 31A, and FIG. 31D is a cross-sectional view along line D-D of FIG. 31A. An interlayer dielectric (ILD) layer 150 is deposited over the ILD layer 130 and covering the gate structure 140.

Reference is made to FIGS. 31A to 31D, in which FIG. 31A is a schematic view of a semiconductor device, FIG. 31B is a cross-sectional view along line B-B of FIG. 31A, FIG. 31C is a cross-sectional view along line C-C of FIG. 31A, and FIG. 31D is a cross-sectional view along line D-D of FIG. 31A.

Figure 32B:
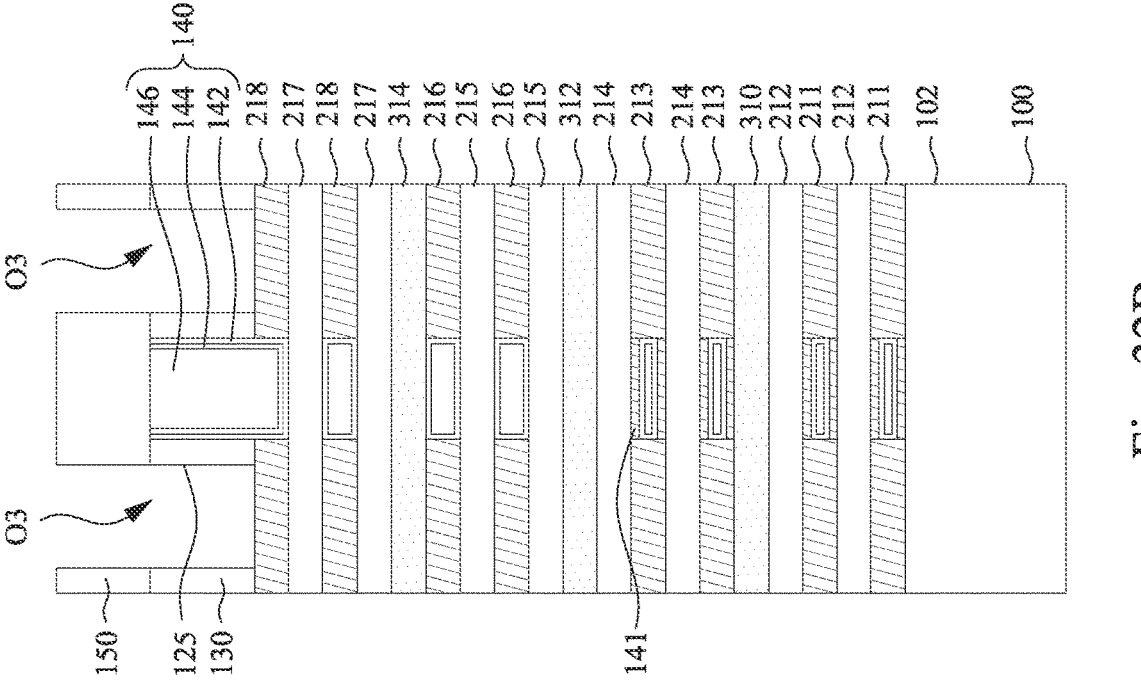
Figure 32A:
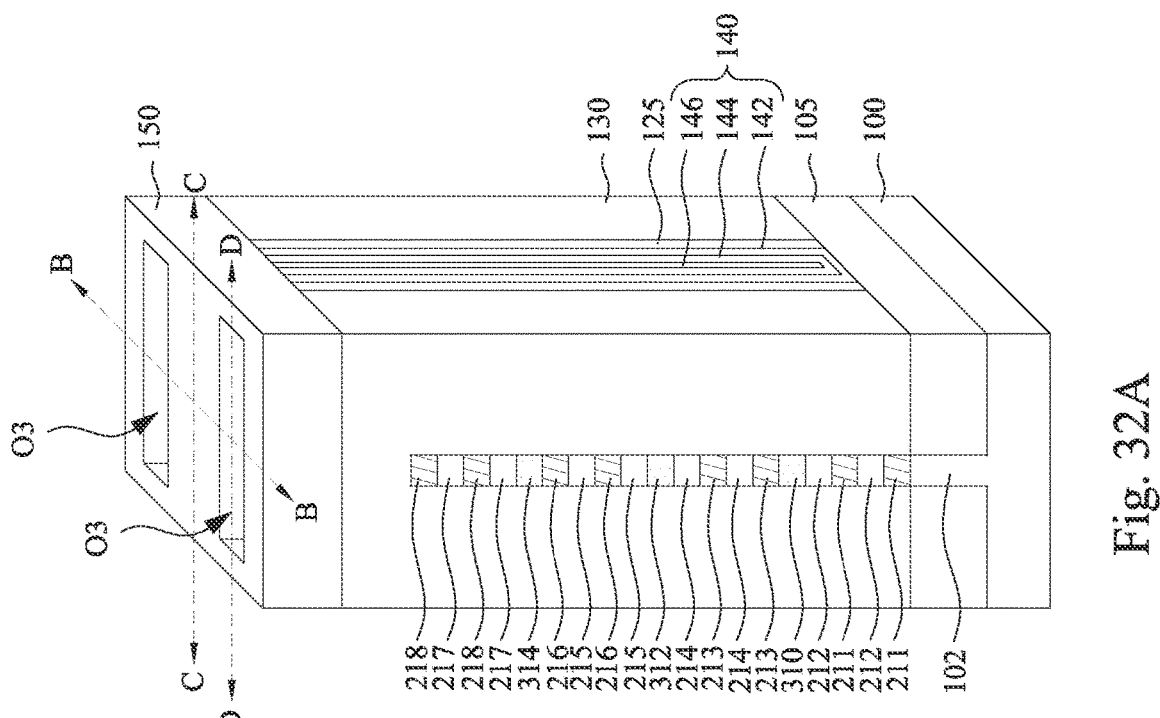
Figure 32D:
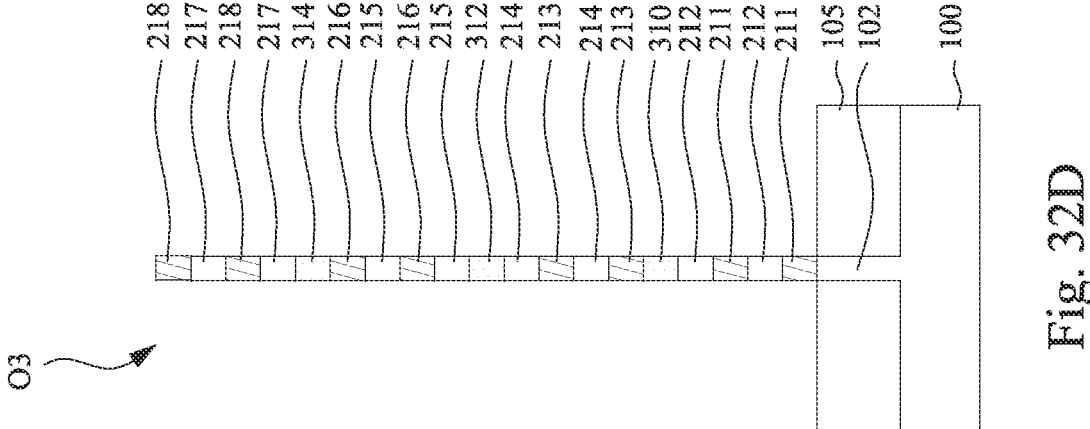
Figure 32C:
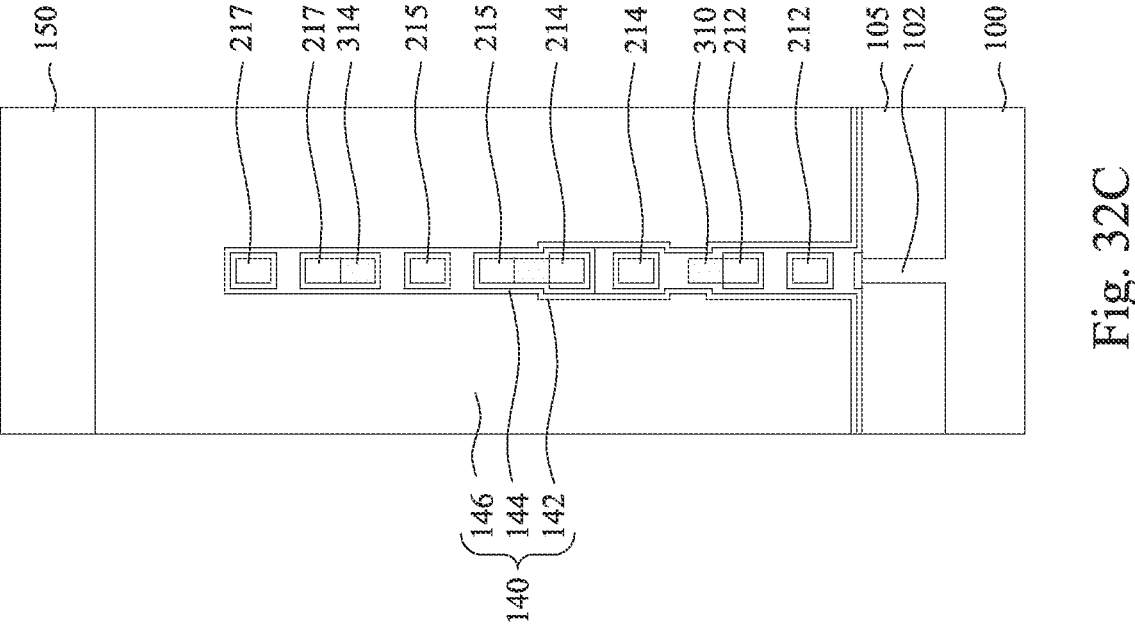

Reference is made to FIGS. 32A to 32D, in which FIG. 32A is a schematic view of a semiconductor device, FIG. 32B is a cross-sectional view along line B-B of FIG. 32A, FIG. 32C is a cross-sectional view along line C-C of FIG. 32A, and FIG. 32D is a cross-sectional view along line D-D of FIG. 32A. Source/drain openings O3 are formed in the ILD layers 130 and 150 to expose portions of the first sacrificial layers 211, the first channel layers 212, the isolation layer 310, the second sacrificial layers 213, the second channel layers 214, the isolation layer 312, the third channel layers 215, the third sacrificial layers 216, the isolation layer 315, the fourth channel layers 217, and the fourth sacrificial layers 218 (see FIG. 32D).

Figure 33B:
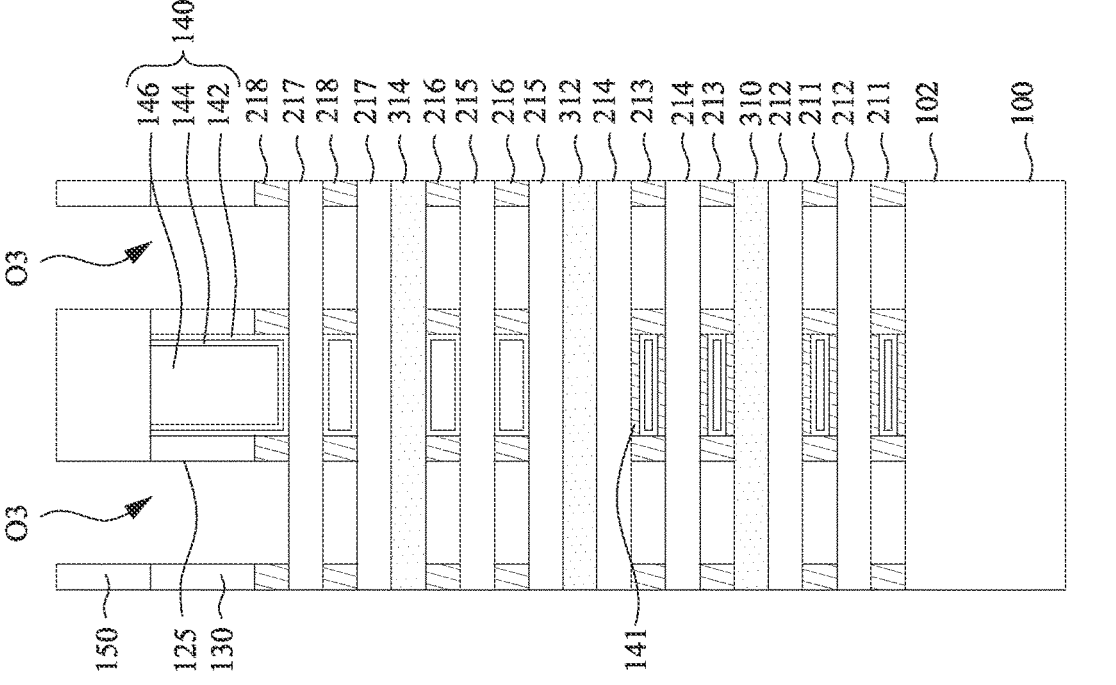
Figure 33A:
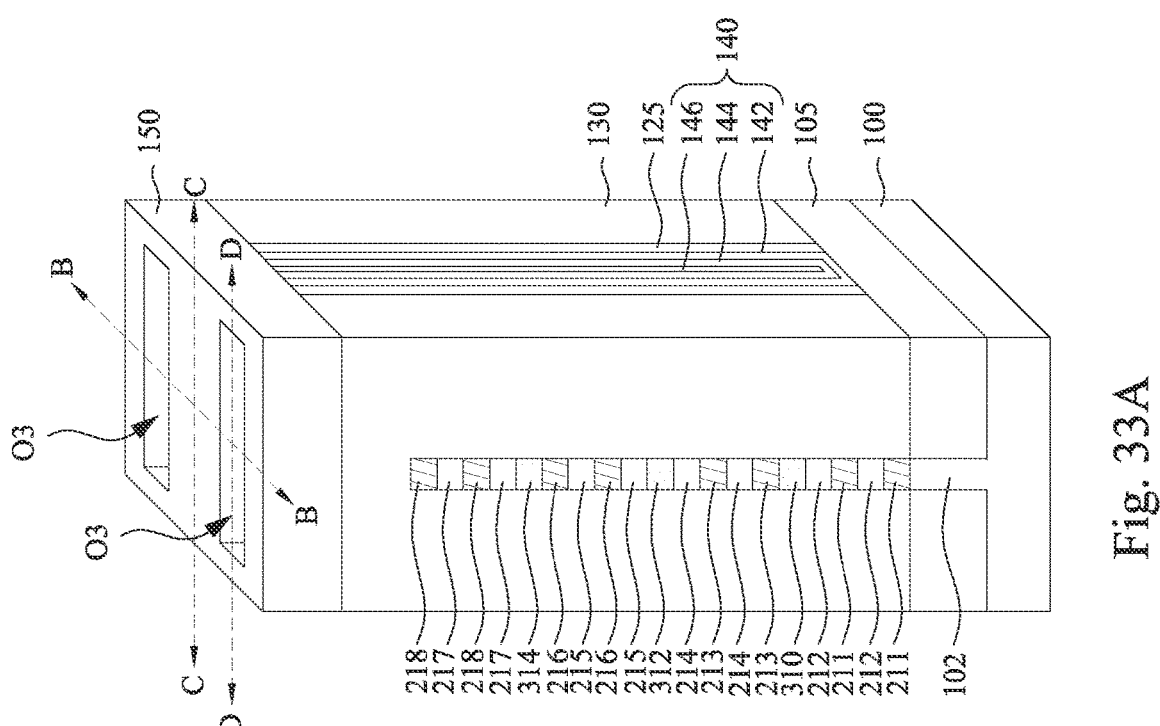
Figure 33D:
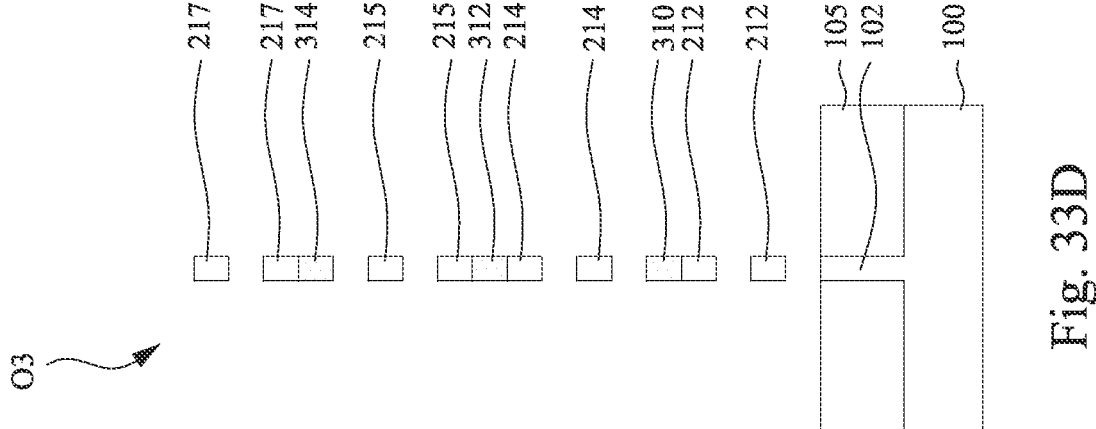
Figure 33C:
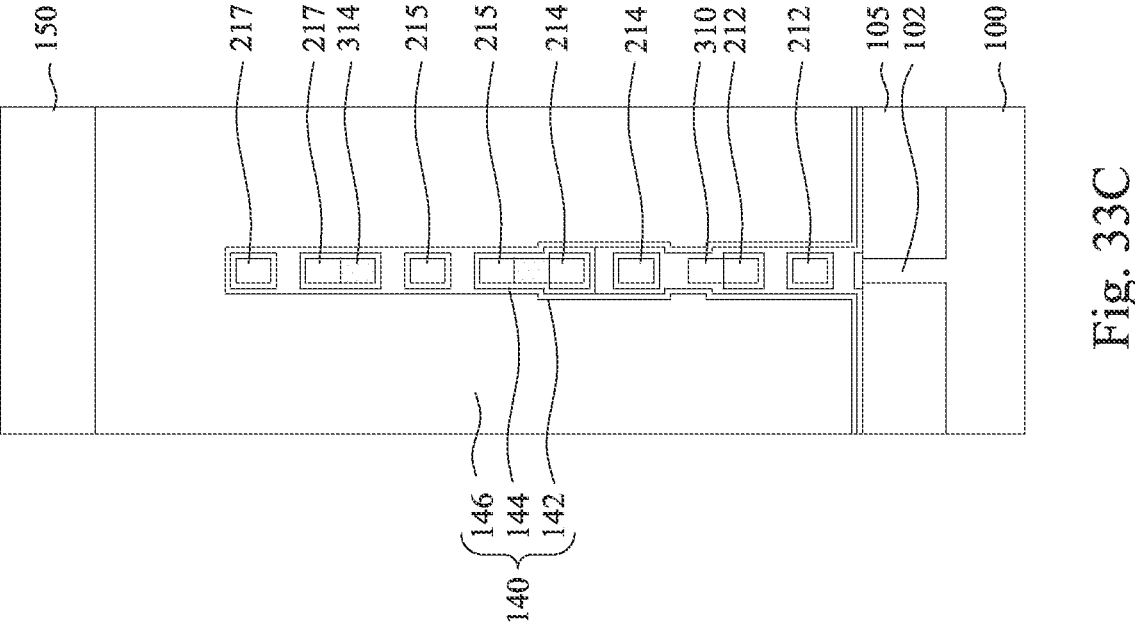

Reference is made to FIGS. 33A to 33D, in which FIG. 33A is a schematic view of a semiconductor device, FIG. 33B is a cross-sectional view along line B-B of FIG. 33A, FIG. 33C is a cross-sectional view along line C-C of FIG. 33A, and FIG. 33D is a cross-sectional view along line D-D of FIG. 33A. Portions of the first, second, third, and fourth sacrificial layers 211, 213, 216, and 218 are removed through the source/drain openings O3 by an etching process, leaving portions of the first, second, third, and fourth channel layers 212, 214, 215, and 217 suspended over the substrate 100. Because the first, second, third, and fourth sacrificial layers 211, 213, 216, and 218 are made of a same material, the first, second, third, and fourth sacrificial layers 211, 213, 216, and 218 can be removed simultaneously in a single etching process. The first, second, third, and fourth channel layers 212, 214, 215, and 217, and the isolation layers 310, 312, and 314 may include higher etching resistance to the etching process. In some embodiments, the top surface of the semiconductor strip 102 is exposed after the first, second, third, and fourth sacrificial layers 211, 213, 216, and 218 are removed.

Figure 34B:
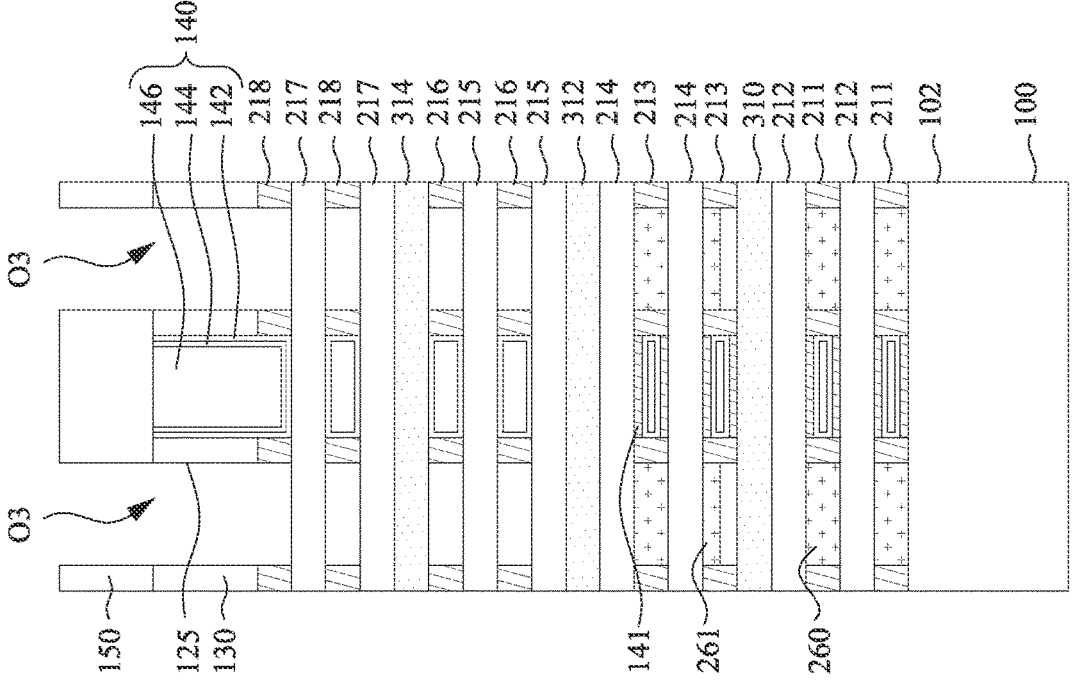
Figure 34A:
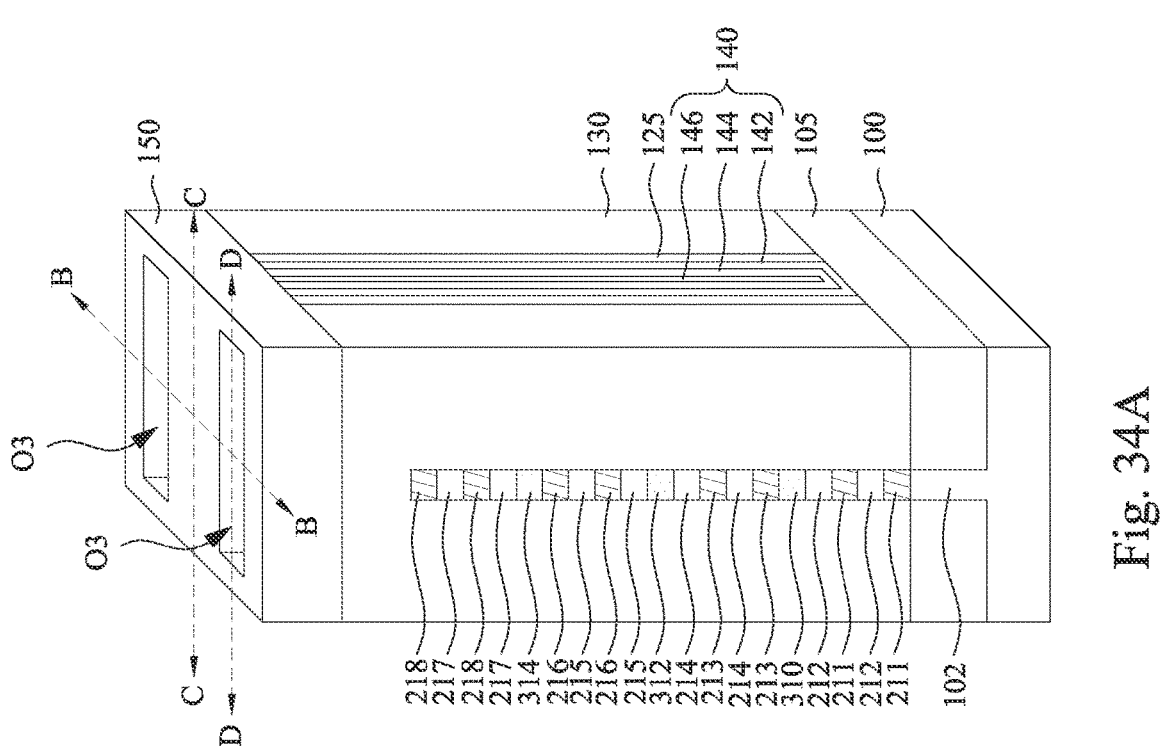
Figure 34D:
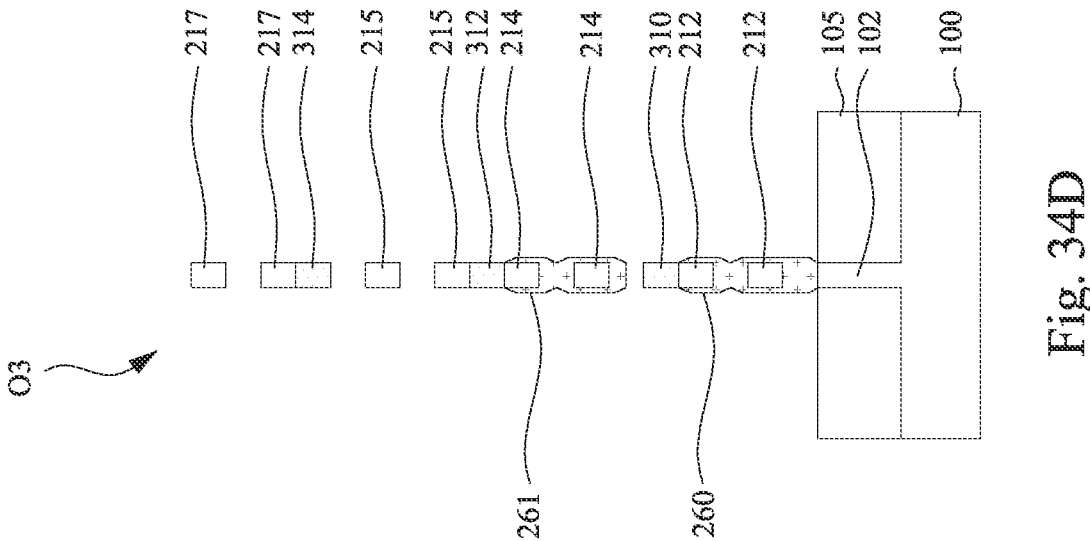
Figure 34C:
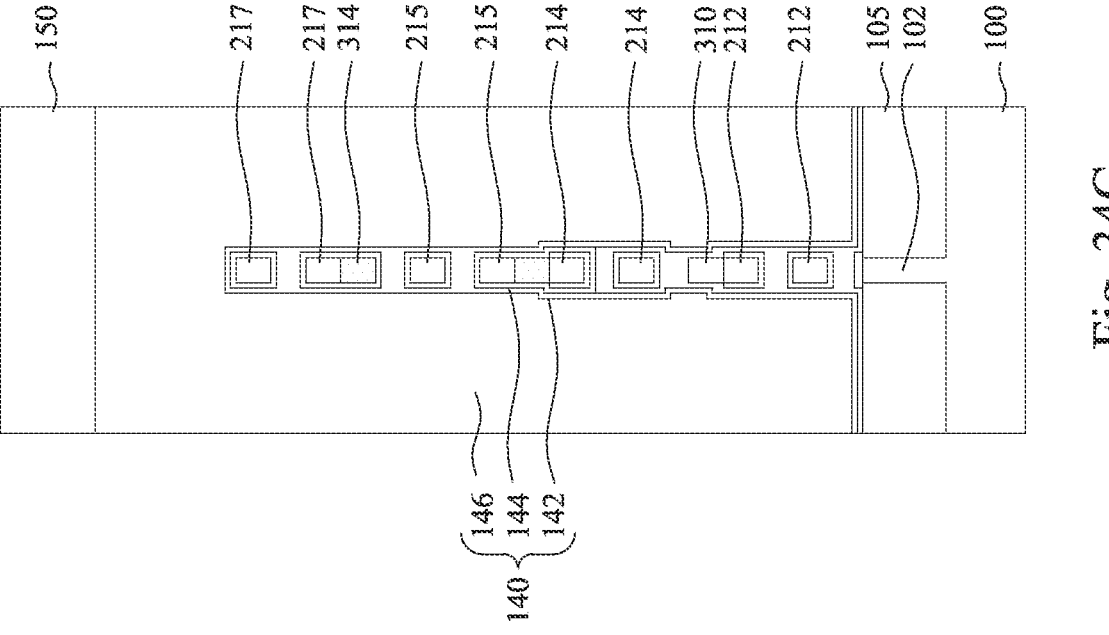

Reference is made to FIGS. 34A to 34D, in which FIG. 34A is a schematic view of a semiconductor device, FIG. 34B is a cross-sectional view along line B-B of FIG. 34A, FIG. 34C is a cross-sectional view along line C-C of FIG. 34A, and FIG. 34D is a cross-sectional view along line D-D of FIG. 34A. Source/drain epitaxy structures 260 and 261 are selectively formed over the exposed surfaces of the first and second channel layers 212 and 214, respectively. In some embodiments, the source/drain epitaxy structures 260 and 261 may include SiGe doped with B for a p-type gate-all-around (GAA) FET. In some embodiments, the source/drain epitaxy structures 260 may wrap around parts of the first channel layers 212, and the source/drain epitaxy structures 261 may wrap around parts of the second channel layers 214.

In some embodiments, the source/drain epitaxy structures 260 and 261 may be formed by selective epitaxial growth (SEG), in which epitaxy material may be selectively formed over a semiconductor surface. Accordingly, the source/drain epitaxy structures 260 and 261 may include higher growing rate on the first and second channel layers 212, 214 and the semiconductor strip 102 than on the isolation layers 310, 312, 314 and the third and fourth channel layers 215, 217. In some embodiments, the isolation layers 310, 312, 314 and the third and fourth channel layers 215, 217 may be free from coverage by the source/drain epitaxy structures 260 and 261.

Figure 35B:
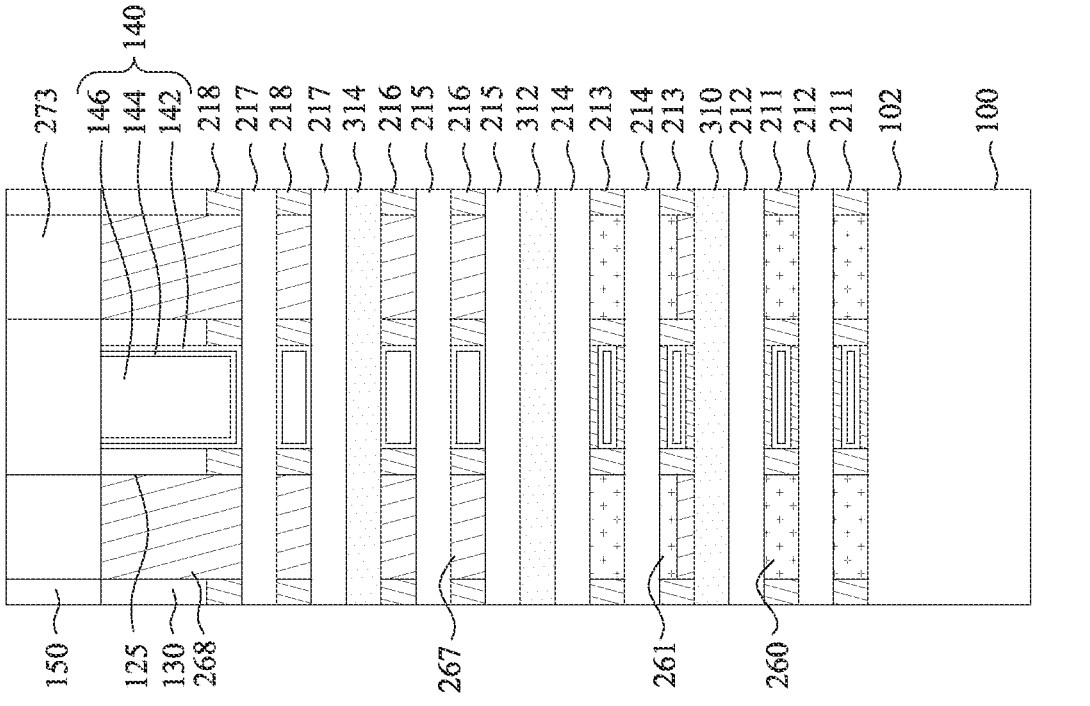
Figure 35A:
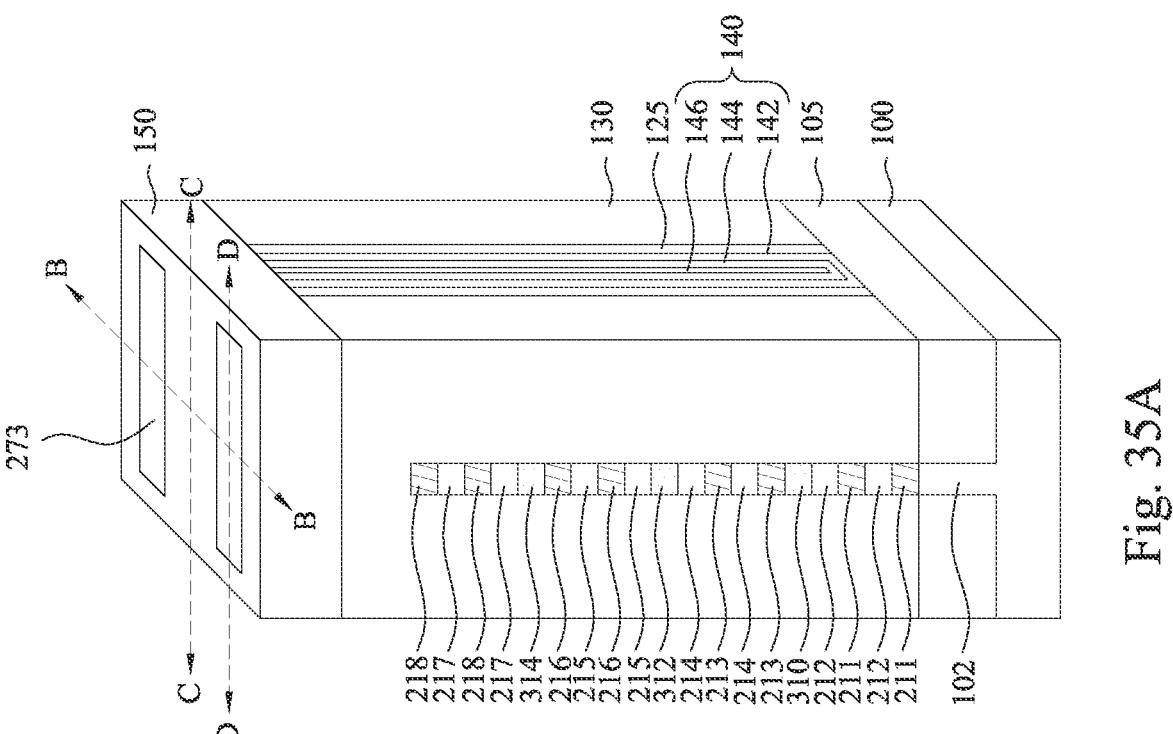
Figure 35D:
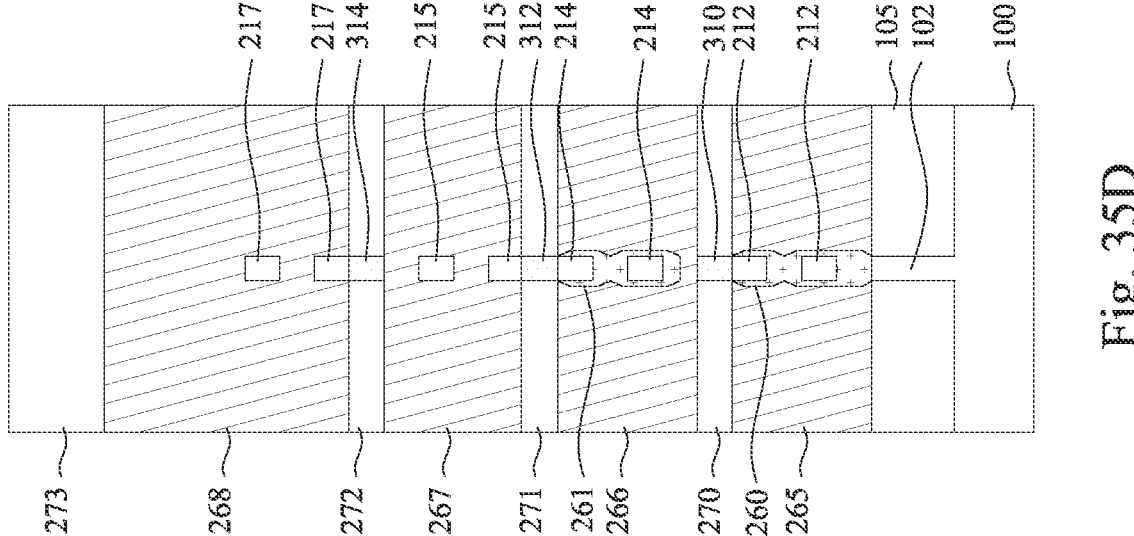
Figure 35C:
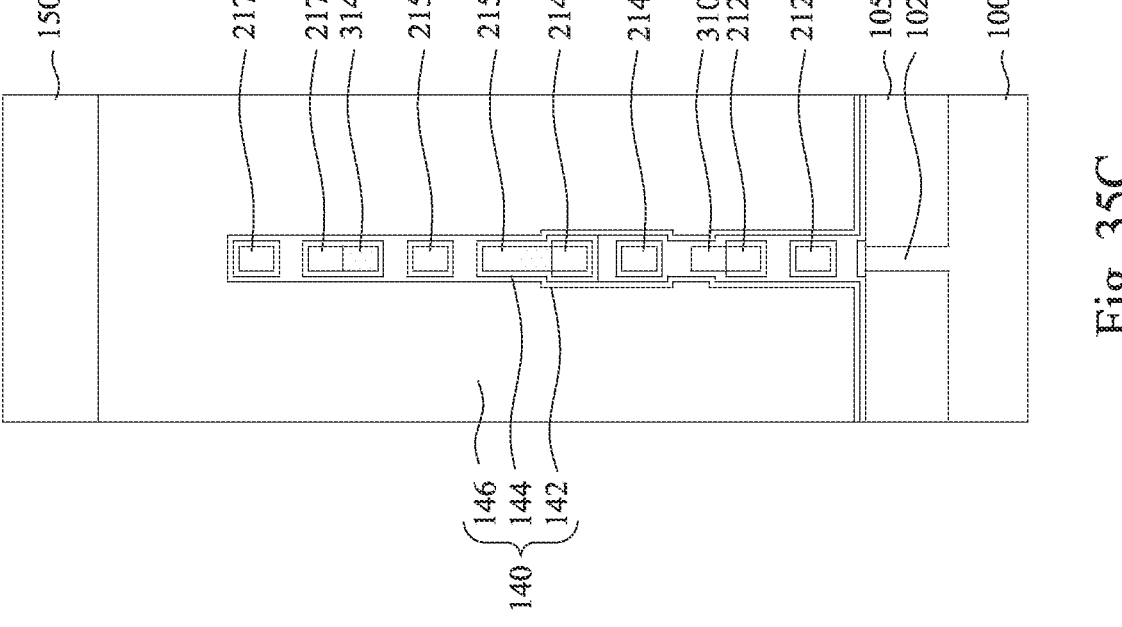

Reference is made to FIGS. 35A to 35D, in which FIG. 35A is a schematic view of a semiconductor device, FIG. 35B is a cross-sectional view along line B-B of FIG. 35A, FIG. 35C is a cross-sectional view along line C-C of FIG. 35A, and FIG. 35D is a cross-sectional view along line D-D of FIG. 35A. Source/drain contact 265 are formed in the source/drain openings O3 and over the source/drain epitaxy structures 260. In some embodiments, the source/drain contacts 265 may be formed by, for example, depositing a conductive material in the source/drain openings O3, performing a CMP process to remove excess conductive material until top surface of the ILD layer 150 is exposed, and then etching back the conductive material. In some embodiments, the conductive material includes one or more layers of Co, Ni, W, Ti, Ta, Cu, Al, TiN and TaN, or any other suitable material.

A dielectric layer 270 is formed in the source/drain openings O3 and covering the source/drain contacts 265. In some embodiments, the dielectric layer 270 may be in contact with the isolation layer 310. The dielectric layer 270 may be formed by depositing a dielectric material overfilling the source/drain openings O3, performing a CMP process until top surface of the ILD layer 150 is exposed, and then etching back the dielectric material.

Source/drain contact 266 are formed in the source/drain openings O3 and over the dielectric layer 270. In some embodiments, the source/drain contacts 266 may be formed by, for example, depositing a conductive material in the source/drain openings O3, performing a CMP process to remove excess conductive material until top surface of the ILD layer 150 is exposed, and then etching back the conductive material.

A dielectric layer 271 is formed in the source/drain openings O3 and covering the source/drain contacts 266. In some embodiments, the dielectric layer 270 may be in contact with the isolation layer 312. The dielectric layer 271 may be formed by depositing a dielectric material overfilling the source/drain openings O3, performing a CMP process until top surface of the ILD layer 150 is exposed, and then etching back the dielectric material.

Source/drain contact 267 are formed in the source/drain openings O3 and over the dielectric layer 271. In some embodiments, the source/drain contact 267 may be in contact with the third channel layers 215. In some embodiments, the source/drain contacts 267 may be formed by, for example, depositing a conductive material in the source/drain openings O3, performing a CMP process to remove excess conductive material until top surface of the ILD layer 150 is exposed, and then etching back the conductive material.

A dielectric layer 272 is formed in the source/drain openings O3 and covering the source/drain contacts 267. In some embodiments, the dielectric layer 272 may be in contact with the isolation layer 314. The dielectric layer 272 may be formed by depositing a dielectric material overfilling the source/drain openings O3, performing a CMP process until top surface of the ILD layer 150 is exposed, and then etching back the dielectric material.

Source/drain contact 268 are formed in the source/drain openings O3 and over the dielectric layer 272. In some embodiments, the source/drain contact 268 may be in contact with the fourth channel layers 217. In some embodiments, the source/drain contacts 268 may be formed by, for example, depositing a conductive material in the source/drain openings O3, performing a CMP process to remove excess conductive material until top surface of the ILD layer 150 is exposed, and then etching back the conductive material.

A dielectric layer 273 is formed in the source/drain openings O3 and covering the source/drain contacts 268. In some embodiments, the dielectric layer 272 may be in contact with the ILD layer 150. The dielectric layer 273 may be formed by depositing a dielectric material overfilling the source/drain openings O3, performing a CMP process until top surface of the ILD layer 150 is exposed, and then etching back the dielectric material.

In some embodiments of the present disclosure, a CFET device is provided, which includes with multiple unipolar devices. For example, a first p-type transistor disposed over the substrate 100, a second p-type transistor stacked over the first p-type transistor, a first n-type transistor stacked over the second p-type transistor, and a second n-type transistor stacked over the first n-type transistor. As shown in FIGS. 35A to 35D, the first p-type transistor include a GAA configuration, which includes a gate structure 140, channel layers 212, and source/drain epitaxy structures 260. Similarly, the second p-type transistor includes a GAA configuration, which includes a gate structure 140, channel layers 214, and source/drain epitaxy structures 261. On the other hand, the first n-type transistor includes a GAA configuration, which includes a gate structure 140, channel layers 215 and source/drain contacts 267. Similarly, the second n-type transistor includes a GAA configuration, which includes a gate structure 140, channel layers 217 and source/drain contacts 268.

Figure 36B:
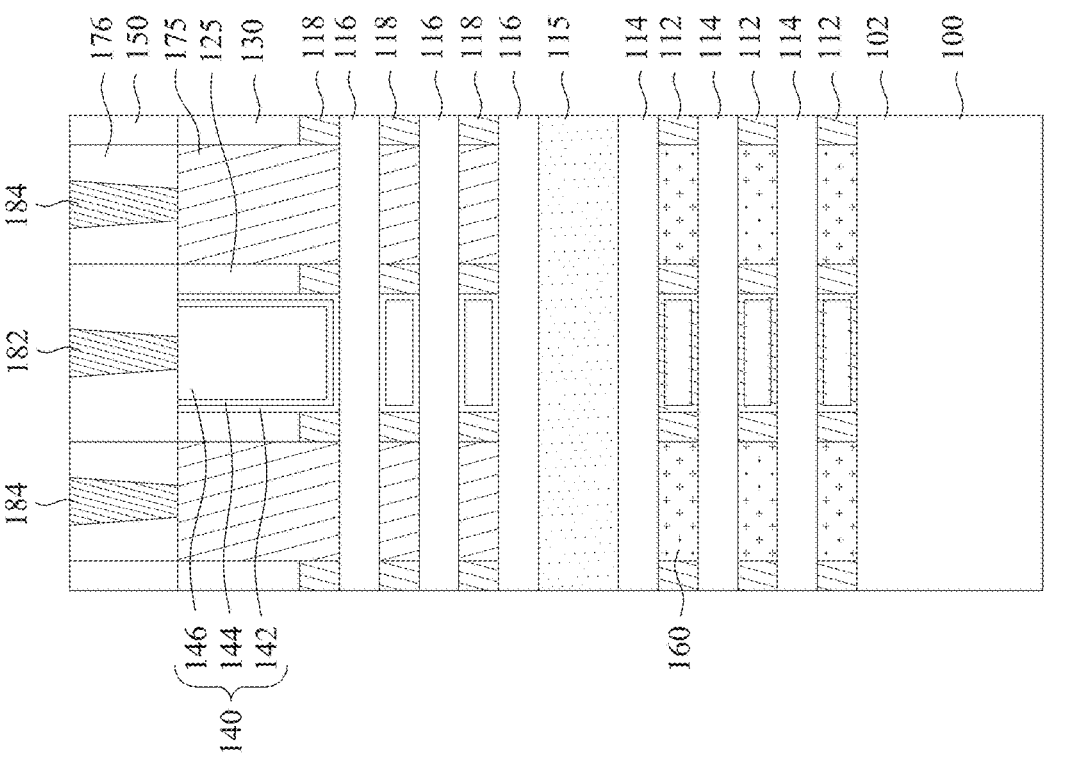
FIG. 36A is a schematic view of a semiconductor device according to some embodiments of the present disclosure.
Figure 36A:
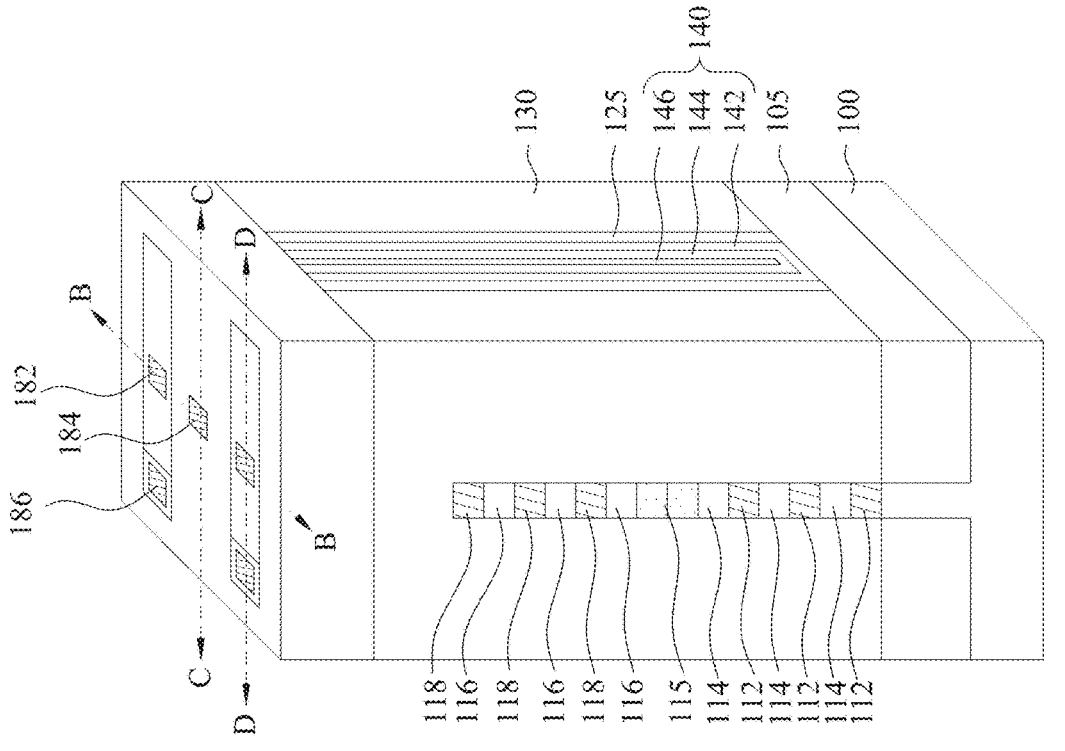
Figure 36D:
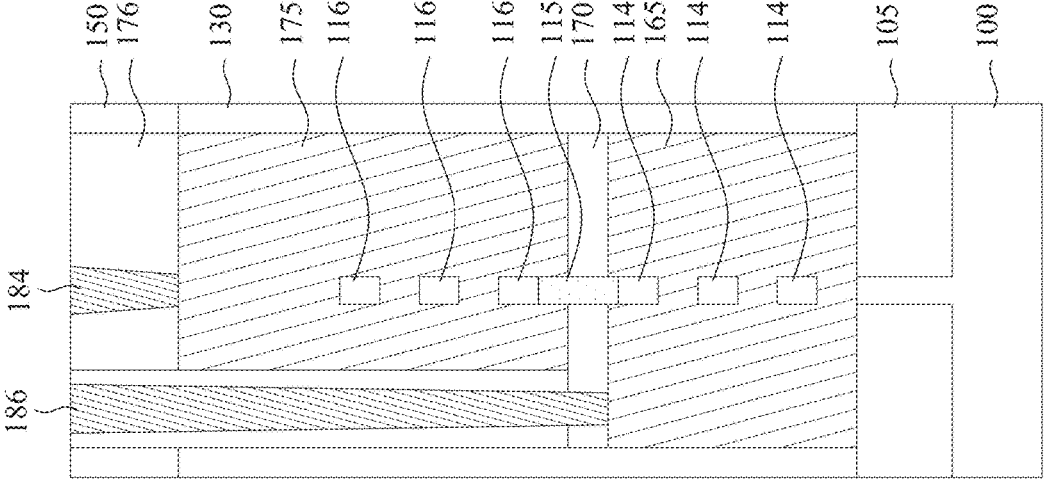
Figure 36C:
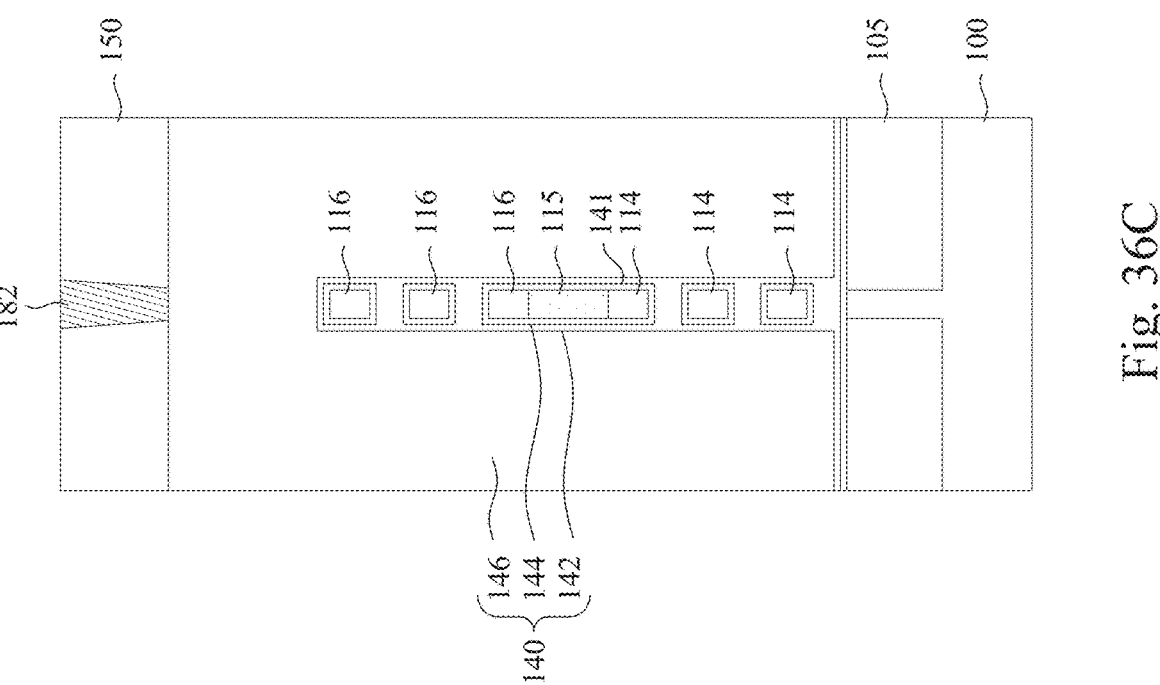

Reference is made to FIGS. 36A to 36D, in which FIG. 36A is a schematic view of a semiconductor device, FIG. 36B is a cross-sectional view along line B-B of FIG. 36A, FIG. 36C is a cross-sectional view along line C-C of FIG. 36A, and FIG. 36D is a cross-sectional view along line D-D of FIG. 36A. The embodiment of FIGS. 36A to 36D may be similar to the embodiment described with respect to FIGS. 1A to 24D, and thus relevant details will not be repeated for brevity.

The embodiment of FIGS. 36A to 36D is different from the embodiment described with respect to FIGS. 1A to 24D, in that the first channel layers 114 may be made of semiconductive oxide material, and thus can also be referred to as semiconductive oxide layers. In some embodiments, the first channel layers 114 can be made of semiconductive oxide material suitable for a p-type device, such as tin oxide, copper oxide, nickel oxide, the like, or combinations thereof. On the other hands, the second channel layers 116 can be made of semiconductive oxide material suitable for an n-type device, such as indium gallium zinc oxide (IGZO), or a similar conducting oxide semiconductor material such as indium zinc oxide (IZO), indium oxide ($InO_x$), gallium oxide ($GaO_x$), or combinations thereof. That is, the first and second channel layers 114 and 116 are both made of semiconductive oxide material, while the first and second channel layers 114 and 116 may include different semiconductive oxide materials.

In some embodiments where the first and second channel layers 114 and 116 are both made of semiconductive oxide material, the first and second sacrificial layers 112 and 118 (see FIGS. 1A to 1C) can be made of semiconductor material, such as silicon, silicon germanium. In some other embodiments, the first and second sacrificial layers 112 and 118 can be made of dielectric materials, such as oxide, nitride, or the like.

In some embodiments where the first and second channel layers 114 and 116 are both made of semiconductive oxide material, the process of FIGS. 9A to 9D may be omitted. That is, the interfacial layer 141 discussed in FIGS. 9A to 9D may not be formed. As a result, during the process of forming the gate structure 140 (see FIGS. 10A to 10D), the gate dielectric layer 142 of the gate structure 140 may be formed in contact with the first channel layers 114, and the resulting structure can be seen at FIG. 36C.

Moreover, in some embodiments where the first and second channel layers 114 and 116 are both made of semiconductive oxide material, the process of FIGS. 14A to 14D may be omitted. That is, source/drain epitaxy structures 160 discussed in FIGS. 14A to 14D may not be formed. As a result, during the process of forming the source/drain contacts 165 (see FIGS. 15A to 15D), the source/drain contacts 165 may be formed in contact with the first channel layers 114, and the resulting structure can be seen at FIGS. 36B and 36D.

Based on the above discussions, it can be seen that the present disclosure offers advantages. It is understood, however, that other embodiments may offer additional advantages, and not all advantages are necessarily disclosed herein, and that no particular advantage is required for all embodiments. Embodiments of the present disclosure provide a CFET device, which includes a p-type transistor disposed over the substrate 100 and an n-type transistor stacked over the p-type transistor. The channel layers of the n-type device are formed of a semiconductive oxide material instead of a semiconductor material. If the channel layers of the top-tier n-type device is formed of a semiconductor material, it is hard to form the semiconductor material having satisfying crystalline quality. However, because the semiconductive oxide material is an amorphous structure, the n-type transistor of the CFET device may be formed with no limitation in device height and crystalline quality. Moreover, the n-type device with semiconductive oxide channel layer may include lower thermal budget, which facilitate the formation of the CFET device.

In some embodiments of the present disclosure, a method includes forming first sacrificial layers and first channel layers alternately stacked over a substrate; forming second channel layers and second sacrificial layers alternately stacked over the first sacrificial layers and the first channel layers, in which the second channel layers are made of a first semiconductive oxide; performing an etching process to remove portions of the first sacrificial layers and the second sacrificial layers; forming a gate structure in contact with the first channel layers and the second channel layers; forming first source/drain contacts on opposite sides of the gate structure and electrically connected to the first channel layers; and forming second source/drain contacts on the opposite sides of the gate structure and electrically connected to the second channel layers.

In some embodiments, the first channel layers are made of a semiconductor material.

In some embodiments, the first channel layers are made of a second semiconductive oxide different from the first semiconductive oxide.

In some embodiments, the first semiconductive oxide comprises IGZO, IZO, InO$_x$, GaO$_x$, and the second semiconductive oxide comprises tin oxide, copper oxide, nickel oxide.

In some embodiments, the method further includes forming an isolation layer in contact with a topmost one of the first channel layers, and a bottommost one of the second channel layers is formed on the isolation layer.

In some embodiments, the gate structure is in contact with the isolation layer.

In some embodiments, the method further includes performing a selective epitaxial growth to forming source/drain epitaxy structures in contact with the first channel layers and on the opposite sides of the gate structure, in which the source/drain epitaxy structures are not formed on the second channel layers.

In some embodiments of the present disclosure, a method includes forming first sacrificial layers and first channel layers alternately stacked over a substrate; forming an isolation layer in contact with a topmost one of the first channel layers; forming second channel layers and second sacrificial layers alternately stacked over the isolation layer, in which a bottommost one of the second channel layers is in contact with the isolation layer; performing an etching process to remove portions of the first sacrificial layers and the second sacrificial layers; forming a gate structure in contact with the first channel layers and the second channel layers; forming first source/drain contacts on opposite sides of the gate structure and electrically connected to the first channel layers; and forming second source/drain contacts on the opposite sides of the gate structure and electrically connected to the second channel layers.

In some embodiments, the first and second channel layers are made of different semiconductive oxides.

In some embodiments, the first and second sacrificial layers are made of a dielectric material.

In some embodiments, the first channel layers are made of semiconductor material, and the second channel layers are made of semiconductive oxide.

In some embodiments, the method further includes forming source/drain epitaxy structures on the opposite sides of the gate structure, in which the source/drain epitaxy structures are in contact with the first channel layers, and the second source/drain contacts are in contact with the second channel layers.

In some embodiments, the method further includes forming a dielectric layer over the first source/drain contacts prior to forming the second source/drain contacts.

In some embodiments, the isolation layer is thicker than the first channel layers and the second channel layers.

In some embodiments of the present disclosure, a method includes forming a substrate, a first transistor and a second transistor over the substrate. The first transistor comprises first channel layers stacked over the substrate, a first gate structure over the first channel layers, and first source/drain contacts on opposite sides of the first gate structure. The second transistor comprises second channel layers stacked over the first channel layers, in which the second channel layers are made of a semiconductive oxide, a second gate structure over the first channel layers and the second channel layers, and second source/drain contacts on opposite sides of the second gate structure.

In some embodiments, the second channel layers comprises IGZO, IZO, InOx, GaOx.

In some embodiments, the first channel layers are made of a semiconductor material.

In some embodiments, the semiconductor device further includes an isolation layer vertically between the first channel layers and the second channel layers.

In some embodiments, the isolation layer is in contact with a topmost one of the first channel layers and a bottommost one of the second channel layers.

In some embodiments, the first transistor further comprises source/drain epitaxy structures on the opposite sides of the first gate structure and in contact with the first channel layers.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:

forming first sacrificial layers and first channel layers alternately stacked over a substrate;

forming a dielectric isolation layer over the first sacrificial layers and the first channel layers, wherein the dielectric isolation layer is in contact with a topmost one of the first channel layers;

after forming the dielectric isolation layer, forming second channel layers and second sacrificial layers alternately stacked over the dielectric isolation layer, wherein the second channel layers are made of a first semiconductive oxide, and wherein the dielectric isolation layer is in contact with a bottommost one of the second channel layers;

performing an etching process to remove portions of the first sacrificial layers and the second sacrificial layers;

forming a gate structure in contact with the first channel layers and the second channel layers;

forming first source/drain contacts on opposite sides of the gate structure and electrically connected to the first channel layers; and forming second source/drain contacts on the opposite sides of the gate structure and electrically connected to the second channel layers.

2. The method of claim 1, wherein the first channel layers are made of a semiconductor material.

3. The method of claim 1, wherein the first channel layers are made of a second semiconductive oxide different from the first semiconductive oxide.

4. The method of claim 3, wherein the first semiconductive oxide comprises IGZO, IZO, $InO_x$, $GaO_x$, and the second semiconductive oxide comprises tin oxide, copper oxide, nickel oxide.

5. The method of claim 1, wherein the gate structure is in contact with the dielectric isolation layer.

6. The method of claim 1, further comprising performing a selective epitaxial growth to forming source/drain epitaxy structures in contact with the first channel layers and on the opposite sides of the gate structure, wherein the source/drain epitaxy structures are not formed on the second channel layers.

7. A method, comprising:

forming first sacrificial layers and first channel layers alternately stacked over a substrate;

forming an isolation layer in contact with a topmost one of the first channel layers;

after forming the isolation layer, forming second channel layers and second sacrificial layers alternately stacked over the isolation layer, wherein a bottommost one of the second channel layers is in contact with the isolation layer;

performing an etching process to remove portions of the first sacrificial layers and the second sacrificial layers;

forming a gate structure in contact with the first channel layers and the second channel layers;

forming first source/drain contacts on opposite sides of the gate structure and electrically connected to the first channel layers;

forming a dielectric layer over the first source/drain contacts; and after forming the dielectric layer, forming second source/drain contacts on the opposite sides of the gate structure and electrically connected to the second channel layers.

8. The method of claim 7, wherein the first and second channel layers are made of different semiconductive oxides.

9. The method of claim 8, wherein the first and second sacrificial layers are made of a dielectric material.

10. The method of claim 7, wherein the first channel layers are made of semiconductor material, and the second channel layers are made of semiconductive oxide.

11. The method of claim 7, further comprising forming source/drain epitaxy structures on the opposite sides of the gate structure, wherein the source/drain epitaxy structures are in contact with the first channel layers, and the second source/drain contacts are in contact with the second channel layers.

12. The method of claim 7, wherein the isolation layer is thicker than the first channel layers and the second channel layers.

13. A semiconductor device, comprising:

a substrate;

a first transistor over the substrate, wherein the first transistor comprises:

first channel layers stacked over the substrate;

a first gate structure over the first channel layers; and first source/drain contacts on opposite sides of the first gate structure; and a second transistor over the first transistor, wherein the second transistor comprises:

second channel layers stacked over the first channel layers, wherein the second channel layers are made of a semiconductive oxide;

a second gate structure over the first channel layers and the second channel layers;

second source/drain contacts on opposite sides of the second gate structure, wherein the first and second source/drain contacts are made of metal, and wherein the second source/drain contacts wrap around and interface with the second channel layers; and a dielectric layer between one of the first source/drain contacts and one of the second source/drain contacts, wherein a bottom surface of the dielectric layer is in contact with the one of the first source/drain contacts; and an isolation layer vertically between the first channel layers and the second channel layers, wherein the isolation layer extends from a first position vertically between the first gate structure and the second gate structure to a second position vertically between the one of the first source/drain contacts and the one of the second source/drain contacts.

14. The semiconductor device of claim 13, wherein the second channel layers comprise IGZO, IZO, $InO_x$, $GaO_x$.

15. The semiconductor device of claim 13, wherein the first channel layers are made of a semiconductor material.

16. The semiconductor device of claim 13, wherein the isolation layer is in contact with a topmost one of the first channel layers and a bottommost one of the second channel layers.

17. The semiconductor device of claim 13, wherein the first transistor further comprises source/drain epitaxy structures on the opposite sides of the first gate structure and in contact with the first channel layers.

18. The semiconductor device of claim 13, wherein the isolation layer is in contact with a sidewall of the dielectric layer.

19. The semiconductor device of claim 13, further comprising a via extending through the dielectric layer to the one of the first source/drain contacts.

20. The semiconductor device of claim 19, wherein the via is laterally spaced apart from the one of the second source/drain contacts through a dielectric material.

* * * * *